(12) United States Patent
Nakayama et al.

(10) Patent No.: US 10,355,215 B2
(45) Date of Patent: Jul. 16, 2019

(54) COMPOSITION FOR FORMING ORGANIC SEMICONDUCTOR FILM, ORGANIC SEMICONDUCTOR ELEMENT, AND METHOD FOR MANUFACTURING ORGANIC SEMICONDUCTOR ELEMENT

(71) Applicant: FUJIFILM CORPORATION, Minato-ku, Tokyo (JP)

(72) Inventors: Takafumi Nakayama, Kanagawa (JP); Wataru Kikuchi, Kanagawa (JP); Kensuke Masui, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 275 days.

(21) Appl. No.: 15/367,185

(22) Filed: Dec. 2, 2016

(65) Prior Publication Data
US 2017/0084840 A1 Mar. 23, 2017

Related U.S. Application Data

(63) Continuation of application No. PCT/JP2015/069506, filed on Jul. 7, 2015.

(30) Foreign Application Priority Data

Jul. 18, 2014 (JP) .................. 2014-147508

(51) Int. Cl.
*H01L 51/00* (2006.01)
*H01L 29/786* (2006.01)
(Continued)

(52) U.S. Cl.
CPC ........ *H01L 51/0043* (2013.01); *C08F 210/02* (2013.01); *C08F 210/18* (2013.01);
(Continued)

(58) Field of Classification Search
None
See application file for complete search history.

(56) References Cited

U.S. PATENT DOCUMENTS

2017/0084840 A1* 3/2017 Nakayama .......... H01L 51/0003

FOREIGN PATENT DOCUMENTS

JP 2007-519227 A 7/2007
JP 2013-516054 A 5/2013

* cited by examiner

*Primary Examiner* — Jack S Chen
(74) *Attorney, Agent, or Firm* — SOLARIS Intellectual Property Group, PLLC

(57) ABSTRACT

An object of the present invention is to provide a composition for forming an organic semiconductor film that makes it possible to obtain an organic semiconductor film having excellent mobility and uniformity thereof, an organic semiconductor element including an organic semiconductor film having excellent mobility and uniformity thereof, and a method for manufacturing the organic semiconductor element.
The composition for forming an organic semiconductor film of the present invention contains an organic semiconductor as a component A and a polymer chemically modified some or all of the ethylenically unsaturated double bonds of a ethylenically unsaturated double bond-containing polymer, as a component B. It is preferable that the ethylenically unsaturated double bond-containing polymer is at least one kind of polymer selected from the group consisting of natural rubber, an acrylonitrile-butadiene copolymer, polyisoprene, a styrene-butadiene copolymer, polybutadiene, polychloroprene, an ethylene-propylene-diene copolymer, a styrene-butadiene-styrene block copolymer, and a styrene-isoprene-styrene block copolymer.

22 Claims, 2 Drawing Sheets

(51) Int. Cl.
  *C08F 210/02* (2006.01)
  *C09D 5/24* (2006.01)
  *C09D 123/16* (2006.01)
  *H01L 51/05* (2006.01)
  *C08F 210/18* (2006.01)

(52) U.S. Cl.
  CPC ............ *C09D 5/24* (2013.01); *C09D 123/16* (2013.01); *H01L 29/786* (2013.01); *H01L 51/0003* (2013.01); *H01L 51/004* (2013.01); *H01L 51/0005* (2013.01); *H01L 51/0055* (2013.01); *H01L 51/0068* (2013.01); *H01L 51/0071* (2013.01); *H01L 51/0074* (2013.01); *H01L 51/0094* (2013.01); *H01L 51/0558* (2013.01); *H01L 51/0566* (2013.01)

COMPOSITION FOR FORMING ORGANIC SEMICONDUCTOR FILM, ORGANIC SEMICONDUCTOR ELEMENT, AND METHOD FOR MANUFACTURING ORGANIC SEMICONDUCTOR ELEMENT

CROSS-REFERENCE TO RELATED APPLICATIONS

This application is a Continuation of International Application No. PCT/JP2015/069506 filed on Jul. 7, 2015, which claims priority to Japanese Patent Application No. 2014-147508 filed on Jul. 18, 2014. The entire contents of these applications are incorporated herein by reference.

BACKGROUND OF THE INVENTION

1. Field of the Invention

The present invention relates to a composition for forming an organic semiconductor film, an organic semiconductor element, and a method for manufacturing the organic semiconductor element.

2. Description of the Related Art

An organic transistor having an organic semiconductor film (organic semiconductor layer) is used in a field effect transistor (FET) used in a liquid crystal display or an organic EL display, a Radio Frequency Identifier (RFID, RF tag), and the like, because the use of the organic transistor makes it possible to achieve lightening of weight and cost reduction and to achieve flexibilization.

Various methods have been suggested as methods for preparing an organic semiconductor film. For example, as compositions for forming an organic semiconductor film, the compositions described in JP2007-519227A and JP2013-516054A are known.

SUMMARY OF THE INVENTION

An object of the present invention is to provide a composition for forming an organic semiconductor film that makes it possible to obtain an organic semiconductor film having excellent mobility and uniformity thereof.

Another object of the present invention is to provide an organic semiconductor element including an organic semiconductor film having excellent mobility and uniformity thereof and a method for manufacturing the organic semiconductor element.

The above objects of the present invention were achieved by means described in the following <1>, <12>, <23>, or <24>. Preferred embodiments will be also described below in <2> to <11> and <13> to <22>.

<1> A composition for forming an organic semiconductor film comprising an organic semiconductor as a component A and a polymer chemically modified some or all of the ethylenically unsaturated double bonds of an ethylenically unsaturated double bond-containing polymer, as a component B, <2> The composition for forming an organic semiconductor film described in <1>, in which the ethylenically unsaturated double bond-containing polymer is at least one kind of polymer selected from the group consisting of natural rubber, an acrylonitrile-butadiene copolymer, polyisoprene, a styrene-butadiene copolymer, polybutadiene, polychloroprene, an ethylene-propylene-diene copolymer, a styrene-butadiene-styrene block copolymer, and a styrene-isoprene-styrene block copolymer, <3> The composition for forming an organic semiconductor film described in <1> or <2>, in which the ethylenically unsaturated double bond-containing polymer is at least one kind of polymer selected from the group consisting of polybutadiene and an ethylene-propylene-diene copolymer, <4> The composition for forming an organic semiconductor film described in any one of <1> to <3>, in which the ethylenically unsaturated double bond-containing polymer contains an ethylene-propylene-diene copolymer, <5> The composition for forming an organic semiconductor film described in any one of <1> to <4>, in which the component A is a condensed polycyclic aromatic compound having 3 to 7 rings, <6> The composition for forming an organic semiconductor film described in any one of <1> to <5>, in which in the component B, a modification rate of the ethylenically unsaturated double bonds contained in the ethylenically unsaturated double bond-containing polymer is 5% to 50%, <7> The composition for forming an organic semiconductor film described in any one of <1> to <6>, in which the component A has a condensed polycyclic aromatic group, the number of rings in the condensed polycyclic aromatic group is equal to or greater than 4, at least two rings in the condensed polycyclic aromatic group contain at least one atom selected from the group consisting of a sulfur atom, a nitrogen atom, a selenium atom, and an oxygen atom, and the condensed polycyclic aromatic group contains, as a partial structure, at least any one structure selected from the group consisting of a benzene ring, a naphthalene ring, and a phenanthrene ring, <8> The composition for forming an organic semiconductor film described in <7>, in which the number of rings in the condensed polycyclic aromatic group is 5 or 6, <9> The composition for forming an organic semiconductor film described in <7> or <8>, in which the condensed polycyclic aromatic group contains at least two heterocyclic rings, and the heterocyclic rings each contain one heteroatom, <10> The composition for forming an organic semiconductor film described in any one of <1> to <9>, in which the component A contains at least one kind of compound represented by any one of Formula 1 to 16,

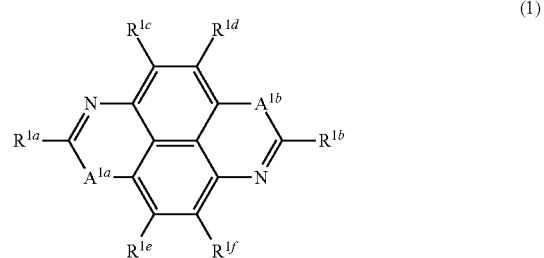

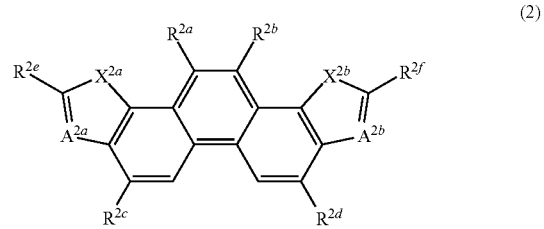

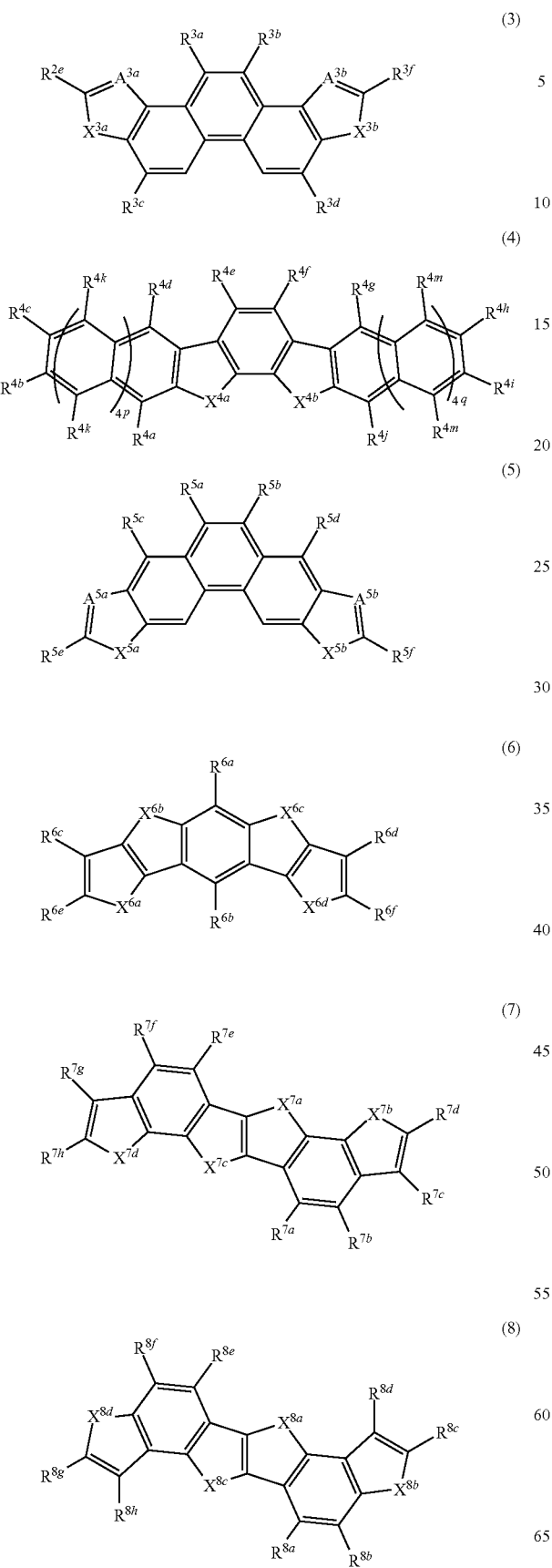
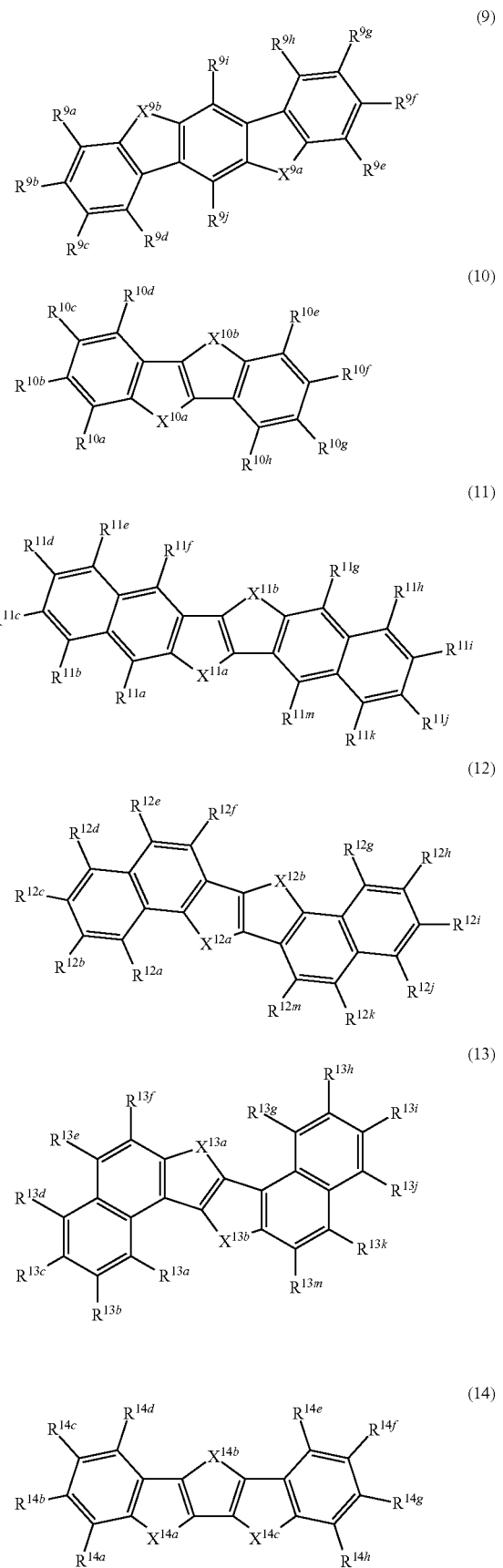

-continued

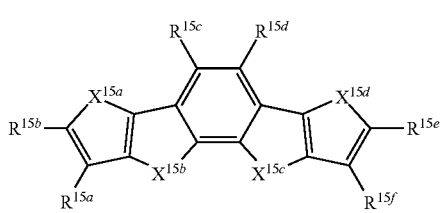 (15)

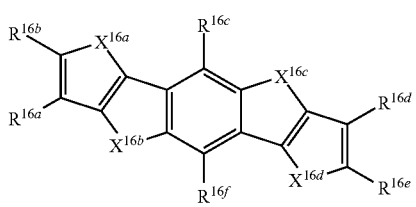 (16)

In Formula 1, $A^{1a}$ and $A^{1b}$ each independently represent a S atom, an O atom, or a Se atom, $R^{1a}$ to $R^{1f}$ each independently represent a hydrogen atom or a substituent, and at least one of $R^{1a}$, $R^{1b}$, $R^{1c}$, $R^{1d}$, $R^{1e}$, or $R^{1f}$ is a group represented by the following Formula W.

$$-L^W-R^W \quad (W)$$

In Formula W, $L^W$ represents a divalent linking group which is represented by any one of the following Formulae L-1 to L-25 or a divalent linking group in which two or more divalent linking groups represented by any one of the following Formulae L-1 to L-25 are bonded to each other, and $R^W$ represents an alkyl group, a cyano group, a vinyl group, an ethynyl group, an oxyethylene group, an oligo-oxyethylene group in which a repetition number v of an oxyethylene unit is equal to or greater than 2, a siloxane group, an oligosiloxane group having two or more silicon atoms, or a trialkylsilyl group.

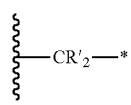 (L-1)

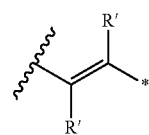 (L-2)

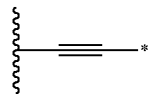 (L-3)

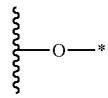 (L-4)

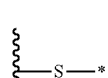 (L-5)

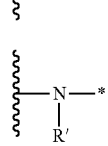 (L-6)

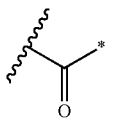 (L-7)

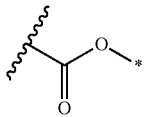 (L-8)

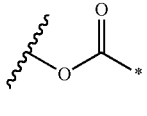 (L-9)

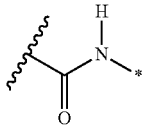 (L-10)

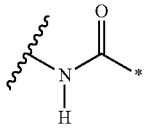 (L-11)

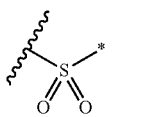 (L-12)

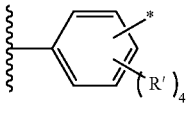 (L-13)

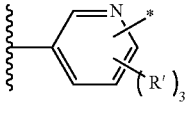 (L-14)

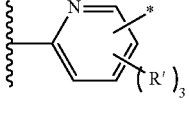 (L-15)

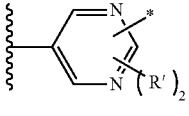 (L-16)

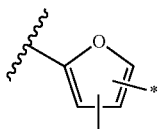 (L-17)

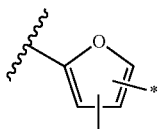 (L-18)

-continued (L-19)
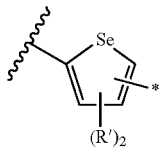

(L-20)
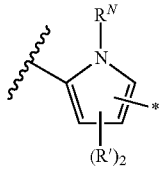

(L-21)
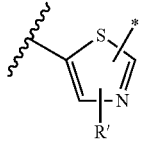

(L-22)
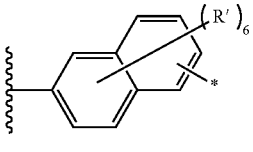

(L-23)
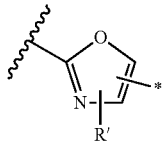

(L-24)
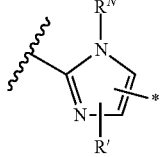

(L-25)

In Formulae L-1 to L-25, * represents a bonding position for $R^W$, the portion of a wavy line represents the other bonding position, R' in Formulae L-1, L-2, L-6, and L-13 to L-24 each independently represents a hydrogen atom or a substituent, $R^N$ in Formulae L-20 and L-24 represents a hydrogen atom or a substituent, and $R^{si}$ in Formula L-25 each independently represents a hydrogen atom, an alkyl group, an alkenyl group, or an alkynyl group.

In Formula 2, $X^{2a}$ and $X^{2b}$ each independently represent $NR^{2i}$, an O atom, or a S atom, $A^{2a}$ represents $CR^{2g}$ or a N atom, $A^{2b}$ represents $CR^{2h}$ or a N atom, $R^{2i}$ represents a hydrogen atom, an alkyl group, an alkenyl group, an alkynyl group, or an acyl group, $R^{2a}$ to $R^{2h}$ each independently represent a hydrogen atom or a substituent, and at least one of $R^{2a}$, $R^{2b}$, $R^{2c}$, $R^{2d}$, $R^{2e}$, $R^{2f}$, $R^{2g}$, or $R^{2h}$ is a group represented by Formula W.

In Formula 3, $X^{3a}$ and $X^{3b}$ each independently represent a S atom, an O atom, or $NR^{3g}$, and $A^{3a}$ and $A^{3b}$ each independently represent $CR^{3h}$ or a N atom. $R^{3a}$ to $R^{3h}$ each independently represent a hydrogen atom or a substituent, and at least one of $R^{3a}$, $R^{3b}$, $R^{3c}$, $R^{3d}$, $R^{3e}$, $R^{3f}$, $R^{3g}$, or $R^{3h}$ is a group represented by Formula W.

In Formula 4, $X^{4a}$ and $X^{4b}$ each independently represent an O atom, a S atom, or a Se atom, 4p and 4q each independently represent an integer of 0 to 2, $R^{4a}$ to $R^{4j}$, $R^{4k}$, and $R^{4m}$ each independently represent a hydrogen atom, a halogen atom, or a group represented by Formula W, at least one of $R^{4a}$, $R^{4b}$, $R^{4c}$, $R^{4d}$, $R^{4e}$, $R^{4f}$, $R^{4g}$, $R^{4h}$, $R^{4i}$, $R^{4j}$, $R^{4k}$, or $R^{4m}$ is a group represented by Formula W. Here, in a case where at least one of $R^{4e}$ or $R^{4f}$ is a group represented by Formula W, $L^W$ in Formula W represented by $R^{4e}$ and $R^{4f}$ is a divalent linking group represented by Formula L-2 or L-3.

In Formula 5, $X^{5a}$ and $X^{5b}$ each independently represent $NR^{5i}$, an O atom, or a S atom, $A^{5a}$ represents $CR^{5g}$ or a N atom, $A^{5b}$ represents $CR^{5h}$ or a N atom, $R^{5i}$ represents a hydrogen atom, an alkyl group, an alkenyl group, an alkynyl group, an acyl group, an aryl group, or a heteroaryl group, $R^{5a}$ to $R^{5h}$ each independently represent a hydrogen atom or a substituent, and at least one of $R^{5a}$, $R^{5b}$, $R^{5c}$, $R^{5d}$, $R^{5e}$, $R^{5f}$, $R^{5g}$, or $R^{5h}$ is a group represented by Formula W.

In Formula 6, $X^{6a}$ to $X^{6d}$ each independently represent $NR^{6g}$, an O atom, or a S atom, $R^{6g}$ represents a hydrogen atom, an alkyl group, an alkenyl group, an alkynyl group, an acyl group, an aryl group, or a heteroaryl group, $R^{6a}$ to $R^{6f}$ each independently represent a hydrogen atom or a substituent, and at least one of $R^{6a}$, $R^{6b}$, $R^{6c}$, $R^{6d}$, $R^{6e}$, or $R^{6f}$ is a group represented by Formula W.

In Formula 7, $X^{7a}$ and $X^{7c}$ each independently represent a S atom, an O atom, a Se atom, or $NR^{7i}$, $X^{7b}$ and $X^{7d}$ each independently represent a S atom, an O atom, or a Se atom, $R^{7a}$ to $R^{7i}$ each independently represent a hydrogen atom or a substituent, and at least one of $R^{7a}$, $R^{7b}$, $R^{7c}$, $R^{7d}$, $R^{7e}$, $R^{7f}$, $R^{7g}$, $R^{7h}$, or $R^{7i}$ is a group represented by Formula W.

In Formula 8, $X^{8a}$ and $X^{8c}$ each independently represent a S atom, an O atom, a Se atom, or $NR^{8i}$, $X^{8b}$ and $X^{8d}$ each independently represent a S atom, an O atom, or a Se atom, $R^{8a}$ to $R^{8i}$ each independently represent a hydrogen atom or a substituent, and at least one of $R^{8a}$, $R^{8b}$, $R^{8c}$, $R^{8d}$, $R^{8e}$, $R^{8f}$, $R^{8g}$, $R^{8h}$, or $R^{8i}$ is a group represented by Formula W.

In Formula 9, $X^{9a}$ and $X^{9b}$ each independently represent an O atom, a S atom, or a Se atom, $R^{9c}$, $R^{9d}$, and $R^{9g}$ to $R^{9j}$ each independently represent a hydrogen atom, a halogen atom, or a group represented by Formula W, and $R^{9a}$, $R^{9b}$, $R^{9e}$, and $R^{9f}$ each independently represent a hydrogen atom or a substituent.

In Formula 10, $R^{10a}$ to $R^{10h}$ each independently represent a hydrogen atom or a substituent, at least one of $R^{10a}$, $R^{10b}$, $R^{10c}$, $R^{10d}$, $R^{10e}$, $R^{10f}$, $R^{10g}$, or $R^{10h}$ represents a substituent represented by Formula W, $X^{10a}$ and $X^{10b}$ each independently represent a S atom, an O atom, or a Se atom, or $NR^{10i}$, and $R^{10i}$ each independently represents a hydrogen atom or a group represented by Formula W.

In Formula 11, $X^{11a}$ and $X^{11b}$ each independently represent a S atom, an O atom, a Se atom, or $NR^{11n}$, $R^{11a}$ to $R^{11k}$, $R^{11m}$, and $R^{11n}$ each independently represent a hydrogen atom or a substituent, and at least one of $R^{11a}$, $R^{11b}$, $R^{11c}$, $R^{11d}$, $R^{11e}$, $R^{11f}$, $R^{11g}$, $R^{11h}$, $R^{11i}$, $R^{11j}$, $R^{11k}$, $R^{11m}$, or $R^{11n}$ is a group represented by Formula W.

In Formula 12, $X^{12a}$ and $X^{12b}$ each independently represent a S atom, an O atom, a Se atom, or $NR^{12n}$, $R^{12a}$ to $R^{12k}$, $R^{12m}$, and $R^{12n}$ each independently represent a hydrogen atom or a substituent, and at least one of $R^{12a}$, $R^{12b}$, $R^{12c}$, $R^{12d}$, $R^{12e}$, $R^{12f}$, $R^{12g}$, $R^{12h}$, $R^{12i}$, $R^{12j}$, $R^{12k}$, $R^{12m}$, or $R^{12n}$ is a group represented by Formula W.

In Formula 13, $X^{13a}$ and $X^{13b}$ each independently represent a S atom, an O atom, a Se atom, or $NR^{13n}$, $R^{13a}$ to $R^{13k}$, $R^{13m}$, and $R^{13n}$ each independently represent a hydrogen atom or a substituent, and at least one of $R^{13a}$, $R^{13b}$, $R^{13c}$, $R^{13d}$, $R^{13e}$, $R^{13f}$, $R^{13g}$, $R^{13h}$, $R^{13i}$, $R^{13j}$, $R^{13k}$, $R^{13m}$, or $R^{13n}$ is a group represented by Formula W.

In Formula 14, $X^{14a}$ to $X^{14c}$ each independently represent a S atom, an O atom, a Se atom or $NR^{14i}$, $R^{14a}$ to $R^{14i}$ each independently represent a hydrogen atom or a substituent, and at least one of $R^{14a}$, $R^{14b}$, $R^{14c}$, $R^{14d}$, $R^{14e}$, $R^{14f}$, $R^{14g}$, $R^{14h}$, or $R^{14i}$ is a group represented by Formula W.

In Formula 15, $X^{15a}$ to $X^{15d}$ each independently represent a S atom, an O atom, a Se atom, or $NR^{15g}$, $R^{15a}$ to $R^{15g}$ each independently represent a hydrogen atom or a substituent, and at least one of $R^{15a}$, $R^{15b}$, $R^{15c}$, $R^{15d}$, $R^{15e}$, $R^{15f}$, or $R^{15g}$ is a group represented by Formula W.

In Formula 16, $X^{16a}$ to $X^{16d}$ each independently represent a S atom, an O atom, a Se atom, or $NR^{16g}$, $R^{16a}$ to $R^{16g}$ each independently represent a hydrogen atom or a substituent, and at least one of $R^{16a}$, $R^{16b}$, $R^{16c}$, $R^{16d}$, $R^{16e}$, $R^{16f}$, or $R^{16g}$ is a group represented by Formula W.

<11> The composition for forming an organic semiconductor film described in <10>, in which the organic semiconductor contains at least one kind of compound represented by one of Formulae 1 to 9 and 15, <12> An organic semiconductor element comprising an organic semiconductor as a component A and a polymer chemically modified some or all of the double bonds of an ethylenically unsaturated double bond-containing polymer, as a component B, <13> The organic semiconductor element described in <12>, in which the ethylenically unsaturated double bond-containing polymer is at least one kind of polymer selected from the group consisting of natural rubber, an acrylonitrile-butadiene copolymer, polyisoprene, a styrene-butadiene copolymer, polybutadiene, polychloroprene, an ethylene-propylene-diene copolymer, a polystyrene-polybutadiene-polystyrene block copolymer, and a polystyrene-polyisoprene-polystyrene block copolymer, <14> The organic semiconductor element described in <12> or <13>, in which the ethylenically unsaturated double bond-containing polymer is at least one kind of polymer selected from the group consisting of polybutadiene and an ethylene-propylene-diene copolymer, <15> The organic semiconductor element described in any one of <12> to <14>, in which the ethylenically unsaturated double bond-containing polymer contains an ethylene-propylene-diene copolymer, <16> The organic semiconductor element described in any one of <12> to <15>, in which in the component B, a modification rate of the ethylenically unsaturated double bonds contained in the ethylenically unsaturated double bond-containing polymer is 5% to 50%, <17> The organic semiconductor element described in any one of <12> to <16>, in which the component A is a condensed polycyclic aromatic compound having 3 to 7 rings, <18> The organic semiconductor element described in any one of <12> to <17>, in which the component A has a condensed polycyclic aromatic group, the number of rings in the condensed polycyclic aromatic group is equal to or greater than 4, at least two rings in the condensed polycyclic aromatic group contains at least one atom selected from the group consisting of a sulfur atom, a nitrogen atom, a selenium atom, and an oxygen atom, and the condensed polycyclic aromatic group contains, as a partial structure, at least one structure selected from the group consisting of a benzene ring, a naphthalene ring, and a phenanthrene ring, <19> The organic semiconductor element described in <18>, in which the number of rings in the condensed polycyclic aromatic group is 5 or 6, <20> The organic semiconductor element described in <18> or <19>, in which the condensed polycyclic aromatic group contains at least two heterocyclic rings, and the heterocyclic rings each contain one heteroatom, <21> The organic semiconductor element described in any one of <12> to <20>, in which the component A contains at least one kind of compound represented by any one of Formulae 1 to 16, <22> The organic semiconductor element described in <21>, in which the organic semiconductor contains at least one kind of compound represented by any one of Formulae 1 to 9 and 15, <23> A method for manufacturing an organic semiconductor element, comprising a coating step of coating a substrate with the composition for forming an organic semiconductor film described in any one of <1> to <11>, <24> An organic semiconductor element comprising a polymer interlayer between an organic semiconductor and a gate insulating film, in which the polymer interlayer contains at least a polymer chemically modified some or all of the ethylenically unsaturated double bonds of an ethylenically unsaturated double bond-containing polymer.

According to the present invention, it is possible to provide a composition for forming an organic semiconductor film that makes it possible to obtain an organic semiconductor film having excellent mobility and uniformity thereof.

Furthermore, according to the present invention, it is possible to provide an organic semiconductor element including an organic semiconductor having has excellent mobility and uniformity thereof and a method for manufacturing the organic semiconductor element.

DESCRIPTION OF THE PREFERRED EMBODIMENTS

Figure 1:
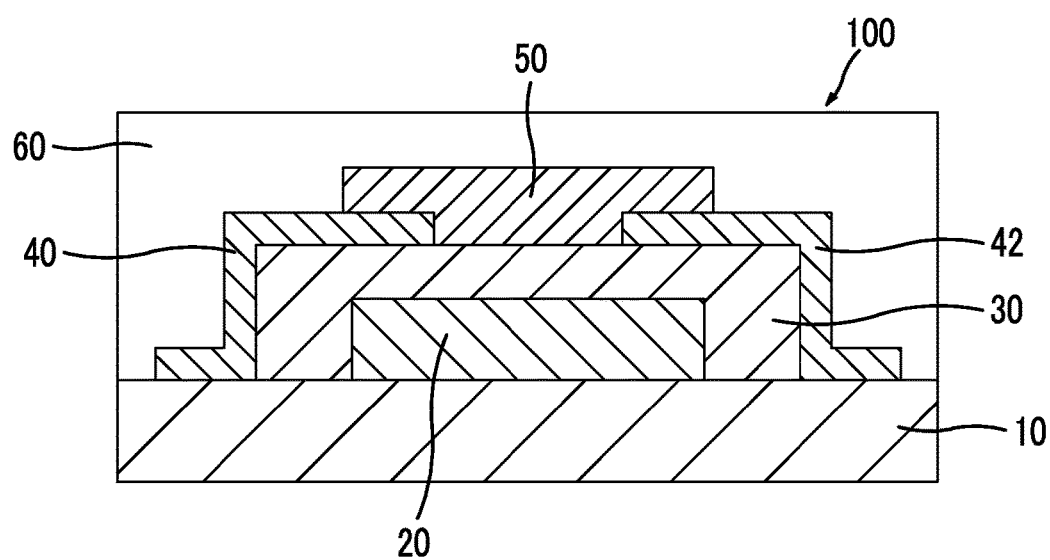
FIG. 1 is a schematic cross-sectional view of an aspect of an organic semiconductor element of the present invention.

Hereinafter, the contents of the present invention will be specifically described. The constituents in the following description will be explained based on typical embodiments of the present invention, but the present invention is not limited to the embodiments. In the specification of the present application, "to" is used to mean that the numerical values listed before and after "to" are a lower limit and an upper limit respectively. Furthermore, in the present invention, an organic EL element refers to an organic electroluminescence element.

In the present specification, in a case where there is no description regarding whether a group (atomic group) is substituted or unsubstituted, the group includes both of a group having a substituent and a group not having a substituent. For example, an "alkyl group" includes not only an alkyl group not having a substituent (unsubstituted alkyl group) but also an alkyl group having a substituent (substituted alkyl group).

In the present specification, in some cases, a chemical structural formula is described as a simplified structural formula in which a hydrogen atom is omitted.

In the present invention, "mobility" refers to "carrier mobility" and means either of both of electron mobility and hole mobility.

In the present invention, "% by mass" and "% by weight" have the same definition, and "part by mass" and "part by weight" have the same definition.

In the present invention, a combination of preferred aspects is more preferable.

(Composition for Forming Organic Semiconductor Film)

A composition for forming an organic semiconductor film (hereinafter, simply referred to as a "composition" as well) of the present invention contains an organic semiconductor as a component A and a polymer chemically modified some or all of the ethylenically unsaturated double bonds of an ethylenically unsaturated double bond-containing polymer, as a component B.

As a result of repeating intensive investigation, the inventors of the present invention obtained knowledge that by incorporating an organic semiconductor and the aforementioned specific polymer into the composition, mobility of the obtained organic semiconductor film and uniformity of the mobility become excellent. Based on this knowledge, the inventors accomplished the present invention. Furthermore, the inventors obtained knowledge that heat resistance of the obtained organic semiconductor film is also excellent.

The details of mechanism that bring about such effects are unclear. Presumably, due to the use of the organic semiconductor and the component B in combination, an organic semiconductor film is stably formed, and as a result, film formability, crystallogenic properties, or film uniformity is improved, and hence the mobility and the uniformity of mobility become excellent. In addition, presumably, the use of the component B makes it possible to achieve viscosity excellent for high water resistance without using other additives (viscosity adjuster and the like) that essentially deteriorate mobility, and makes a contribution to the improvement of mobility.

Regarding heat stability, presumably, due to the use of the specific polymer in combination, the stress imposed on organic semiconductor crystals in the organic semiconductor film at the time of heating can be relaxed, and hence the heat stability becomes excellent.

Component A: Organic Semiconductor

The composition for forming an organic semiconductor film of the present invention contains an organic semiconductor as a component A. The organic semiconductor is not particularly limited, and any of organic compounds can be selected as long as the compound functions as a semiconductor. Among the organic compounds, a condensed polycyclic aromatic compound having a condensed polycyclic aromatic group is preferable, and a condensed polycyclic aromatic compound having 3 to 7 rings is more preferable, because such a compound brings about a stronger effect when being used in combination with the component B and has high mobility.

In the present invention, it is preferable that the component A contains an organic semiconductor (hereinafter, referred to as a "specific organic semiconductor" or a "component A-1" as well) which has a condensed polycyclic aromatic group and in which the number of rings in the condensed polycyclic aromatic group is equal to or greater than 4, at least two rings in the condensed polycyclic aromatic group contain at least 1 atom selected from the group consisting of a sulfur atom, a nitrogen atom, a selenium atom, and an oxygen atom, and the condensed polycyclic aromatic group has, as a partial structure, at least any one structure selected from the group consisting of a benzene ring, a naphthalene ring, and a phenanthrene ring.

It is preferable that the partial structure in the condensed polycyclic aromatic group in the component A-1 does not contain an anthracene ring. In a case where the partial structure does not contain an anthracene ring, mobility and film uniformity of the obtained organic semiconductor film become excellent, although the reason is unclear.

The condensed polycyclic aromatic group is a group obtained by the condensation of a plurality of aromatic rings. Examples of the aromatic ring include an aromatic hydrocarbon ring (for example, a benzene ring) and an aromatic heterocyclic ring (for example, a thiophene ring, a furan ring, a pyrrole ring, a selenophene ring, or an imidazole ring).

The component A-1 contains a condensed polycyclic aromatic group (condensed polycyclic aromatic structure), and it is preferable that this group is contained as a main component. Herein, being a main component means that a content of the condensed polycyclic aromatic group based on a molecular weight is equal to or greater than 30% of a total molecular weight of the component A. The content is preferably equal to or greater than 40%. An upper limit of the content is not particularly limited. In view of solubility, the upper limit is preferably equal to or less than 80%.

The condensed polycyclic aromatic group is a cyclic structure formed by the condensation of a plurality of rings and exhibits properties of an aromatic group.

The number of rings in the condensed polycyclic aromatic group in the component A-1 is equal to or greater than 4. From the viewpoint of mobility thereof as an organic semiconductor, the number of rings is preferably 4 to 9, more preferably 4 to 7, and even more preferably 5 or 6.

At least two rings in the condensed polycyclic aromatic group contain at least one kind of atom selected from the group consisting of a sulfur atom, a nitrogen atom, a selenium atom, and an oxygen atom. From the viewpoint of mobility thereof as an organic semiconductor, the number of rings containing the aforementioned atom is preferably 2 to 6, and more preferably 2 to 4.

From the viewpoint of mobility thereof as an organic semiconductor, the condensed polycyclic aromatic group preferably contains at least two heterocyclic rings, and the heterocyclic rings preferably each have one heteroatom. The type of the heteroatom is not particularly limited, and examples thereof include an O atom (oxygen atom), a S atom (sulfur atom), a N atom (nitrogen atom), a Se atom (selenium atom), and the like.

The condensed polycyclic aromatic group in the component A-1 contains, as a partial structure, at least one structure selected from the group consisting of a benzene ring, a naphthalene ring, and a phenanthrene ring. It is preferable that the condensed polycyclic aromatic group does not contain an anthracene ring as the partial structure.

From the viewpoint of mobility thereof as an organic semiconductor, the component A-1 preferably has at least a thiophene ring structure and/or a selenophene ring structure, and more preferably has at least a thiophene ring structure. It is even more preferable that all of the heterocyclic structures contained in the component A-1 are thiophene ring structures.

From the viewpoint of mobility thereof as an organic semiconductor, the condensed polycyclic aromatic group is preferably a condensed polycyclic aromatic group which contains, as a partial structure, at least any one structure selected from the group consisting of a benzene ring, a naphthalene ring, and a phenanthrene ring, contains two or more thiophene rings, and has four or more rings. Particularly, the condensed polycyclic aromatic group is more preferably a condensed polycyclic aromatic group which contains a benzene ring as a partial structure and two or more thiophene rings and has four or more rings.

From the viewpoint of mobility thereof as an organic semiconductor, the number of thiophene rings in the condensed polycyclic aromatic group is preferably equal to or greater than 3, more preferably 3 to 5, even more preferably 3 or 4, and particularly preferably 3.

From the viewpoint of mobility thereof as an organic semiconductor, the number of rings in the condensed polycyclic aromatic group is preferably 4 to 6, more preferably 5 or 6, and even more preferably 5. The condensed polycyclic aromatic group is particularly preferably a condensed polycyclic aromatic group which contains two benzene rings and three thiophene rings and has 5 rings.

Preferred examples of the condensed polycyclic aromatic group include a group in which a ring (heterocyclic ring, preferably, a thiophene ring) containing at least one kind of atom selected from the group consisting of a sulfur atom, a nitrogen atom, a selenium atom, and an oxygen atom and a benzene ring are alternately condensed (fused) with each other (a group which is obtained by the alternate condensation of the aforementioned heterocyclic ring and a benzene ring).

From the viewpoint of mobility thereof as an organic semiconductor, the component A-1 preferably contains at least one kind of compound represented by any one of Formulae 1 to 16. The component A-1 is more preferably one or more kinds of compound represented by any one of Formulae 1 to 16.

The composition of the present invention may contain only one kind of component A-1 or two or more kinds of component A-1.

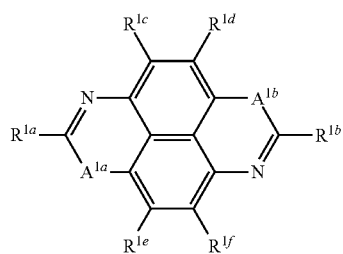
(1)

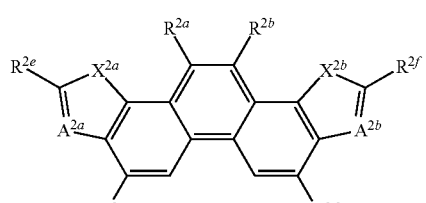
(2)

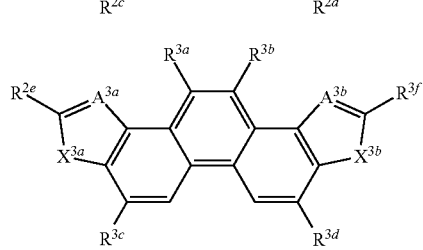
(3)

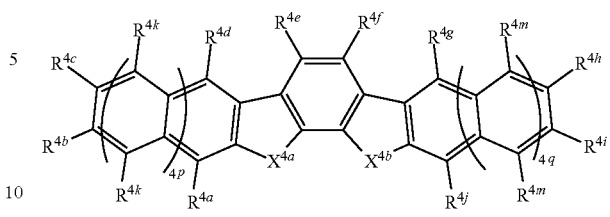
(4)

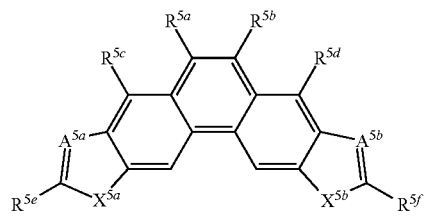
(5)

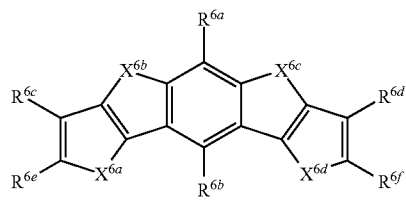
(6)

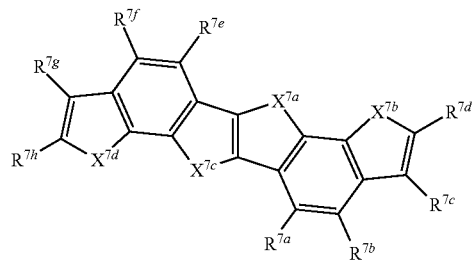
(7)

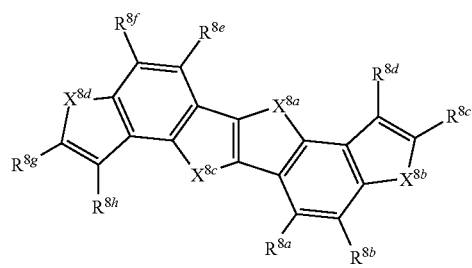
(8)

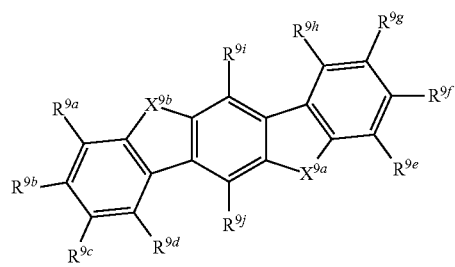
(9)

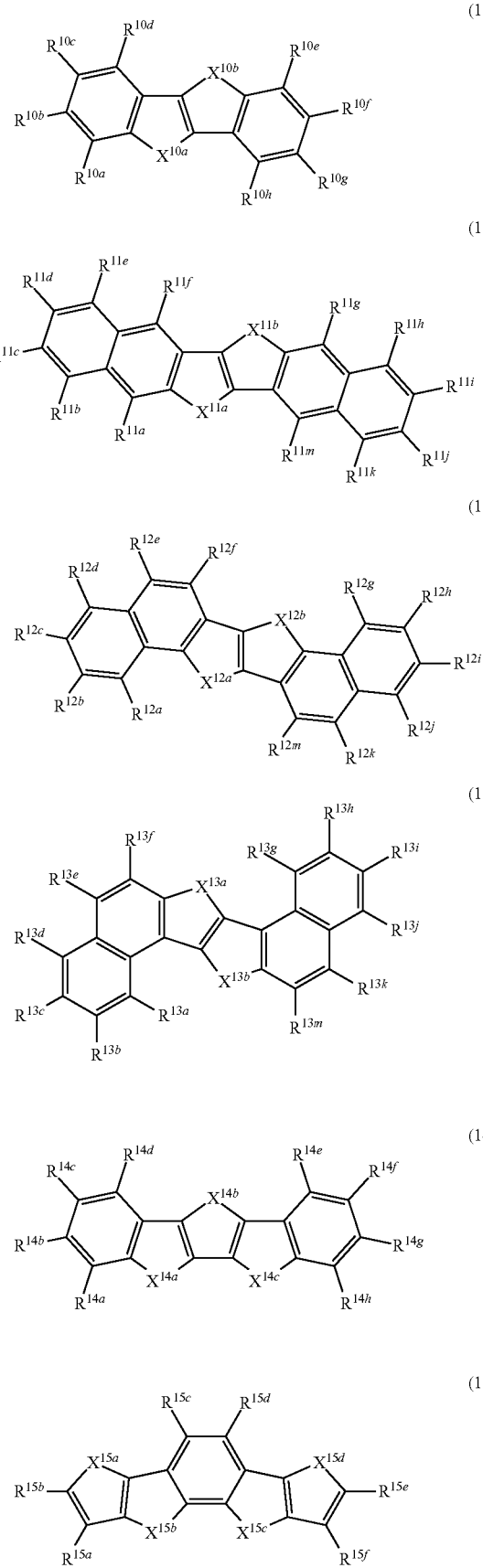

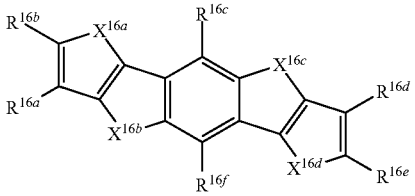

In Formula 1, $A^{1a}$ and $A^{1b}$ each independently represent a S atom, an O atom, or a Se atom, $R^{1a}$ to $R^{1f}$ each independently represent a hydrogen atom or a substituent, and at least one of $R^{1a}$, $R^{1b}$, $R^{1c}$, $R^{1d}$, $R^{1e}$, or $R^{1f}$ is a group represented by the following Formula W.

$$-L^W\text{-}R^W \tag{W}$$

In Formula W, $L^W$ represents a divalent linking group which is represented by any one of the following Formulae L-1 to L-25 or a divalent linking group in which two or more divalent linking groups represented by any one of the following Formulae L-1 to L-25 are bonded to each other, and $R^W$ represents an alkyl group, a cyano group, a vinyl group, an ethynyl group, an oxyethylene group, an oligo-oxyethylene group in which a repetition number v of an oxyethylene unit is equal to or greater than 2, a siloxane group, an oligosiloxane group having two or more silicon atoms, or a trialkylsilyl group.

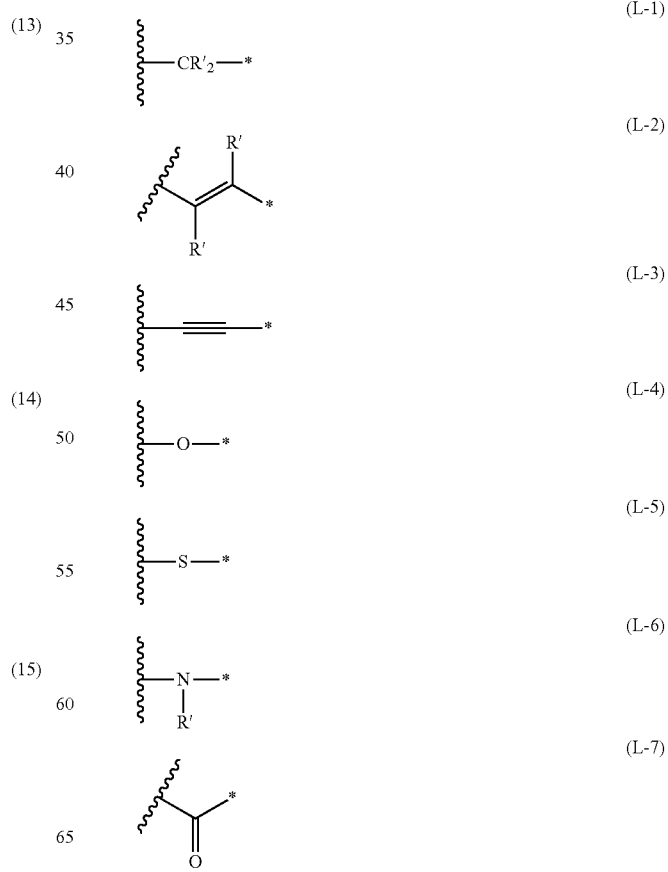

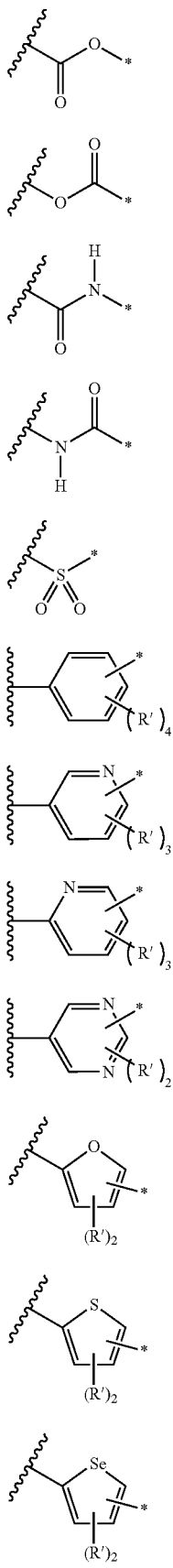

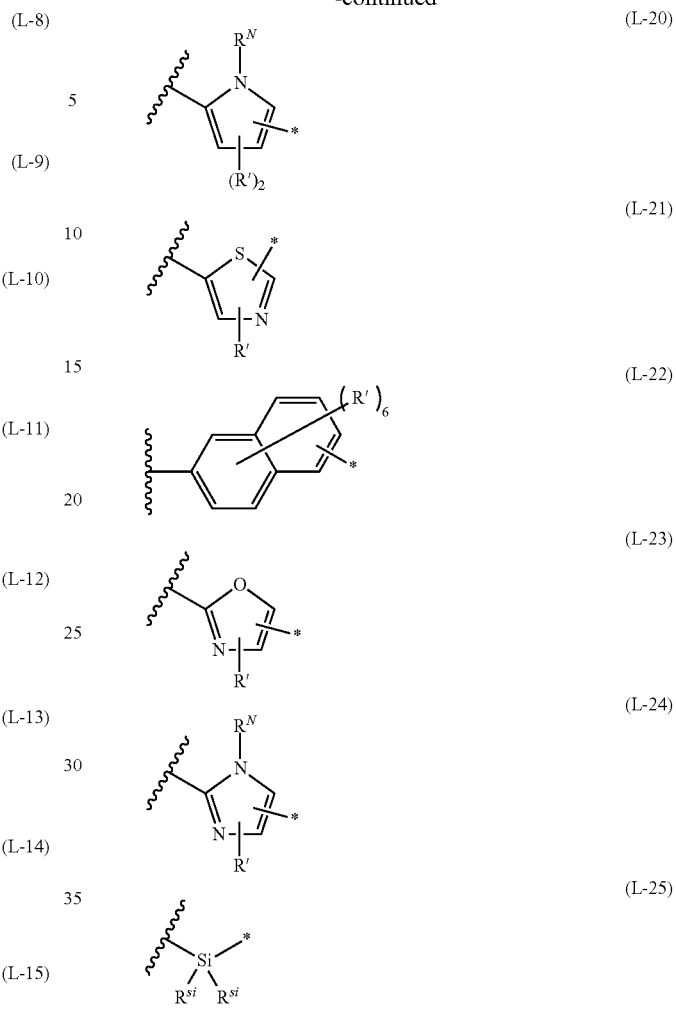

In Formulae L-1 to L-25, * represents a bonding position for $R^W$, the portion of a wavy line represents the other bonding position, R' in Formulae L-1, L-2, L-6, and L-13 to L-24 each independently represents a hydrogen atom or a substituent, $R^N$ in Formulae L-20 and L-24 represents a hydrogen atom or a substituent, and $R^{si}$ in Formula L-25 each independently represents a hydrogen atom, an alkyl group, an alkenyl group, or an alkynyl group.

In Formula 2, $X^{2a}$ and $X^{2b}$ each independently represent $NR^{2i}$, an O atom, or a S atom, $A^{2a}$ represents $CR^{2g}$ or a N atom, $A^{2b}$ represents $CR^{2h}$ or a N atom, $R^{2i}$ represents a hydrogen atom, an alkyl group, an alkenyl group, an alkynyl group, or an acyl group, $R^{2a}$ to $R^{2h}$ each independently represent a hydrogen atom or a substituent, and at least one of $R^{2a}$, $R^{2b}$, $R^{2c}$, $R^{2d}$, $R^{2e}$, $R^{2f}$, $R^{2g}$, or $R^{2h}$ is a group represented by Formula W.

In Formula 3, $X^{3a}$ and $X^{3b}$ each independently represent a S atom, an O atom, or $NR^{3g}$, and $A^{3a}$ and $A^{3b}$ each independently represent $CR^{3h}$ or a N atom. $R^{3a}$ to $R^{3h}$ each independently represent a hydrogen atom or a substituent, and at least one of $R^{3a}$, $R^{3b}$, $R^{3c}$, $R^{3d}$, $R^{3e}$, $R^{3f}$, $R^{3g}$, or $R^{3h}$ is a group represented by Formula W.

In Formula 4, $X^{4a}$ and $X^{4b}$ each independently represent an O atom, a S atom, or a Se atom, 4p and 4q each independently represent an integer of 0 to 2, $R^{4a}$ to $R^{4j}$, $R^{4k}$, and $R^{4m}$ each independently represent a hydrogen atom, a halogen atom, or a group represented by Formula W, at least one of $R^{4a}$, $R^{4b}$, $R^{4c}$, $R^{4d}$, $R^{4e}$, $R^{4f}$, $R^{4g}$, $R^{4h}$, $R^{4i}$, $R^{4j}$, $R^{4k}$, or $R^{4m}$ is a group represented by Formula W. Here, in a case where at least one of $R^{4e}$ or $R^{4f}$ is a group represented by Formula W, $L^W$ in Formula W represented by $R^{4e}$ and $R^{4f}$ is a divalent linking group represented by Formula L-2 or L-3.

In Formula 5, $X^{5a}$ and $X^{5b}$ each independently represent $NR^{5i}$, an O atom, or a S atom, $A^{5a}$ represents $CR^{5g}$ or a N atom, $A^{5b}$ represents $CR^{5h}$ or a N atom, $R^{5i}$ represents a hydrogen atom, an alkyl group, an alkenyl group, an alkynyl group, an acyl group, an aryl group, or a heteroaryl group, $R^{5a}$ to $R^{5h}$ each independently represent a hydrogen atom or a substituent, and at least one of $R^{5a}$, $R^{5b}$, $R^{5c}$, $R^{5d}$, $R^{5e}$, $R^{5f}$, $R^{5g}$, or $R^{5h}$ is a group represented by Formula W.

In Formula 6, $X^{6a}$ to $X^{6d}$ each independently represent $NR^{6g}$, an O atom, or a S atom, $R^{6g}$ represents a hydrogen atom, an alkyl group, an alkenyl group, an alkynyl group, an acyl group, an aryl group, or a heteroaryl group, $R^{6a}$ to $R^{6f}$ each independently represent a hydrogen atom or a substituent, and at least one of $R^{6a}$, $R^{6b}$, $R^{6c}$, $R^{6d}$, $R^{6e}$, or $R^{6f}$ is a group represented by Formula W.

In Formula 7, $X^{7a}$ and $X^{7c}$ each independently represent a S atom, an O atom, a Se atom, or $NR^{7i}$, $X^{7b}$ and $X^{7d}$ each independently represent a S atom, an O atom, or a Se atom, $R^{7a}$ to $R^{7i}$ each independently represent a hydrogen atom or a substituent, and at least one of $R^{7a}$, $R^{7b}$, $R^{7c}$, $R^{7d}$, $R^{7e}$, $R^{7f}$, $R^{7g}$, $R^{7h}$, or $R^{7i}$ is a group represented by Formula W.

In Formula 8, $X^{8a}$ and $X^{8c}$ each independently represent a S atom, an O atom, a Se atom, or $NR^{8i}$, $X^{8b}$ and $X^{8d}$ each independently represent a S atom, an O atom, or a Se atom, $R^{8a}$ to $R^{8i}$ each independently represent a hydrogen atom or a substituent, and at least one of $R^{8a}$, $R^{8b}$, $R^{8c}$, $R^{8d}$, $R^{8e}$, $R^{8f}$, $R^{8g}$, $R^{8h}$, or $R^{8i}$ is a group represented by Formula W.

In Formula 9, $X^{9a}$ and $X^{9b}$ each independently represent an O atom, a S atom, or a Se atom, $R^{9c}$, $R^{9d}$, and $R^{9g}$ to $R^{9j}$ each independently represent a hydrogen atom, a halogen atom, or a group represented by Formula W, and $R^{9a}$, $R^{9b}$, $R^{9e}$, and $R^{9f}$ each independently represent a hydrogen atom or a substituent.

In Formula 10, $R^{10a}$ to $R^{10h}$ each independently represent a hydrogen atom or a substituent, at least one of $R^{10a}$, $R^{10b}$, $R^{10c}$, $R^{10d}$, $R^{10e}$, $R^{10f}$, $R^{10g}$, or $R^{10h}$ represents a substituent represented by Formula W, $X^{10a}$ and $X^{10b}$ each independently represent a S atom, an O atom, a Se atom, or $NR^{10i}$, and $R^{10i}$ each independently represents a hydrogen atom or a group represented by Formula W.

In Formula 11, $X^{11a}$ and $X^{11b}$ each independently represent a S atom, an O atom, a Se atom, or $NR^{11n}$, $R^{11a}$ to $R^{11k}$, $R^{11m}$, and $R^{11n}$ each independently represent a hydrogen atom or a substituent, and at least one of $R^{11a}$, $R^{11b}$, $R^{11c}$, $R^{11d}$, $R^{11e}$, $R^{11f}$, $R^{11g}$, $R^{11h}$, $R^{11i}$, $R^{11j}$, $R^{11k}$, $R^{11m}$, or $R^{11n}$ is a group represented by Formula W.

In Formula 12, $X^{12a}$ and $X^{12b}$ each independently represent a S atom, an O atom, a Se atom, or $NR^{12n}$, $R^{12a}$ to $R^{12k}$, $R^{12m}$, and $R^{12n}$ each independently represent a hydrogen atom or a substituent, and at least one of $R^{12a}$, $R^{12b}$, $R^{12c}$, $R^{12d}$, $R^{12e}$, $R^{12f}$, $R^{12g}$, $R^{12h}$, $R^{12i}$, $R^{12j}$, $R^{12k}$, $R^{12m}$, or $R^{12n}$ is a group represented by Formula W.

In Formula 13, $X^{13a}$ and $X^{13b}$ each independently represent a S atom, an O atom, a Se atom, or $NR^{13n}$, $R^{13a}$ to $R^{13k}$, $R^{13m}$, and $R^{13n}$ each independently represent a hydrogen atom or a substituent, and at least one of $R^{13a}$, $R^{13b}$, $R^{13c}$, $R^{13d}$, $R^{13e}$, $R^{13f}$, $R^{13g}$, $R^{13h}$, $R^{13i}$, $R^{13j}$, $R^{13k}$, $R^{13m}$, or $R^{13n}$ is a group represented by Formula W.

In Formula 14, $X^{14a}$ to $X^{14c}$ each independently represent a S atom, an O atom, a Se atom, or $NR^{14i}$, $R^{14a}$ to $R^{14i}$ each independently represent a hydrogen atom or a substituent, and at least one of $R^{14a}$, $R^{14b}$, $R^{14c}$, $R^{14d}$, $R^{14e}$, $R^{14f}$, $R^{14g}$, $R^{14h}$, or $R^{14i}$ is a group represented by Formula W.

In Formula 15, $X^{15a}$ to $X^{15d}$ each independently represent a S atom, an O atom, a Se atom, or $NR^{15g}$, $R^{15a}$ to $R^{15g}$ each independently represent a hydrogen atom or a substituent, and at least one of $R^{15a}$, $R^{15b}$, $R^{15c}$, $R^{15d}$, $R^{15e}$, $R^{15f}$, or $R^{15g}$ is a group represented by Formula W.

In Formula 16, $X^{16a}$ to $X^{16d}$ each independently represent a S atom, an O atom, a Se atom, or $NR^{16g}$, $R^{16a}$ to $R^{16g}$ each independently represent a hydrogen atom or a substituent, and at least one of $R^{16a}$, $R^{16b}$, $R^{16c}$, $R^{16d}$, $R^{16e}$, $R^{16f}$, or $R^{16g}$ is a group represented by Formula W.

—Compound Represented by Formula 1—

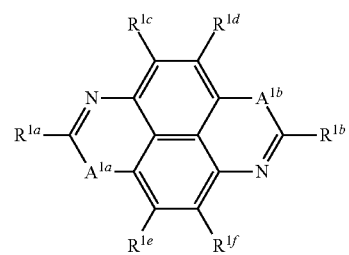

(1)

In Formula 1, $A^{1a}$ and $A^{1b}$ each independently represent a S atom (sulfur atom), an O atom (oxygen atom), or a Se atom (selenium atom). Each of $A^{1a}$ and $A^{1b}$ is preferably a S atom or an O atom. $A^{1a}$ and $A^{1b}$ may be the same as or different from each other, but it is preferable that they are the same as each other.

In Formula 1, $R^{1a}$ to $R^{1f}$ each independently represent a hydrogen atom or a substituent. Here, at least one of $R^{1a}$, $R^{1b}$, $R^{1c}$, $R^{1d}$, $R^{1e}$, or $R^{1f}$ is a group represented by Formula W which will be described later.

The compound represented by Formula 1 may have substituents other than a group represented by Formula W which will be described later.

The type of the substituents which can be adopted as $R^{1a}$ to $R^{1f}$ in Formula 1 is not particularly limited, and examples thereof include a substituent X described below. Examples of the substituent X include a group represented by Formula W which will be described later, a halogen atom, an alkyl group (including a cycloalkyl group, a bicycloalkyl group, and a tricycloalkyl group), an alkenyl group (including a cycloalkenyl group and a bicycloalkenyl group), an alkynyl group, an aryl group, a heterocyclic group (may be referred to as a hetero ring group as well), a cyano group, a hydroxyl group, a nitro group, a carboxy group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, alkoxycarbonylamino group, an aryloxycarbonylamino group, a sulfamoylamino group, alkyl- and arylsulfonylamino groups, a mercapto group, an alkylthio group, an arylthio group, a heterocyclic thio group, a sulfamoyl group, a sulfo group, alkyl- and arylsulfinyl groups, alkyl- and arylsulfonyl groups, an acyl group, an aryloxycarbonyl group, an alkoxycarbonyl group, a carbamoyl group, aryl- and heterocyclic azo groups, an imido group, a phosphino group, a phosphinyl group, a phosphinyloxy group, a phosphinylamino group, a phosphono group, a silyl group, a hydrazino group, a ureido group, a boronic acid group (—B(OH)$_2$), a phosphato group (—OPO(OH)$_2$), a sulfato group (—OSO$_3$H), and other known substituents. In Formulae 1 to 16 of the present specification, preferred examples of a "substituent" includes the aforementioned substituent X.

Among these, the groups other than a group represented by Formula W which will be described later are preferably a halogen atom, an alkyl group, an alkynyl group, an alkenyl group, an alkoxy group, an alkylthio group, and an aryl group, more preferably a fluorine atom, a substituted or unsubstituted alkyl group having 1 to 3 carbon atoms, a substituted or unsubstituted alkynyl group having 2 or 3 carbon atoms, a substituted or unsubstituted alkenyl group having 2 or 3 carbon atoms, a substituted or unsubstituted alkoxy group having one or two carbon atoms, a substituted or unsubstituted methylthio group, and a phenyl group, and particularly preferably a fluorine atom, a substituted or unsubstituted alkyl group having 1 to 3 carbon atoms, a substituted or unsubstituted alkynyl group having 2 or 3 carbon atoms, a substituted or unsubstituted alkenyl group having 2 or 3 carbon atoms, a substituted or unsubstituted alkoxy group having one or two carbon atoms, and a substituted or unsubstituted methylthio group.

In the compound represented by Formula 1, among $R^{1a}$ to $R^{1f}$, the number of substituents other than a group represented by Formula W is preferably 0 to 4, more preferably 0 to 2, and particularly preferably 0.

These substituents may further have the above substituents.

Among the above substituents, $R^{1c}$ to $R^{1f}$ each independently preferably represent a hydrogen atom, a fluorine atom, a substituted or unsubstituted alkyl group having 1 to 3 carbon atoms, a substituted or unsubstituted alkynyl group having 2 or 3 carbon atoms, a substituted or unsubstituted alkenyl group having two or three carbon atoms, a substituted or unsubstituted alkoxy group having one or two carbon atoms, or a substituted or unsubstituted methylthio group.

Next, a group represented by Formula W will be described.

$$-L^W-R^W \quad (W)$$

In Formula W, L represents a divalent linking group which is represented by any one of the following Formulae L-1 to L-25 or a divalent linking group in which two or more divalent linking groups represented by any one of the following Formulae L-1 to L-25 are bonded to each other.

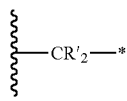
(L-1)

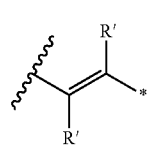
(L-2)

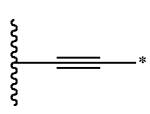
(L-3)

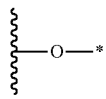
(L-4)

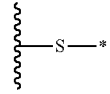
(L-5)

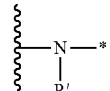
(L-6)

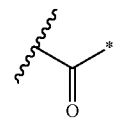
(L-7)

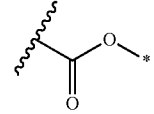
(L-8)

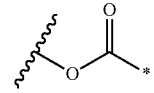
(L-9)

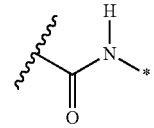
(L-10)

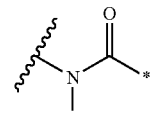
(L-11)

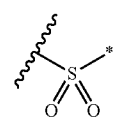
(L-12)

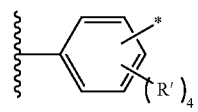
(L-13)

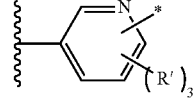
(L-14)

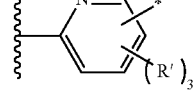
(L-15)

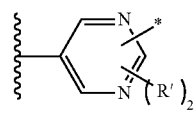
(L-16)

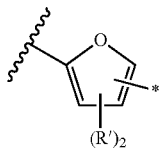 (L-17)

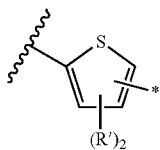 (L-18)

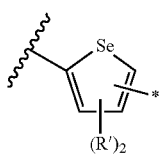 (L-19)

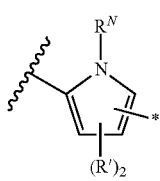 (L-20)

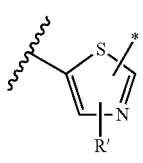 (L-21)

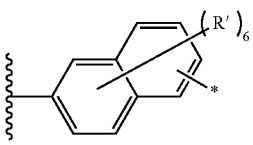 (L-22)

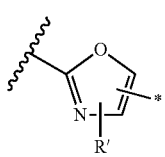 (L-23)

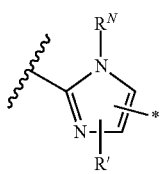 (L-24)

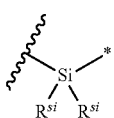 (L-25)

In Formulae L-1 to L-25, * represents a bonding position for $R^W$, and the portion of a wavy line represents the other bonding position. More specifically, in the compound represented by Formula 1, the portion of a wavy line is bonded to a ring forming a skeleton represented by Formula 1. As will be described later, in a case where Formula W is contained in other compounds, the portion of a wavy line is bonded to a ring forming a skeleton of each of the compounds.

In a case where $L^W$ represents a divalent linking group in which two or more divalent linking groups represented by any one of Formulae L-1 to L-25 are bonded to each other, * of one linking group is bonded to the portion of a wavy line of the other linking group.

In Formulae L-13 to L-24, as the bonding position of R' and the bonding position * for $R^W$, any position on an aromatic ring or a heterocyclic aromatic ring can be adopted.

R' in Formulae L-1, L-2, L-6, and L-13 to L-24 each independently represents a hydrogen atom or a substituent. $R^N$ in Formulae L-20 and L-24 represents a hydrogen atom or a substituent. $R^{si}$ in Formula L-25 each independently represents a hydrogen atom, an alkyl group, an alkenyl group, or an alkynyl group.

Each R' in Formulae L-1 and L-2 may form a fused ring by being bonded to $R^W$ adjacent to $L^W$.

Among these, the divalent linking group represented by any one of Formulae L-17 to L-21, L-23, and L-24 is more preferably a divalent linking group represented by one of the following Formulae L-17A to L-21A, L-23A, and L-24A.

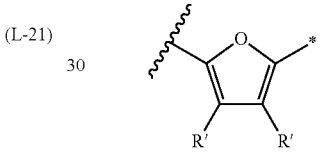 (L-17A)

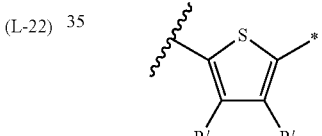 (L-18A)

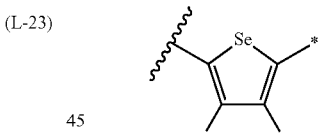 (L-19A)

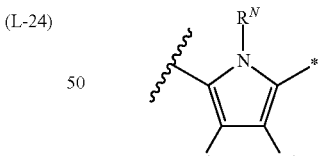 (L-20A)

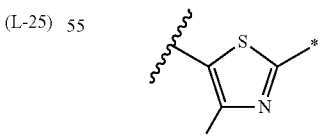 (L-21A)

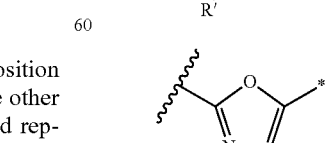 (L-23A)

-continued

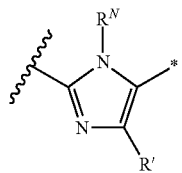

(L-24A)

In a case where a substituted or unsubstituted alkyl group, an oxyethylene group, an oligo-oxyethylene group in which a repetition number v of an oxyethylene unit is equal to or greater than 2, a siloxane group, an oligosiloxane group having two or more silicon atoms, or a substituted or unsubstituted trialkylsilyl group is present on the terminal of a substituent, the substituent can be interpreted as a substituent consisting only of —$R^W$ in Formula W or a substituent consisting of -$L^W$-$R^W$ in Formula W.

In the present invention, in a case where a substituted or unsubstituted alkyl group having a main chain consisting of N carbon atoms is present on the terminal of a substituent, the substituent is interpreted as -$L^W$-$R^W$ in Formula W including as many linking groups as possible from the terminal of the substituent. Specifically, the substituent is interpreted as a substituent in which "one group represented by Formula L-1 corresponding to $L^W$ in Formula W" and "a substituted or unsubstituted alkyl group which corresponds to $R^W$ in Formula W and has a main chain consisting of (N−1) carbon atoms" are bonded to each other. For example, in a case where a n-octyl group which is an alkyl group having eight carbon atoms is present on the terminal of a substituent, the substituent is interpreted as a substituent in which one group represented by Formula L-1, in which two R's represent hydrogen atoms, and a n-pentyl group having 7 carbon atoms are bonded to each other.

In contrast, in the present invention, in a case where an oxyethylene group, an oligo-oxyethylene group in which a repetition number v of an oxyethylene unit is equal to or greater than 2, a siloxane group, an oligosiloxane group having two or more silicon atoms, or a substituted or unsubstituted trialkylsilyl group is present on the terminal of a substituent, the substituent is interpreted as a substituent consisting only of $R^W$ in Formula W including as many linking groups as possible from the terminal of the substituent. For example, in a case where a —(OCH$_2$CH$_2$)—(OCH$_2$CH$_2$)—(OCH$_2$CH$_2$)—OCH$_3$ group is present on the terminal of a substituent, the substituent is interpreted as a substituent consisting only of an oligo-oxyethylene group in which a repetition number v of an oxyethylene unit is 3.

In a case where $L^W$ forms a linking group in which divalent linking groups represented by any one of Formulae L-1 to L-25 are bonded to each other, the number of bonded divalent linking groups represented by any one of Formulae L-1 to L-25 is preferably 2 to 4, and more preferably 2 or 3.

Examples of the substituent R' in Formulae L-1, L-2, L-6, and L-13 to L-24 include those exemplified as substituents that can be adopted as $R^{1a}$ to $R^{1f}$ in Formula 1. The substituent R' in Formula L-6 among the above formulae is preferably an alkyl group. In a case where R' in Formula L-6 is an alkyl group, the number of carbon atoms of the alkyl group is preferably 1 to 9, more preferably 4 to 9 from the viewpoint of chemical stability and carrier transport properties, and even more preferably 5 to 9. In a case where R' in Formula L-6 is an alkyl group, the alkyl group is preferably a linear alkyl group, because then mobility can be improved.

$R^N$ in Formulae L-20 and L-24 represents a hydrogen atom or a substituent. Examples of $R^N$ include those exemplified as substituents that can be adopted as $R^{1a}$ to $R^{1f}$ in Formula 1. $R^N$ is preferably a hydrogen atom or a methyl group among the substituents.

$R^{si}$ in Formula L-25 each independently represents a hydrogen atom, an alkyl group, an alkenyl group, or an alkynyl group, and preferably represents an alkyl group. The alkyl group that can be adopted as $R^{si}$ is not particularly limited. A preferred range of the alkyl group that can be adopted as $R^{si}$ is the same as a preferred range of an alkyl group that can be adopted in a trialkylsilyl group in a case where R represents a trialkylsilyl group. The alkenyl group that can be adopted as $R^{si}$ is not particularly limited. The alkenyl group is preferably a substituted or unsubstituted alkenyl group and more preferably a branched alkenyl group, and the alkenyl group preferably has 2 or 3 carbon atoms. The alkynyl group that can be adopted as $R^{si}$ is not particularly limited. The alkynyl group is preferably a substituted or unsubstituted alkynyl group and more preferably a branched alkynyl group, and the alkynyl group preferably has 2 or 3 carbon atoms.

$L^W$ is preferably a divalent linking group which is represented by any one of Formulae L-1 to L-5, L-13, L-17, and L-18 or a divalent linking group in which two or more divalent linking groups represented by any one of Formulae L-1 to L-5, L-13, L-17, and L-18 are bonded to each other, more preferably a divalent linking group which is represented by any one of Formulae L-1, L-3, L-13, and L-18 or a divalent linking group in which two or more divalent linking groups represented by any one of Formulae L-1, L-3, L-13, and L-18 are bonded to each other, and particularly preferably a divalent linking group which is represented by any one of Formulae L-1, L-3, L-13, and L-18 or a divalent linking group in which a divalent linking group represented by any one of Formulae L-3, L-13, and L-18 and a divalent linking group represented by Formula L-1 are bonded to each other.

Regarding the divalent linking group, in which a divalent linking group represented by any one of Formulae L-3, L-13, and L-18 and a divalent linking group represented by Formula L-1 are bonded to each other, it is preferable that the divalent linking group represented by Formula L-1 is bonded to the $R^W$ side.

From the viewpoint of chemical stability and carrier transport properties, $L^W$ is particularly preferably a divalent linking group containing a divalent linking group represented by Formula L-1, and more particularly preferably a divalent linking group represented by Formula L-1. It is the most preferable that $L^W$ is a divalent linking group represented by Formula L-1 and $R^W$ is a substituted or unsubstituted alkyl group.

In Formula W, $R^W$ represents a substituted or unsubstituted alkyl group, a cyano group, a vinyl group, an ethynyl group, an oxyethylene group, an oligo-oxyethylene group in which a repetition number v of an oxyethylene unit is equal to or greater than 2, a siloxane group, an oligosiloxane group having two or more silicon atoms, or a substituted or unsubstituted trialkylsilyl group.

In Formula W, in a case where $L^W$ adjacent to $R^W$ is a divalent linking group which is represented by Formula L-1, $R^W$ is preferably a substituted or unsubstituted alkyl group, an oxyethylene group, an oligo-oxyethylene group in which a repetition number v of an oxyethylene unit is equal to or greater than 2, a siloxane group, or an oligosiloxane group having two or more silicon atoms, and more preferably a substituted or unsubstituted alkyl group.

In Formula W, in a case where $L^W$ adjacent to $R^W$ is a divalent linking group which is represented by any one of Formula L-2 and Formulae L-4 to L-25, $R^W$ is more preferably a substituted or unsubstituted alkyl group.

In Formula W, in a case where $L^W$ adjacent to $R^W$ is a divalent linking group which is represented by Formula L-3, $R^W$ is preferably a substituted or unsubstituted alkyl group or a substituted or unsubstituted trialkylsilyl group.

In a case where $R^W$ is a substituted or unsubstituted alkyl group, the number of carbon atoms thereof is preferably 4 to 17, more preferably 6 to 14 from the viewpoint of chemical stability and carrier transport properties, and even more preferably 6 to 12. It is preferable that R is a long-chain alkyl group having carbon atoms within the above range, particularly, a long-chain linear alkyl group, because then linearity of the molecule is improved, and hence mobility can be improved.

In a case where $R^W$ represents an alkyl group, the alkyl group may be linear, branched, or cyclic. It is preferable that the alkyl group is a linear alkyl group, because then linearity of the molecule is improved, and hence mobility can be improved.

Particularly, from the viewpoint of improving mobility, $R^W$ and $L^W$ in Formula W preferably form a combination in which $L^W$ in Formula 1 is a divalent linking group represented by Formula L-1 and $R^W$ is a linear alkyl group having 7 to 17 carbon atoms or a combination in which $L^W$ is a divalent linking group, in which a divalent linking group represented by any one of Formulae L-3, L-13, and L-18 and a divalent linking group represented by Formula L-1 are bonded to each other, and $R^W$ is a linear alkyl group.

In a case where $L^W$ is a divalent linking group represented by Formula L-1 and $R^W$ is a linear alkyl group having 7 to 17 carbon atoms, $R^W$ is more preferably a linear alkyl group having 7 to 14 carbon atoms from the viewpoint of improving mobility, and particularly preferably a linear alkyl group having 7 to 12 carbon atoms.

In a case where $L^W$ is a divalent linking group, in which a divalent linking group represented by any one of Formulae L-3, L-13, and L-18 and a divalent linking group represented by Formula L-1 are bonded to each other, and $R^W$ is a linear alkyl group, $R^W$ is more preferably a linear alkyl group having 4 to 17 carbon atoms, even more preferably a linear alkyl group having 6 to 14 carbon atoms from the viewpoint of chemical stability and carrier transport properties, and particularly preferably a linear alkyl group having 6 to 12 carbon atoms from the viewpoint of improving mobility.

In contrast, from the viewpoint of improving solubility in an organic solvent, $R^W$ is preferably a branched alkyl group.

In a case where $R^W$ is an alkyl group having a substituent, examples of the substituent include a halogen atom and the like, and the halogen atom is preferably a fluorine atom. In a case where $R^W$ is an alkyl group having a fluorine atom, all of the hydrogen atoms of the alkyl group may be substituted with fluorine atoms such that a perfluoroalkyl group is formed. Here, $R^W$ is preferably an unsubstituted alkyl group.

In the present specification, in a case where $R^W$ is an oligo-oxyethylene group in which a repetition number v of an oxyethylene group is equal to or greater than 2, the "oligo-oxyethylene group" represented by R refers to a group represented by $-(OCH_2CH_2)_v-OY$ (the repetition number v of an oxyethylene unit represents an integer of equal to or greater than 2, and Y on the terminal represents a hydrogen atom or a substituent). In a case where Y on the terminal of the oligo-oxyethylene group is a hydrogen atom, the terminal becomes a hydroxyl group. The repetition number v of the oxyethylene unit is preferably 2 to 4, and more preferably 2 or 3.

It is preferable that the hydroxyl group on the terminal of the oligo-oxyethylene group is sealed. That is, it is preferable that Y represents a substituent. In this case, the hydroxyl group is preferably sealed with an alkyl group having 1 to 3 carbon atoms. That is, Y is preferably an alkyl group having 1 to 3 carbon atoms, more preferably a methyl group or an ethyl group, and particularly preferably a methyl group.

In a case where $R^W$ is a siloxane group or an oligosiloxane group having two or more silicon atoms, a repetition number of the siloxane unit is preferably 2 to 4, and more preferably 2 or 3. Furthermore, it is preferable that a hydrogen atom or an alkyl group is bonded to each silicon atom (Si atom). In a case where an alkyl group is bonded to the silicon atom, the number of carbon atoms of the alkyl group is preferably 1 to 3. For example, it is preferable that a methyl group or an ethyl group is bonded to the silicon atom. The same alkyl groups may be bonded to the silicon atoms, or different alkyl groups or hydrogen atoms may be bonded to the silicon atoms. All of the siloxane units constituting the oligosiloxane group may be the same as or different from each other, but it is preferable that all of them are the same as each other.

In a case where $L^W$ adjacent to $R^W$ is a divalent linking group represented by Formula L-3, $R^W$ is a substituted or unsubstituted trialkylsilyl group. In a case where $R^W$ is a substituted or unsubstituted trialkylsilyl group, a substituent of the silyl group in the trialkylsilyl group is not particularly limited as long as the substituent is a substituted or unsubstituted alkyl group, but the substituent is more preferably a branched alkyl group. The number of carbon atoms of the alkyl group bonded to each silicon atom is preferably 1 to 3. For example, it is preferable that a methyl group, an ethyl group, or an isopropyl group is bonded to the silicon atoms. The same alkyl groups or different alkyl groups may be bonded to the silicon atom. In a case where $R^W$ is a trialkylsilyl group further having a substituent on an alkyl group, the substituent is not particularly limited.

In Formula W, a total number of carbon atoms contained in $L^W$ and $R^W$ is preferably 5 to 18. If the total number of carbon atoms contained in $L^W$ and $R^W$ is equal to or greater than the lower limit of the above range, mobility is improved, and driving voltage is lowered. If the total number of the carbon atoms contained in $L^W$ and $R^W$ is equal to or less than the upper limit of the above range, solubility in an organic solvent is improved.

The total number of carbon atoms contained in $L^W$ and $R^W$ is preferably 5 to 14, more preferably 6 to 14, even more preferably 6 to 12, and particularly preferably 8 to 12.

In the compound represented by Formula 1, among $R^{1a}$ to $R^{1f}$, the number of groups represented by Formula W is preferably 1 to 4, more preferably 1 or 2, and particularly preferably 2.

In the present invention, at least one of $R^{1a}$ or $R^{1b}$ in Formula 1 is preferably a group represented by Formula W. It is considered that from the viewpoint of excellent chemical stability of the compound, the highest occupied molecular orbital (HOMO) level, and packing in a film of molecules, the positions of $R^{1a}$ and $R^{1b}$ are suitable as substitution positions in Formula 1. Particularly, in Formula 1, if a substituent is on the two sites of $R^{1a}$ and $R^{1b}$, high carrier density can be obtained.

In Formula 1, $R^{1c}$ to $R^{1f}$ each independently preferably represent a hydrogen atom, a fluorine atom, a substituted or unsubstituted alkyl group having 1 to 3 carbon atoms, a substituted or unsubstituted alkynyl group having two or three carbon atoms, a substituted or unsubstituted alkenyl group having two or three carbon atoms, a substituted or unsubstituted alkoxy group having one or two carbon atoms, or a substituted or unsubstituted methylthio group.

—Compound Represented by Formula 2—

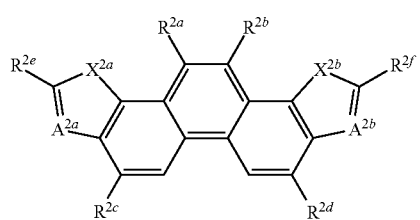

(2)

In Formula 2, $X^{2a}$ and $X^{2b}$ each independently represent $NR^{2i}$ ($>N-R^{2i}$), an O atom, or a S atom. From the viewpoint of ease of synthesis, $X^{2a}$ and $X^{2b}$ each independently preferably represent an O atom or a S atom. In contrast, from the viewpoint of improving mobility, at least one of $X^{2a}$ or $X^{2b}$ preferably represents a S atom.

$X^{2a}$ and $X^{2b}$ are preferably the same linking groups. It is more preferable that both of $X^{2a}$ and $X^{2b}$ are S atoms.

$R^{2i}$ represents a hydrogen atom, an alkyl group, an alkenyl group, an alkynyl group, or an acyl group. $R^{2i}$ is preferably a hydrogen atom or an alkyl group, more preferably an alkyl group having 1 to 14 carbon atoms, and particularly preferably an alkyl group having 1 to 4 carbon atoms.

In a case where $R^{2i}$ represents an alkyl group, the alkyl group may be linear, branched, or cyclic. It is preferable that the alkyl group is a linear alkyl group, because then linearity of the molecule is improved, and hence mobility can be improved.

In Formula 2, $A^{2a}$ represents $CR^{2g}$ or a N atom, $A^{2b}$ represents $CR^{2h}$ or a N atom, and $R^{2g}$ and $R^{2h}$ each independently represent a hydrogen atom or a substituent. It is preferable that $A^{2a}$ represents $CR^{2g}$, or $A^{2b}$ represents $CR^{2h}$. It is more preferable that $A^{2a}$ represents $CR^{2g}$, and $A^{2b}$ represents $CR^{2h}$. $A^{2a}$ and $A^{2b}$ may be the same as or different from each other, but it is preferable that they are the same as each other.

In Formula 2, $R^{2e}$ and $R^{2g}$ may or may not for a ring by being bonded to each other, but it is preferable that they do not form a ring by being bonded to each other.

In Formula 2, $R^{2f}$ and $R^{2h}$ may or may not for a ring by being bonded to each other, but it is preferable that they do not form a ring by being bonded to each other.

In Formula 2, $R^{2a}$ to $R^{2h}$ each independently represent a hydrogen atom or a substituent, and at least one of $R^{2a}$, $R^{2b}$, $R^{2c}$, $R^{2d}$, $R^{2e}$, $R^{2f}$, $R^{2g}$, or $R^{2h}$ represents a substituent represented by Formula W.

Examples of the substituent that $R^{2a}$ to $R^{2h}$ can each independently represent include the substituent X described above. The definition of the substituent represented by Formula W is as described above.

The substituent that $R^{2a}$ to $R^{2h}$ can each independently represent is preferably an alkyl group, an aryl group, an alkenyl group, an alkynyl group, a heterocyclic group, an alkoxy group, an alkylthio group, or a substituent represented by Formula W, more preferably an alkyl group having 1 to 12 carbon atoms, an aryl group having 6 to 20 carbon atoms, an alkenyl group having 2 to 12 carbon atoms, an alkynyl group having 2 to 12 carbon atoms, an alkoxy group having 1 to 11 carbon atoms, a heterocyclic group having 5 to 12 carbon atoms, an alkylthio group having 1 to 12 carbon atoms, or a group represented by Formula W, particularly preferably a group having a chain length of a linking group, which will be described later, of equal to or less than 3.7 Å or a group represented by Formula W, and more particularly preferably a group represented by Formula W.

In the compound represented by Formula 2, among $R^{2a}$ to $R^{2h}$, the number of groups represented by Formula W is preferably 1 to 4 from the viewpoint of improving mobility and improving solubility in an organic solvent, more preferably 1 or 2, and particularly preferably 2.

A group represented by Formula W can be positioned in any of $R^{2a}$ to $R^{2h}$ without particular limitation. From the viewpoint of improving mobility and improving solubility in an organic solvent, the group represented by Formula W is preferably positioned in $R^{2e}$ or $R^{2f}$.

Among $R^{2a}$ to $R^{2h}$, the number of substituents other than a group represented by Formula W is preferably 0 to 4, more preferably 0 to 2, even more preferably 0 or 1, and particularly preferably 0.

In a case where $R^{2a}$ to $R^{2h}$ each represent a substituent other than a group represented by W, the substituent is preferably a group having a chain length of a linking group of equal to or less than 3.7 Å (=0.37 nm), more preferably a group having a chain length of a linking group of 1.0 to 3.7 Å, and even more preferably a group having a chain length of a linking group of 1.0 to 2.1 Å.

The chain length of a linking group refers to a length from a C atom to the terminal of a substituent R in a C (carbon atom)-R bond. The calculation for structural optimization can be performed using a density functional method (Gaussian 03 (Gaussian, Inc)/basis function: 6-31G*, exchange-correlation functional: B3LYP/LANL2DZ). Regarding a molecular length of typical substituents, a propyl group has a molecular length of 4.6 Å, a pyrrole group has a molecular length of 4.6 Å, a propynyl group has a molecular length of 4.5 Å, a propenyl group has a molecular length of 4.6 Å, an ethoxy group has a molecular length of 4.5 Å, a methylthio group has a molecular length of 3.7 Å, an ethenyl group has a molecular length of 3.4 Å, an ethyl group has a molecular length of 3.5 Å, an ethynyl group has a molecular length of 3.6 Å, a methoxy group has a molecular length of 3.3 Å, a methyl group has a molecular length of 2.1 Å, and a hydrogen atom has a molecular length of 1.0 Å.

In a case where $R^{2a}$ to $R^{2h}$ represent substituents other than a group represented by Formula W, the substituents each independently preferably represent a substituted or unsubstituted alkyl group having two or less carbon atoms, a substituted or unsubstituted alkynyl group having two or less carbon atoms, a substituted or unsubstituted alkenyl group having two or less carbon atoms, or a substituted or unsubstituted acyl group having two or less carbon atoms, and more preferably represent a substituted or unsubstituted alkyl group having two or less carbon atoms.

In a case where $R^{2a}$ to $R^{2h}$ represent substituents other than a group represented by Formula W, and the substituents each independently represent a substituted alkyl group having two or less carbon atoms, examples of substituents that the alkyl group can have include a cyano group, a fluorine atom, a deuterium atom, and the like. Among these, a cyano group is preferable. In a case where $R^{2a}$ to $R^{2h}$ represent substituents other than a group represented by Formula W, the substituted or unsubstituted alkyl group having two or less carbon atoms that is represented by each of the substituents is preferably a methyl group, an ethyl group, or a methyl group substituted with a cyano group, more preferably a methyl group or a methyl group substituted with a cyano group, and particularly preferably a methyl group substituted with a cyano group.

In a case where $R^{2a}$ to $R^{2h}$ represent substituents other than a group represented by Formula W, and the substituents each independently represent a substituted alkynyl group having two or less carbon atoms, examples of substituents that the alkynyl group can have include a deuterium atom and the like. In a case where $R^{2a}$ to $R^{2h}$ represent substituents other than a group represented by Formula W, examples of the substituted or unsubstituted alkynyl group having two or less carbon atoms that is represented by each of the substituents include an ethynyl group and an acetylene group substituted with a deuterium atom. Between these, an ethynyl group is preferable.

In a case where $R^{2a}$ to $R^{2h}$ represent substituents other than a group represented by Formula W, and the substituents each independently represent a substituted alkenyl group having two or less carbon atoms, examples of substituents that the alkenyl group can have include a deuterium atom and the like. In a case where $R^{2a}$ to $R^{2h}$ represent substituents other than a group represented by Formula W, examples of the substituted or unsubstituted alkenyl group having two or less carbon atoms that is represented by each of the substituents include an ethenyl group and an ethenyl group substituted with a deuterium atom. Between these, an ethenyl group is preferable.

In a case where $R^{2a}$ to $R^{2h}$ represent substituents other than a group represented by Formula W, and the substituents each independently represent a substituted acyl group having two or less carbon atoms, examples of substituents that the acyl group can have include a fluorine atom and the like. In a case where $R^{2a}$ to $R^{2h}$ represent substituents other than a group represented by Formula W, examples of the substituted or unsubstituted acyl group having two or less carbon atoms that is represented by each of the substituents include a formyl group, an acetyl group, and an acetyl group substituted with fluorine. Among these, a formyl group is preferable.

—Compound Represented by Formula 3—

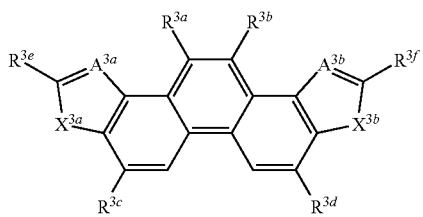

(3)

In Formula 3, $R^{3a}$ to $R^{3f}$ and $R^{3g}$ and $R^{3h}$, which will be described later, each independently represent a hydrogen atom or a substituent. Here, at least one of $R^{3a}$, $R^{3b}$, $R^{3c}$, $R^{3d}$, $R^{3e}$, $R^{3f}$, $R^{3g}$, or $R^{3h}$ represents a group represented by Formula W.

Examples of the substituent represented by $R^{3a}$ to $R^{3h}$ include the substituent X described above. The definition of a group represented by Formula W is as described above.

The substituent that $R^{3a}$ to $R^{3f}$ can each independently represent is preferably an alkyl group, an aryl group, an alkenyl group, an alkynyl group, a heterocyclic group, an alkoxy group, an alkylthio group, or a substituent represented by Formula W, and more preferably an alkyl group having 1 to 12 carbon atoms, an aryl group having 6 to 20 carbon atoms, an alkenyl group having 2 to 12 carbon atoms, an alkynyl group having 2 to 12 carbon atoms, an alkoxy group having 1 to 11 carbon atoms, a heterocyclic group having 5 to 12 carbon atoms, an alkylthio group having 1 to 12 carbon atoms, or a group represented by Formula W.

In Formula 3, $X^{3a}$ and $X^{3b}$ each independently represent a S atom, an O atom, or $NR^{3g}$ ($>N-R^{3g}$), and $R^{3g}$ represents a hydrogen atom or a substituent. X is preferably a S atom or an O atom. In Formula 3, $X^{3a}$ and $X^{3b}$ are preferably the same as each other.

$R^{3g}$ is preferably a hydrogen atom, an alkyl group, or an aryl group, more preferably an alkyl group having 1 to 14 carbon atoms, and particularly preferably an alkyl group having 4 to 12 carbon atoms. It is preferable that $R^{3g}$ is a long-chain alkyl group having carbon atoms within the above range, particularly, a long-chain linear alkyl group, because then linearity of the molecule is improved, and hence mobility can be improved.

In a case where $R^{3g}$ is an alkyl group, the alkyl group may be linear, branched, or cyclic. It is preferable that the alkyl group is a linear alkyl group, because then linearity of the molecule is improved, and hence mobility can be improved.

In Formula 3, $A^{3a}$ and $A^{3b}$ each independently represent $CR^{3h}$ or a N atom. It is preferable that $A^{3a}$ and $A^{3b}$ each independently represent $CR^{3h}$. In Formula 3, $A^{3a}$ and $A^{3b}$ may be the same as or different from each other, but it is preferable that they are the same as each other.

$R^{3h}$ is a group having a chain length of a linking group of equal to or less than 3.7 Å, more preferably a group having a chain length of a linking group of 1.0 to 3.7 Å, and even more preferably a group having a chain length of a linking group of 1.0 to 2.1 Å. The definition of a chain length of a linking group is as described above.

$R^{3h}$ is preferably a hydrogen atom, a substituted or unsubstituted alkyl group having two or less carbon atoms, a substituted or unsubstituted alkynyl group having two or less carbon atoms, a substituted or unsubstituted alkenyl group having two or less carbon atoms, or a substituted or unsubstituted acyl group having two or less carbon atoms, more preferably a hydrogen atom or a substituted or unsubstituted alkyl group having two or less carbon atoms, and particularly preferably a hydrogen atom.

In a case where $R^{3h}$ represents a substituted alkyl group having two or less carbon atoms, examples of substituents that the alkyl group can have include a cyano group, a fluorine atom, a deuterium atom, and the like. Among these, a cyano group is preferable. The substituted or unsubstituted alkyl group having two or less carbon atoms that is represented by $R^{3h}$ is preferably a methyl group, an ethyl group, or a methyl group substituted with a cyano group, more preferably a methyl group or a methyl group substituted with a cyano group, and particularly preferably a methyl group substituted with a cyano group.

In a case where $R^{3h}$ represents a substituted alkynyl group having two or less carbon atoms, examples of substituents that the alkynyl group can have include a deuterium atom and the like. Examples of the substituted or unsubstituted alkynyl group having two or less carbon atoms that is represented by $R^{3h}$ include an ethynyl group and an acetylene group substituted with a deuterium atom. Between these, an ethynyl group is preferable.

In a case where $R^{3h}$ represents a substituted alkenyl group having two or less carbon atoms, examples of substituents that the alkenyl group can have include a deuterium atom and the like. Examples of the substituted or unsubstituted alkenyl group having two or less carbon atoms that is represented by $R^{3h}$ include an ethenyl group and an ethenyl group substituted with a deuterium atom. Between these, an ethenyl group is preferable.

In a case where $R^{3h}$ represents a substituted acyl group having two or less carbon atoms, examples of substituents that the acyl group can have include a fluorine atom and the like. Examples of the substituted or unsubstituted acyl group having two or less carbon atoms that is represented by $R^{3h}$ include a formyl group, an acetyl group, and an acetyl group substituted with a fluorine atom. Among these, a formyl group is preferable.

—Compound Represented by Formula 4—

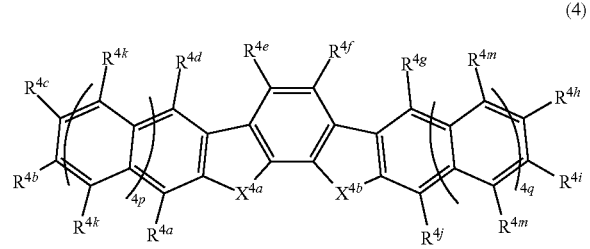

(4)

In Formula 4, $X^{4a}$ and $X^{4b}$ each independently represent an O atom, a S atom, or a Se atom.

It is preferable that $X^{4a}$ and $X^{4b}$ each independently represent an O atom or a S atom. From the viewpoint of improving mobility, it is more preferable that at least one of $X^{4a}$ or $X^{4b}$ is a S atom. It is preferable that $X^{4a}$ and $X^{4b}$ are the same linking groups. It is particularly preferable that both of $X^{4a}$ and $X^{4b}$ are S atoms.

In Formula 4, 4p and 4q each independently represent an integer of 0 to 2. It is preferable that 4p and 4q each independently represent 0 or 1, because then mobility and solubility can be achieved at the same time. It is more preferable that 4p=4q=0 or 4p=4q=1.

In Formula 4, $R^{4a}$ to $R^{4k}$ and $R^{4m}$ each independently represent a hydrogen atom, a halogen atom, or a group represented by Formula W, and at least one of $R^{4a}$, $R^{4b}$, $R^{4c}$, $R^{4d}$, $R^{4e}$, $R^{4f}$, $R^{4g}$, $R^{4h}$, $R^{4i}$, $R^{4j}$, $R^{4k}$, or $R^{4m}$ is a group represented by Formula W. Here, in a case where at least one of $R^{4e}$ or $R^{4f}$ is a group represented by Formula W, in W represented by $R^{4e}$ and $R^{4f}$, $L^W$ is a divalent linking group represented by Formula L-2 or L-3. The definition of a group represented by Formula W is as described above.

The case where at least one of $R^{4e}$ or $R^{4f}$ is a group represented by Formula W corresponds to a case where none of $R^{4e}$ and $R^{4f}$ are a hydrogen atom or a halogen atom.

In a case where at least one of $R^{4e}$ or $R^{4f}$ is a group represented by Formula W, in W represented by $R^{4e}$ or $R^{4f}$, $L^W$ is preferably a divalent linking group represented by Formula L-3.

In a case where at least one of $R^{4e}$ or $R^{4f}$ is a group represented by Formula W, both of $R^{4e}$ and $R^{4f}$ preferably represent a group represented by Formula W.

In a case where both of $R^{4e}$ and $R^{4f}$ represent a hydrogen atom or a halogen atom, $R^{4a}$ to $R^{4d}$, $R^{4g}$ to $R^{4k}$, and $R^{4m}$ each independently represent a hydrogen atom, a halogen atom, or a group represented by Formula W, and at least one or more out of $R^{4a}$, $R^{4b}$, $R^{4c}$, $R^{4d}$, $R^{4g}$, $R^{4h}$, $R^{4i}$, $R^{4j}$, $R^{4k}$, or $R^{4m}$ is a group represented by Formula W.

Examples of the halogen atom represented by $R^{4a}$ to $R^{4k}$ and $R^{4m}$ in Formula 4 include a fluorine atom, a chlorine atom, a bromine atom, and an iodine atom. The halogen atom is preferably a fluorine atom, a chlorine atom, or a bromine atom, more preferably a fluorine atom or a chlorine atom, and particularly preferably a fluorine atom.

In $R^{4a}$ to $R^{4k}$ and $R^{4m}$ in the compound represented by Formula 4, the number of halogen atoms is preferably 0 to 4, more preferably 0 to 2, even more preferably 0 or 1, and particularly preferably 0.

In the compound represented by Formula 4, among $R^{4a}$ to $R^{4k}$ and $R^{4m}$, the number of groups represented by Formula W is preferably 1 to 4 from the viewpoint of improving mobility and improving solubility in an organic solvent, more preferably 1 or 2, and particularly preferably 2.

A group represented by Formula W can be positioned in any of $R^{4a}$ to $R^{4k}$ and $R^{4m}$ without particular limitation. In the present invention, from the viewpoint of improving mobility and improving solubility in an organic solvent, it is preferable that, in Formula 4, $R^{4a}$, $R^{4d}$ to $R^{4g}$, $R^{4j}$, $R^{4k}$, and $R^{4m}$ each independently represent a hydrogen atom or a halogen atom, $R^{4b}$, $R^{4c}$, $R^{4h}$, and $R^{4i}$ each independently represent a hydrogen atom, a halogen atom, or a group represented by Formula W, and at least one of $R^{4b}$, $R^{4c}$, $R^{4h}$, or $R^{4i}$ is a group represented by Formula W.

In the present invention, it is more preferable that $R^{4a}$, $R^{4c}$ to $R^{4h}$, and $R^{4j}$ each independently represent a hydrogen atom or a halogen atom, $R^{4b}$ and $R^{4i}$ each independently represent a hydrogen atom, a halogen atom, or a group represented by Formula W, and at least one of $R^{4b}$ or $R^{4i}$ is a group represented by Formula W.

In the present invention, it is even more preferable that both of $R^{4b}$ and $R^{4i}$ represent a group represented by Formula W, both of $R^{4c}$ and $R^{4h}$ represent a hydrogen atom or a halogen atom, or both of $R^{4c}$ and $R^{4h}$ represent a group represented by Formula W, and both of $R^{4b}$ and $R^{4i}$ represent a hydrogen atom or a halogen atom.

In the present invention, it is particularly preferable that both of $R^{4b}$ and $R^{4i}$ represent a group represented by Formula W and both of $R^{4c}$ and $R^{4h}$ represent a hydrogen atom or a halogen atom, or both of $R^{4c}$ and $R^{4h}$ represent a group represented by Formula W and both of $R^{4b}$ and $R^{4i}$ represent a hydrogen atom and a halogen atom.

In Formula 4, two or more groups among $R^{4a}$ to $R^{4k}$ and $R^{4m}$ may or may not form a ring by being bonded to each other, but it is preferable that they do not form a ring by being bonded to each other.

—Compound Represented by Formula 5—

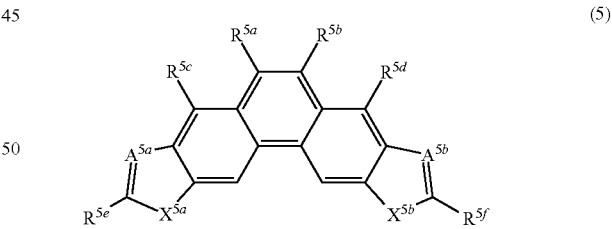

(5)

In Formula 5, $X^{5a}$ and $X^{5b}$ each independently represent $NR^{5i}$, an O atom, or a S atom. From the viewpoint of ease of synthesis, it is preferable that $X^{5a}$ and $X^{5b}$ each independently represent an O atom or a S atom. In contrast, from the viewpoint of improving mobility, it is preferable that at least one of $X^{5a}$ or $X^{5b}$ is a S atom. It is preferable that $X^{5a}$ and $X^{5b}$ are the same linking groups. It is more preferable that both of $X^{5a}$ and $X^{5b}$ are S atoms.

$R^{5i}$ represents a hydrogen atom, an alkyl group, an alkenyl group, an alkynyl group, an acyl group, an aryl group, or a heteroaryl group. $R^{5i}$ is preferably a hydrogen atom, an alkyl group, an alkenyl group, an alkynyl group, or an acyl group, more preferably a hydrogen atom or an alkyl group, even more preferably an alkyl group having 1 to 14 carbon atoms, and preferably an alkyl group having 1 to 4 carbon atoms.

In a case where $R^{5i}$ is an alkyl group, the alkyl group may be linear, branched, or cyclic. It is preferable that $R^{5i}$ is a linear alkyl group, because then linearity of the molecule is improved, and hence mobility can be improved.

In Formula 5, $A^{5a}$ represents $CR^{5g}$ or a N atom, $A^{5b}$ represents $CR^{5h}$ or a N atom, and $R^{5g}$ and $R^{5h}$ each independently represent a hydrogen atom or a substituent. It is preferable that $A^{5a}$ represents $CR^{5g}$ or $A^{5b}$ represents $CR^{5h}$. It is more preferable that $A^{5a}$ represents $CR^{5g}$ and $A^{5b}$ represents $CR^{5h}$. $A^{5a}$ and $A^{5b}$ may be the same as or different from each other, but it is preferable that they are the same as each other.

In Formula 5, $R^{5e}$ and $R^{5g}$ may or may not form a ring by being bonded to each other, but it is preferable that they do not form a ring by being bonded to each other.

In Formula 5, $R^{5e}$ and $R^{5i}$ may or may not form a ring by being bonded to each other, but it is preferable that they do not form a ring by being bonded to each other.

In Formula 5, $R^{5f}$ and $R^{5h}$ may or may not form a ring by being bonded to each other, but it is preferable that they do not form a ring by being bonded to each other.

In Formula 5, $R^{5f}$ and $R^{5i}$ may or may not form a ring by being bonded to each other, but it is preferable that they do not form a ring by being bonded to each other.

In Formula 5, $R^{5a}$ to $R^{5h}$ each independently represent a hydrogen atom or a substituent, and at least one of $R^{5a}$, $R^{5b}$, $R^{5c}$, $R^{5d}$, $R^{5e}$, $R^{5f}$, $R^{5g}$, or $R^{5h}$ is a group represented by Formula W.

Examples of the substituent represented by $R^{5a}$ to $R^{5h}$ include the substituent X described above. The definition of a group represented by Formula W is as described above.

In the compound represented by Formula 5, among $R^{5a}$ to $R^{5h}$, the number of groups represented by Formula W is preferably 1 to 4 from the viewpoint of improving mobility and improving solubility in an organic solvent, more preferably 1 or 2, and particularly preferably 2.

A group represented by Formula W can be positioned in any of $R^{5a}$ to $R^{5h}$ without particular limitation. From the viewpoint of improving mobility and improving solubility in an organic solvent, the group represented by Formula W is preferably positioned in $R^{5e}$ or $R^{5f}$.

Among $R^{5a}$ to $R^{5h}$, the number of substituents other than a group represented by Formula W is preferably 0 to 4, more preferably 0 to 2, particularly preferably 0 or 1, and more particularly preferably 0.

In a case where $R^{5a}$ to $R^{5h}$ represent substituents other than a group represented by Formula W, each of the substituents is preferably a group having a chain length of a linking group of equal to or less than 3.7 Å, more preferably a group having a chain length of a linking group of 1.0 to 3.7 Å, even more preferably a group having a chain length of a linking group of 1.0 to 2.1 Å. The definition of a chain length of a linking group is as described above.

In a case where $R^{5a}$ to $R^{5h}$ represent substituents other than a group represented by Formula W, the substituents each independently preferably represent a substituted or unsubstituted alkyl group having two or less carbon atoms, a substituted or unsubstituted alkynyl group having two or less carbon atoms, a substituted or unsubstituted alkenyl group having two or less carbon atoms, or a substituted or unsubstituted acyl group having two or less carbon atoms, and more preferably represent a substituted or unsubstituted alkyl group having two or less carbon atoms.

In a case where $R^{5a}$ to $R^{5h}$ represent substituents other than a group represented by Formula W, and the substituents each independently represent a substituted alkyl group having two or less carbon atoms, examples of substituents that the alkyl group can have include a cyano group, a fluorine atom, a deuterium atom, and the like. Among these, a cyano group is preferable. In a case where $R^{5a}$ to $R^{5h}$ represent substituents other than a group represented by Formula W, the substituted or unsubstituted alkyl group having two or less carbon atoms that is represented by each of the substituents is preferably a methyl group, an ethyl group, or a methyl group substituted with a cyano group, more preferably a methyl group or a methyl group substituted with a cyano group, and particularly preferably a methyl group substituted with a cyano group.

In a case where $R^{5a}$ to $R^{5h}$ represent substituents other than a group represented by Formula W, and the substituents each independently represent a substituted alkynyl group having two or less carbon atoms, examples of substituents that the alkynyl group can have include a deuterium atom and the like. In a case where $R^{5a}$ to $R^{5h}$ represent substituents other than a substituent represented by Formula W, examples of the substituted or unsubstituted alkynyl group having two or less carbon atoms that is represented by each of the substituents include an ethynyl group or an acetylene group substituted with a deuterium atom. Between these, an ethynyl group is preferable.

In a case where $R^{5a}$ to $R^{5h}$ represent substituents other than a group represented by Formula W, and the substituents each independently represent a substituted alkenyl group having two or less carbon atoms, examples of substituents that the alkenyl group can have include deuterium atom and the like. In a case where $R^{5a}$ to $R^{5h}$ represent substituents other than a group represented by Formula W, examples of the substituted or unsubstituted alkenyl group having two or less carbon atoms that is represented by each of the substituents include an ethenyl group and an ethenyl group substituted with a deuterium atom. Between these, an ethenyl group is preferable.

In a case where $R^{5a}$ to $R^{5h}$ represent substituents other than a group represented by Formula W, and the substituents each independently represent a substituted acyl group having two or less carbon atoms, examples of substituents that the acyl group can have include a fluorine atom and the like. In a case where $R^{5a}$ to $R^{5h}$ represent substituents other than a group represented by Formula W, examples of the substituted or unsubstituted acyl group having two or less carbon atoms that is represented by each of the substituents include a formyl group, an acetyl group, and an acetyl group substituted with a fluorine atom. Among these, a formyl group is preferable.

—Compound Represented by Formula 6—

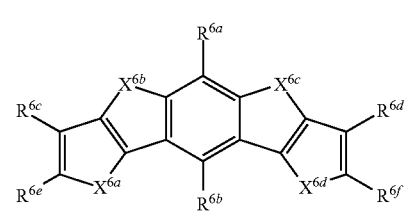

(6)

In Formula 6, $X^{6a}$ to $X^{6d}$ each independently represent $NR^{6g}$, an O atom, or a S atom, and $R^{6g}$ represents a hydrogen atom, an alkyl group, an alkenyl group, an alkynyl group, an acyl group, an aryl group, or a heteroaryl group.

From the viewpoint of ease of synthesis, it is preferable that $X^{6a}$ to $X^{6d}$ each independently represent an O atom or a S atom. In contrast, from the viewpoint of improving mobility, at least one of $X^{6a}$, $X^{6b}$, $X^{6c}$, or $X^{6d}$ is a S atom. It is preferable that $X^{6a}$ to $X^{6d}$ are the same linking groups. It is more preferable that all of $X^{6a}$ to $X^{6d}$ are S atoms.

$R^{6g}$ represents a hydrogen atom, an alkyl group, an alkenyl group, an alkynyl group, an acyl group, an aryl group, or a heteroaryl group. $R^{6g}$ is preferably a hydrogen atom, an alkyl group, an alkenyl group, an alkynyl group, or an acyl group, more preferably a hydrogen atom or an alkyl group, even more preferably an alkyl group having 1 to 14 carbon atoms, and particularly preferably an alkyl group having 1 to 4 carbon atoms.

In a case where $R^{6g}$ represents an alkyl group, the alkyl group may be linear, branched, or cyclic. However, it is preferable that $R^{6g}$ is a linear alkyl group, because then linearity of the molecule is improved, and hence mobility can be improved.

In Formula 6, $R^{6a}$ to $R^{6f}$ each independently represent a hydrogen atom or a substituent, and at least one of $R^{6a}$, $R^{6b}$, $R^{6c}$, $R^{6d}$, $R^{6e}$, or $R^{6f}$ represents a group represented by Formula W.

Examples of the substituents represented by $R^{6a}$ to $R^{6f}$ include the substituent X described above. The definition of a group represented by Formula W is as described above.

Among the substituents, the substituent that $R^{6a}$ to $R^{6f}$ can each independently represent is preferably an alkyl group, an aryl group, an alkenyl group, an alkynyl group, a heterocyclic group, an alkoxy group, an alkylthio group, or a group represented by Formula W, more preferably an alkyl group having 1 to 12 carbon atoms, an aryl group having 6 to 20 carbon atoms, an alkenyl group having 2 to 12 carbon atoms, an alkynyl group having 2 to 12 carbon atoms, an alkoxy group having 1 to 11 carbon atoms, a heterocyclic group having 5 to 12 carbon atoms, an alkylthio group having 1 to 12 carbon atoms, or a group represented by Formula W, even more preferably a group, which will be described later, having a chain length of a linking group of equal to or less than 3.7 Å or a group represented by Formula W, and particularly preferably a group represented by Formula W.

In the compound represented by Formula 6, among $R^{6a}$ to $R^{6f}$, the number of groups represented by Formula W is preferably 1 to 4 from the viewpoint of improving mobility and improving solubility in an organic solvent, more preferably 1 or 2, and particularly preferably 2.

A group represented by Formula W can be positioned in any of $R^{6a}$ to $R^{6f}$ without particular limitation, but the group represented by Formula W is preferably positioned in $R^{6c}$ to $R^{6f}$. From the viewpoint of improving mobility and improving solubility in an organic solvent, the group represented by Formula W is more preferably positioned in $R^{6e}$ or $R^{6f}$.

Among $R^{6a}$ to $R^{6f}$, the number of substituents other than a group represented by Formula W is preferably 0 to 4, more preferably 0 to 2, even more preferably 0 or 1, and particularly preferably 0.

In a case where $R^{6a}$ to $R^{6f}$ represent substituents other than a group represented by Formula W, each of the substituents is preferably a group having a chain length of a linking group of equal to or less than 3.7 Å, more preferably a group having a chain length of a linking group of 1.0 to 3.7 Å, and even more preferably a group having a chain length of a linking group of 1.0 to 2.1 Å. The definition of a chain length of a linking group is as described above.

In a case where $R^{6a}$ to $R^{6f}$ represent substituents other than a group represented by Formula W, the substituents each independently preferably represent a substituted or unsubstituted alkyl group having two or less carbon atoms, a substituted or unsubstituted alkynyl group having two or less carbon atoms, a substituted or unsubstituted alkenyl group having two or less carbon atoms, or a substituted or unsubstituted acyl group having two or less carbon atoms, and more preferably a substituted or unsubstituted alkyl group having two or less carbon atoms.

In a case where $R^{6a}$ to $R^{6f}$ represent substituents other than a group represented by Formula W, and the substituents each independently represent a substituted alkyl group having two or less carbon atoms, examples of substituents that the alkyl group can have include a cyano group, a fluorine atom, a deuterium atom, and the like. Among these, a cyano group is preferable. In a case where $R^{6a}$ to $R^{6f}$ represent substituents other than a group represented by Formula W, the substituted or unsubstituted alkyl group having two or less carbon atoms that is represented by each of the substituents is preferably a methyl group, an ethyl group, or a methyl group substituted with a cyano group, more preferably a methyl group or a methyl group substituted with a cyano group, and particularly preferably a methyl group substituted with a cyano group.

In a case where $R^{6a}$ to $R^{6f}$ represent substituents other than a group represented by Formula W, and the substituents each independently represent a substituted alkynyl group having two or less carbon atoms, examples of substituents that the alkynyl group can have include a deuterium atom and the like. In a case where $R^{6a}$ to $R^{6f}$ represent substituents other than a group represented by Formula W, examples of the substituted or unsubstituted alkynyl group having two or less carbon atoms that is represented by each of the substituents include an ethynyl group and an acetylene group substituted with a deuterium atom. Between these, an ethynyl group is preferable.

In a case where $R^{6a}$ to $R^{6f}$ represent substituents other than a group represented by Formula W, and the substituents each independently represent a substituted alkenyl group having two or less carbon atoms, examples of substituents that the alkenyl group can have include a deuterium atom and the like. In a case where $R^{6a}$ to $R^{6f}$ represent substituents other than a group represented by Formula W, examples of the substituted or unsubstituted alkenyl group having two or less carbon atoms that is represented by each of the substituents include ethenyl group and an ethenyl group substituted with a deuterium atom. Among these, an ethenyl group is preferable.

In a case where $R^{6a}$ to $R^{6f}$ represent substituents other than a group represented by Formula W, and the substituents each independently represent a substituted acyl group having two or less carbon atoms, examples of substituents that the acyl group can have include a fluorine atom and the like. In a case where $R^{6a}$ to $R^{6f}$ represent substituents other than a group represented by Formula W, examples of the substituted or unsubstituted acyl group having two or less carbon atoms that is represented by each of the substituents include a formyl group, an acetyl group, and an acetyl group substituted with a fluorine atom. Among these, a formyl group is preferable.

—Compound Represented by Formula 7—

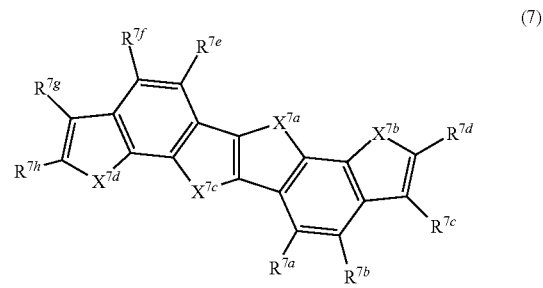

(7)

In Formula 7, $X^{7a}$ and $X^{7c}$ each independently represent a S atom, an O atom, a Se atom, or $NR^{7i}$ (>N—$R^{7i}$), and $X^{7b}$ and $X^{7d}$ each independently represent a S atom, an O atom, or a Se atom. From the viewpoint of ease of synthesis, it is preferable that $X^{7a}$ to $X^{7d}$ each independently represent an O atom or a S atom. In contrast, from the viewpoint of improving mobility, it is preferable that at least one of $X^{7a}$, $X^{7b}$, $X^{7c}$, or $X^{7d}$ is a S atom. It is preferable that $X^{7a}$ to $X^{7d}$ are the same linking groups. It is more preferable that all of $X^{7a}$ to $X^{7d}$ are S atoms.

In Formula 7, $R^{7a}$ to $R^{7i}$ each independently represent a hydrogen atom or a substituent, and at least one of $R^{7a}$, $R^{7b}$, $R^{7c}$, $R^{7d}$, $R^{7e}$, $R^{7f}$, $R^{7g}$, $R^{7h}$, or $R^{7i}$ is a group represented by Formula W.

Examples of the substituent represented by $R^{7a}$ to $R^{7i}$ include the substituent X described above. The definition of a group represented by Formula W is as described above.

$R^{7i}$ is preferably a hydrogen atom or an alkyl group, more preferably an alkyl group having 5 to 12 carbon atoms, and particularly preferably an alkyl group having 8 to 10 carbon atoms.

In a case where $R^{7i}$ represents an alkyl group, the alkyl group may be linear, branched, or cyclic. However, from the viewpoint of overlapping of HOMO, it is preferable that $R^{7i}$ is a linear alkyl group.

In $R^{7a}$ to $R^{7i}$ in the compound represented by Formula 7, the number of substituents represented by Formula W is preferably 1 to 4 from the viewpoint of improving mobility and improving solubility in an organic solvent, more preferably 1 or 2, and particularly preferably 2.

A group represented by Formula W can be positioned in any of $R^{7a}$ to $R^{7i}$ without particular limitation. The group represented by Formula W is preferably positioned in $R^{7d}$ or $R^{7h}$ from the viewpoint of improving mobility and improving solubility in an organic solvent, and more preferably positioned in $R^{7d}$ and $R^{7h}$.

Among $R^{7a}$ to $R^{7i}$ of Formula 7, the number of substituents other than a group represented by Formula W is preferably 0 to 4, more preferably 0 to 2, even more preferably 0 or 1, and particularly preferably 0.

In a case where $R^{7a}$ to $R^{7i}$ are substituents other than a group represented by Formula W, each of the substituents is preferably a group having a chain length of a linking group of equal to or less than 3.7 Å, more preferably a group having a chain length of a linking group of 1.0 to 3.7 Å, and even more preferably a group having a chain length of a linking group of 1.0 to 2.1 Å. The definition of a chain length of a linking group is as described above.

In a case where $R^{7a}$ to $R^{7i}$ are substituents other than a group represented by Formula W, the substituents each independently preferably represent a substituted or unsubstituted alkyl group having two or less carbon atoms, a substituted or unsubstituted alkynyl group having two or less carbon atoms, a substituted or unsubstituted alkenyl group having two or less carbon atoms, or a substituted or unsubstituted acyl group having two or less carbon atoms, and more preferably represent a substituted or unsubstituted alkyl group having two or less carbon atoms.

In a case where $R^{7a}$ to $R^{7i}$ are substituents other than a group represented by Formula W, and the substituents each independently represent a substituted alkyl group having two or less carbon atoms, examples of substituents that the alkyl group can have include a cyano group, a fluorine atom, a deuterium atom, and the like. Among these, a cyano group is preferable. In a case where $R^{7a}$ to $R^{7i}$ are substituents other than a group represented by Formula W, the substituted or unsubstituted alkyl group having two or less carbon atoms that is represented by each of the substituents is preferably a methyl group, an ethyl group, or a methyl group substituted with a cyano group, more preferably a methyl group or a methyl group substituted with a cyano group, and particularly preferably a methyl group substituted with a cyano group.

In a case where $R^{7a}$ to $R^{7i}$ are substituents other than a group represented by Formula W, and the substituents each independently represent a substituted alkynyl group having two or less carbon atoms, examples of substituents that the alkynyl group can have include a deuterium atom and the like. In a case where $R^{7a}$ to $R^{7i}$ are substituents other than a substituent represented by Formula W, examples of the substituted or unsubstituted alkynyl group having two or less carbon atoms that is represented by each of the substituents include an ethynyl group and an acetylene group substituted with a deuterium atom. Between these, an ethynyl group is preferable.

In a case where $R^{7a}$ to $R^{7i}$ are substituents other than a group represented by Formula W, and the substituents each independently represent a substituted alkenyl group having two or less carbon atoms, examples of substituents that the alkenyl group can have include a deuterium atom and the like. In a case where $R^{7a}$ to $R^{7i}$ are substituents other than a substituent represented by Formula W, examples of the substituted or unsubstituted alkenyl group having two or less carbon atoms that is represented by each of the substituents include an ethenyl group and an ethenyl group substituted with a deuterium atom. Between these, an ethenyl group is preferable.

In a case where $R^{7a}$ to $R^{7i}$ are substituents other than a group represented by Formula W, and the substituents each independently represent a substituted acyl group having two or less carbon atoms, examples of substituents that the acyl group can have include a fluorine atom and the like. In a case where $R^{7a}$ to $R^{7i}$ are substituents other than a substituent represented by Formula W, examples of the substituted or unsubstituted acyl group having two or less carbon atoms that is represented by each of the substituents include a formyl group, an acetyl group, and an acetyl group substituted with a fluorine atom. Among these, a formyl group is preferable.

—Compound Represented by Formula 8—

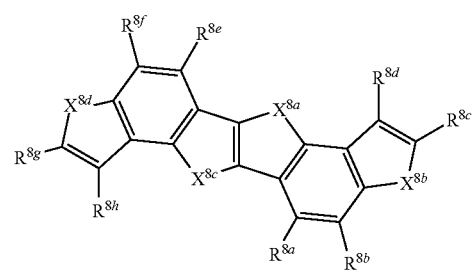

(8)

In Formula 8, $X^{8a}$ and $X^{8c}$ each independently represent a S atom, an O atom, a Se atom, or $NR^{8i}$, and $X^{8b}$ and $X^{8d}$ each independently represent a S atom, an O atom, or a Se atom. From the viewpoint of ease of synthesis, it is preferable that $X^{8a}$ to $X^{8d}$ each independently represent an O atom or a S atom. In contrast, from the viewpoint of improving mobility, it is preferable that at least one of $X^{8a}$, $X^{8b}$, $X^{8c}$, or $X^{8d}$ is a S atom. It is preferable that $X^{8a}$ to $X^{8d}$ are the same linking groups. It is more preferable that all of $X^{8a}$ to $X^{8d}$ are S atoms.

In Formula 8, $R^{8a}$ to $R^{8i}$ each independently represent a hydrogen atom or a substituent, and at least one of $R^{8a}$, $R^{8b}$, $R^{8c}$, $R^{8d}$, $R^{8e}$, $R^{8f}$, $R^{8g}$, $R^{8h}$, or $R^{8i}$ is a group represented by Formula W.

Examples of the substituent represented by $R^{8a}$ to $R^{8i}$ include the substituent X described above. The definition of a group represented by Formula W is as described above.

$R^{8i}$ is preferably a hydrogen atom or an alkyl group, more preferably an alkyl group having 5 to 12 carbon atoms, and particularly preferably an alkyl group having 8 to 10 carbon atoms.

In a case where $R^{8i}$ is an alkyl group, the alkyl group may be linear, branched, or cyclic. From the viewpoint of the overlapping of HOMO, $R^{8i}$ is preferably a linear alkyl group.

In the compound represented by Formula 8, among $R^{8a}$ to $R^{8i}$, the number of substituents represented by Formula W is preferably 1 to 4 from the viewpoint of improving mobility and improving solubility in an organic solvent, more preferably 1 or 2, and particularly preferably 2.

A group represented by Formula W can be positioned in any of $R^{8a}$ to $R^{8i}$ without particular limitation. The group represented by Formula W is preferably positioned in $R^{8c}$ or $R^{8g}$ from the viewpoint of improving mobility and improving solubility in an organic solvent, and more preferably positioned in $R^{8c}$ and $R^{8g}$.

Among $R^{8a}$ to $R^{8i}$ of Formula 8, the number of substituents other than a group represented by Formula W is preferably 0 to 4, more preferably 0 to 2, even more preferably 0 or 1, and particularly preferably 0.

In a case where $R^{8a}$ to $R^{8i}$ are substituents other than a group represented by Formula W, each of the substituents is preferably a group having a chain length of a linking group of equal to or less than 3.7 Å, more preferably a group having a chain length of a linking group of 1.0 to 3.7 Å, and even more preferably a group having a chain length of a linking group of 1.0 to 2.1 Å. The definition of a chain length of a linking group is as described above.

In a case where $R^{8a}$ to $R^{8i}$ are substituents other than a group represented by Formula W, the substituents each independently preferably represent a substituted or unsubstituted alkyl group having two or less carbon atoms, a substituted or unsubstituted alkynyl group having two or less carbon atoms, a substituted or unsubstituted alkenyl group having two or less carbon atoms, or a substituted or unsubstituted acyl group having two or less carbon atoms, and more preferably represent a substituted or unsubstituted alkyl group having two or less carbon atoms.

In a case where $R^{8a}$ to $R^{8i}$ are substituents other than a group represented by Formula W, and the substituents each independently represent a substituted alkyl group having two or less carbon atoms, examples of substituents that the alkyl group can have include a cyano group, a fluorine atom, a deuterium atom, and the like. Among these, a cyano group is preferable. In a case where $R^{8a}$ to $R^{8i}$ are substituents other than a group represented by Formula W, the substituted or unsubstituted alkyl group having two or less carbon atoms that is represented by each of the substituents is preferably methyl group, an ethyl group, or a methyl group substituted with a cyano group, more preferably a methyl group or a methyl group substituted with a cyano group, and particularly preferably a methyl group substituted with a cyano group.

In a case where $R^{8a}$ to $R^{8i}$ are substituents other than a group represented by Formula W, and the substituents each independently represent a substituted alkynyl group having two or less carbon atoms, examples of substituents that the alkynyl group can have include a deuterium atom and the like. In a case where $R^{8a}$ to $R^{8i}$ are substituents other than a group represented by Formula W, examples of the substituted or unsubstituted alkynyl group having two or less carbon atoms that is represented by each of the substituents include an ethynyl group and an acetylene group substituted with a deuterium atom. Between these, an ethynyl group is preferable.

In a case where $R^{8a}$ to $R^{8i}$ are substituents other than a group represented by Formula W, and the substituents each independently represent a substituted alkenyl group having two or less carbon atoms, examples of substituents that the alkenyl group can have include a deuterium atom and the like. In a case where $R^{8a}$ to $R^{8i}$ are substituents other than a group represented by Formula W, examples of the substituted or unsubstituted alkenyl group having two or less carbon atoms that is represented by each of the substituents include an ethenyl group and an ethenyl group substituted with a deuterium atom. Between these, an ethenyl group is preferable.

In a case where $R^{8a}$ to $R^{8i}$ are substituents other than a group represented by Formula W, and the substituents each independently represent a substituted acyl group having two or less carbon atoms, examples of substituents that the acyl group can have include a fluorine atom and the like. In a case where $R^{8a}$ to $R^{8i}$ are substituents other than a group represented by Formula W, examples of the substituted or unsubstituted acyl group having two or less carbon atoms that is represented by each of the substituents include a formyl group, an acetyl group, and an acetyl group substituted with a fluorine atom. Among these, a formyl group is preferable.

—Compound Represented by Formula 9—

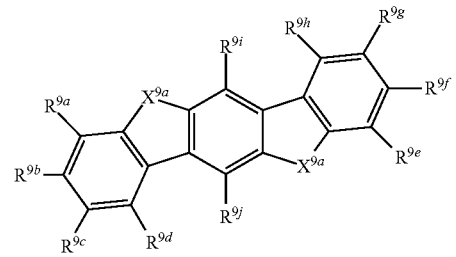

(9)

In Formula 9, $X^{9a}$ and $X^{9b}$ each independently represent an O atom, a S atom, or a Se atom. Among these, a S atom is preferable.

$R^{9c}$, $R^{9d}$, and $R^{9g}$ to $R^{9j}$ each independently represent a hydrogen atom, a halogen atom, or a substituent represented by Formula W. The definition of a group represented by Formula W is as described above.

$R^{9a}$, $R^{9b}$, $R^{9e}$, and $R^{9f}$ each independently represent a hydrogen atom or a substituent. Examples of the substituent represented by $R^{9a}$, $R^{9b}$, $R^{9e}$, and $R^{9f}$ include the substituent X described above.

It is preferable that $R^{9c}$, $R^{9d}$, and $R^{9g}$ to $R^{9j}$ each independently represent a hydrogen atom, a halogen atom, or a group represented by Formula W (here, $L^W$ is a group represented by any one of Formulae L-3, L-5, L-7 to L-9, and L-12 to L-24). Among these, $R^{9c}$, $R^{9d}$, and $R^{9g}$ to $R^{9j}$ are more preferably represent a hydrogen atom.

$L^W$ is preferably a group represented by any one of Formulae L-3, L-5, L-13, L-17, and L-18.

It is preferable that at least one of $R^{9a}$, $R^{9b}$, $R^{9c}$, $R^{9d}$, $R^{9e}$, $R^{9f}$, $R^{9g}$, $R^{9h}$, or $R^{9i}$ is a group represented by Formula W.

In the compound represented by Formula 9, among $R^{9a}$ to $R^{9i}$, the number of substituents represented by Formula W is preferably 1 to 4 from the viewpoint of improving mobility and improving solubility in an organic solvent, more preferably 1 or 2, and particularly preferably 2.

A group represented by Formula W can be positioned in any of $R^{9a}$ to $R^{9i}$ without particular limitation. The group represented by Formula W is preferably positioned in $R^{9b}$ or $R^{9f}$ from the viewpoint of improving mobility and improving solubility in an organic solvent, and more preferably positioned in $R^{9b}$ and $R^{9f}$.

Among $R^{9a}$ to $R^{9i}$ of Formula 9, the number of substituents other than a group represented by Formula W is preferably 0 to 4, more preferably 0 to 2, particularly preferably 0 or 1, and more particularly preferably 0.

—Compound Represented by Formula 10—

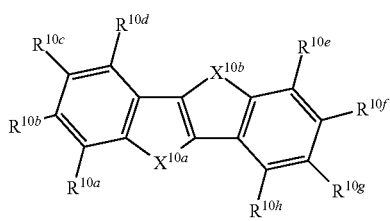

(10)

In Formula 10, $R^{10a}$ to $R^{10h}$ each independently represent a hydrogen atom or a substituent, and at least one of $R^{10a}$, $R^{10b}$, $R^{10c}$, $R^{10d}$, $R^{10e}$, $R^{10f}$, $R^{10g}$, or $R^{10h}$ represents a group represented by Formula W. Examples of the substituent represented by $R^{10a}$ to $R^{10h}$ include the substituent X described above. The definition of a substituent represented by Formula W is as described above.

It is preferable that $R^{10a}$ to $R^{10h}$ each independently represent a hydrogen atom, a halogen atom, or a substituent, and at least one of $R^{10a}$, $R^{10b}$, $R^{10c}$, $R^{10d}$, $R^{10e}$, $R^{10f}$, $R^{10g}$, or $R^{10h}$ is a substituted or unsubstituted arylthio group, a substituted or unsubstituted heteroarylthio group, a substituted or unsubstituted alkyloxycarbonyl group, a substituted or unsubstituted aryloxycarbonyl group, or a substituted or unsubstituted alkylamino group.

Among $R^{10a}$ to $R^{10h}$ of Formula 10, at least one of $R^{10b}$ or $R^{10f}$ is preferably a substituted or unsubstituted arylthio group, a substituted or unsubstituted heteroarylthio group, a substituted or unsubstituted alkyloxycarbonyl group, a substituted or unsubstituted aryloxycarbonyl group, or a substituted or unsubstituted alkylamino group, and more preferably a substituted or unsubstituted arylthio group or a substituted or unsubstituted heteroaryl group. It is even more preferable that both of $R^{10b}$ and $R^{10f}$ represent a substituted or unsubstituted arylthio group or a substituted or unsubstituted heteroarylthio group. It is particularly preferable that both of $R^{10b}$ and $R^{10f}$ represent a substituted or unsubstituted phenylthio group or a heteroarylthio group selected from the following group A. It is the most preferable that both of $R^{10b}$ and $R^{10f}$ represent a substituted or unsubstituted phenylthio group or a heteroarylthio group represented by the following Formula A-17, A-18, or A-20.

The arylthio group is preferably a group in which a sulfur atom is linked to an aryl group having 6 to 20 carbon atoms, more preferably a naphthylthio group or a phenylthio group, and particularly preferably a phenylthio group.

The heteroarylthio group is preferably a group in which a sulfur atom is linked to a 3- to 10-membered heteroaryl group, more preferably a group in which a sulfur atom is linked to a 5- or 6-membered heteroaryl group, and particularly preferably the following group A.

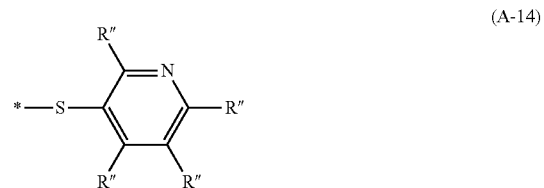

(A-14)

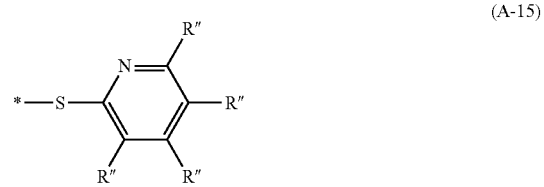

(A-15)

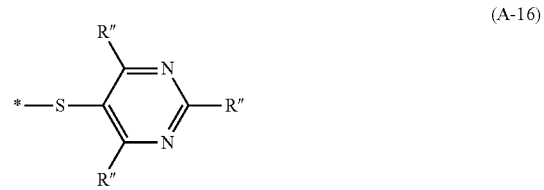

(A-16)

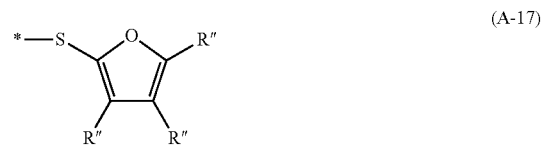

(A-17)

(A-18)

(A-20)

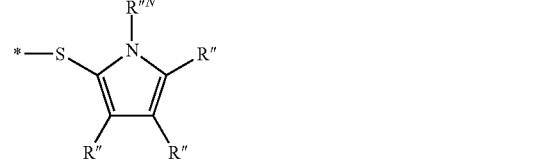

(A-21)

(A-23)

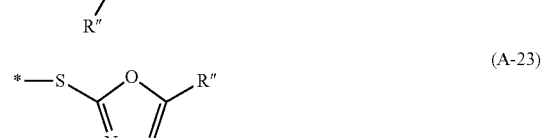

(A-24)

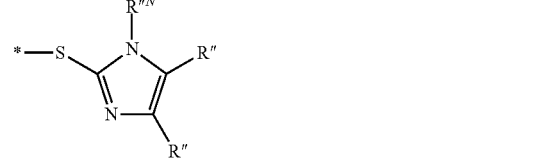

-continued

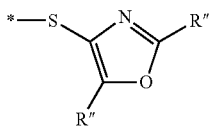

(A-26)

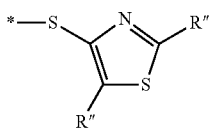

(A-27)

In the group A, R″ and R″$^N$ each independently represent a hydrogen atom or a substituent.

It is preferable that R′ in the group A each independently represents a hydrogen atom or a group represented by Formula W.

R″$^N$ in the group A preferably represents a substituent, more preferably represents an alkyl group, an aryl group, or a heteroaryl group, even more preferably represents an alkyl group, an aryl group substituted with an alkyl group, or a heteroaryl group substituted with an alkyl group, and particularly preferably represents an alkyl group having 1 to 4 carbon atoms, a phenyl group substituted with an alkyl group having 1 to 4 carbon atoms, or a 5-membered heteroaryl group substituted with an alkyl group having 1 to 4 carbon atoms.

As the alkyloxycarbonyl group, a group in which a carbonyl group is linked to an alkyl group having 1 to 20 carbon atoms is preferable. The number of carbon atoms of the alkyl group is more preferably 2 to 15, and particularly preferably 5 to 10.

As the aryloxycarbonyl group, a group in which a carbonyl group is linked to an aryl group having 6 to 20 carbon atoms is preferable. The number of carbon atoms of the aryl group is more preferably 6 to 15, and particularly preferably 8 to 12.

As the alkylamino group, a group in which an amino group is linked to an alkyl group having 1 to 20 carbon atoms is preferable. The number of carbon atoms of the alkyl group is more preferably 2 to 15, and particularly preferably 5 to 10.

Among $R^{10a}$ to $R^{10h}$, the number of substituents (hereinafter, referred to as other substituents as well) other than a substituted or unsubstituted arylthio group, a substituted or unsubstituted heteroarylthio group, a substituted or unsubstituted alkyloxycarbonyl group, a substituted or unsubstituted aryloxycarbonyl group, or a substituted or unsubstituted alkylamino group is preferably 0 to 4, more preferably 0 to 2, particularly preferably 0 or 1, and more particularly preferably 0.

$X^{10a}$ and $X^{10b}$ each independently represent a S atom, an O atom, a Se atom, or $NR^x$ (>N—$R^x$). From the viewpoint of improving mobility, it is preferable that at least one of $X^{10a}$ or $X^{10b}$ is a S atom. It is preferable that $X^{10a}$ and $X^{10b}$ are the same linking groups. It is more preferable that both of $X^{10a}$ and $X^{10b}$ are S atoms.

$R^x$ each independently represents a hydrogen atom or a group represented by Formula W. The definition of a group represented by Formula W is as described above.

—Compound Represented by Formula 11—

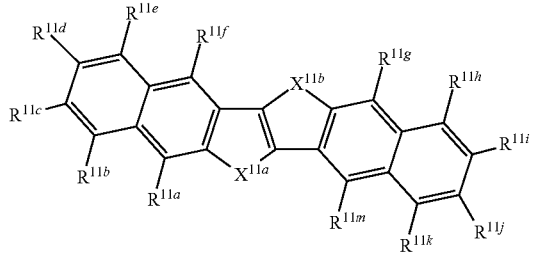

(11)

In Formula 11, $X^{11a}$ and $X^{11b}$ each independently represent a S atom, an O atom, a Se atom, or $NR^{11n}$, $R^{11a}$ to $R^{11k}$, $R^{11m}$, and $R^{11n}$ each independently represent a hydrogen atom or a substituent, and at least one of $R^{11a}$, $R^{11b}$, $R^{11c}$, $R^{11d}$, $R^{11e}$, $R^{11f}$, $R^{11g}$, $R^{11h}$, $R^{11i}$, $R^{11j}$, $R^{11k}$, $R^{11m}$, or $R^{11n}$ represents a group represented by Formula W. Examples of the substituent include the substituent X described above. The definition of a substituent represented by Formula W is as described above.

In Formula 11, from the viewpoint of improving mobility, at least one of $X^{11a}$ or $X^{11b}$ is a S atom. It is preferable that $X^{11a}$ and $X^{11b}$ are the same linking groups. It is more preferable that both of $X^{11a}$ and $X^{11b}$ are S atoms.

Among $R^{11a}$ to $R^{11k}$ and $R^{11m}$ of Formula 11, at least one of $R^{11c}$ or $R^{11i}$ is preferably a substituted or unsubstituted alkyl group, a substituted or unsubstituted arylthio group, a substituted or unsubstituted heteroarylthio group, a substituted or unsubstituted alkyloxycarbonyl group, a substituted or unsubstituted aryloxycarbonyl group, or a substituted or unsubstituted alkylamino group and more preferably a substituted or unsubstituted alkyl group. It is even more preferable that both of $R^{11c}$ and $R^{11i}$ represent a substituted or unsubstituted alkyl group.

—Compound Represented by Formula 12—

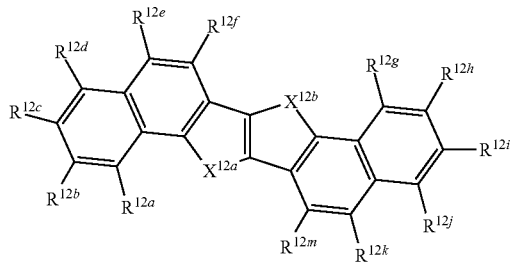

(12)

In Formula 12, $X^{12a}$ and $X^{12b}$ each independently represent a S atom, an O atom, a Se atom, or $NR^{12n}$, $R^{12a}$ to $R^{12k}$, $R^{12m}$ and $R^{12n}$ each independently represent a hydrogen atom or a substituent, and at least one of $R^{12a}$, $R^{12b}$, $R^{12c}$, $R^{12d}$, $R^{12e}$, $R^{12f}$, $R^{12g}$, $R^{12h}$, $R^{12i}$, $R^{12j}$, $R^{12k}$, $R^{12m}$, or $R^{12n}$ represents a group represented by Formula W. Examples of the substituent include the substituent X described above. The definition of a substituent represented by Formula W is as described above.

In Formula 12, from the viewpoint of improving mobility, at least one of $X^{12a}$ or $X^{12b}$ is preferably a S atom. It is preferable that $X^{12a}$ and $X^{12b}$ are the same linking groups. It is more preferable that both of $X^{12a}$ and $X^{12b}$ are S atoms.

Among $R^{12a}$ to $R^{12k}$ and $R^{12m}$ of Formula 12, at least one of $R^{12c}$ or $R^{12i}$ is preferably a substituted or unsubstituted alkyl group, a substituted or unsubstituted arylthio group, a substituted or unsubstituted heteroarylthio group, a substituted or unsubstituted alkyloxycarbonyl group, a substituted or unsubstituted aryloxycarbonyl group, or a substituted or unsubstituted alkylamino group, and more preferably a substituted or unsubstituted alkyl group. It is even more preferable that both of $R^{12c}$ and $R^{12i}$ represent a substituted or unsubstituted alkyl group.

—Compound Represented by Formula 13—

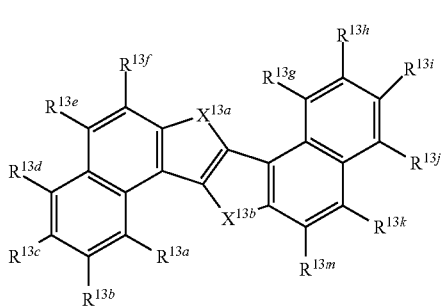

(13)

In Formula 13, $X^{13a}$ and $X^{13b}$ each independently represent a S atom, an O atom, a Se atom, or $NR^{13n}$, $R^{13a}$ to $R^{13k}$, $R^{13m}$, and $R^{13n}$ each independently represent a hydrogen atom or a substituent, and at least one of $R^{13a}$, $R^{13b}$, $R^{13c}$, $R^{13d}$, $R^{13e}$, $R^{13f}$, $R^{13g}$, $R^{13h}$, $R^{13i}$, $R^{13j}$, $R^{13k}$, $R^{13m}$, or $R^{13n}$ represents a group represented by Formula W. Examples of the substituent include the substituent X described above. The definition of a group represented by Formula W is as described above.

In Formula 13, from the viewpoint of improving mobility, at least one of $X^{13a}$ or $X^{13b}$ is preferably a S atom. It is preferable that $X^{13a}$ and $X^{13b}$ are the same linking groups. It is more preferable that both of $X^{13a}$ and $X^{13b}$ are S atoms.

Among $R^{13a}$ to $R^{13k}$ and $R^{13m}$ of Formula 13, at least one of $R^{13c}$ or $R^{13i}$ is preferably a substituted or unsubstituted alkyl group, a substituted or unsubstituted arylthio group, a substituted or unsubstituted heteroarylthio group, a substituted or unsubstituted alkyloxycarbonyl group, a substituted or unsubstituted aryloxycarbonyl group, or a substituted or unsubstituted alkylamino group, and more preferably a substituted or unsubstituted alkyl group. It is even more preferable that both of $R^{13c}$ and $R^{13i}$ represent a substituted or unsubstituted alkyl group.

—Compound Represented by Formula 14—

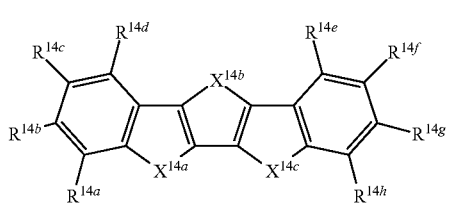

(14)

In Formula 14, $X^{14a}$ to $X^{14c}$ each independently represent a S atom, an O atom, a Se atom, or $NR^{14i}$, $R^{14a}$ to $R^{14i}$ each independently represent a hydrogen atom or a substituent, and at least one of $R^{14a}$, $R^{14b}$, $R^{14c}$, $R^{14d}$, $R^{14e}$, $R^{14f}$, $R^{14g}$, $R^{14h}$, or $R^{14i}$ represents a group represented by Formula W.

Examples of the substituent include the substituent X described above. The definition of a group represented by Formula W is as described above.

In a case where at least one of $R^{14a}$, $R^{14b}$, $R^{14c}$, $R^{14d}$, $R^{14e}$, $R^{14f}$, $R^{14g}$, or $R^{14h}$ is a group represented by Formula W, and $R^W$ is an alkyl group, $L^W$ is preferably a group represented by any one of Formulae L-2 to L-25.

In Formula 14, from the viewpoint of improving mobility, it is preferable that at least one of $X^{14a}$, $X^{14b}$, or $X^{14c}$ is a S atom. It is preferable that $X^{14a}$ to $X^{14c}$ are the same linking groups. It is more preferable that all of $X^{14a}$ to $X^{14c}$ are S atoms.

In a case where $R^W$ is an alkyl group, $L^W$ is preferably a group represented by any one of Formulae L-2 to L-5, L-13, L-17, and L-18, and more preferably a group represented by any one of Formulae L-3, L-13, and L-18.

Among $R^{14a}$ to $R^{14h}$ of Formula 14, at least one of $R^{14b}$ or $R^{14g}$ is preferably a group represented by Formula W. It is more preferable that both of $R^{14b}$ and $R^{14g}$ represent a group represented by Formula W.

—Compound Represented by Formula 15—

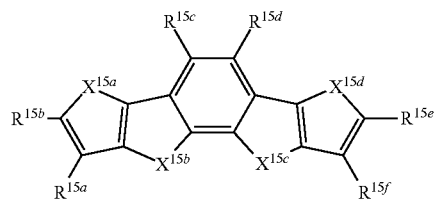

(15)

In Formula 15, $X^{15a}$ to $X^{15d}$ each independently represent a S atom, an O atom, a Se atom, or $NR^{15g}$, $R^{15a}$ to $R^{15g}$ each independently represent a hydrogen atom or a substituent, and at least one of $R^{15a}$, $R^{15b}$, $R^{15c}$, $R^{15d}$, $R^{15e}$, $R^{15f}$, or $R^{15g}$ represents a group represented by Formula W. Examples of the substituent include the substituent X described above. The definition of a group represented by Formula W is as described above.

In Formula 15, from the viewpoint of improving mobility, at least one of $X^{15a}$, $X^{15b}$, $X^{15c}$, or $X^{15d}$ is preferably a S atom. It is preferable that $X^{15a}$ to $X^{15d}$ are the same linking groups. It is more preferable that all of $X^{15a}$ to $X^{15d}$ are S atoms.

Among $R^{15a}$ to $R^{15f}$ of Formula 15, at least one of $R^{15b}$ or $R^{15e}$ is preferably a group represented by Formula W. It is more preferable that both of $R^{15b}$ and $R^{15e}$ represent a group represented by Formula W.

—Compound Represented by Formula 16—

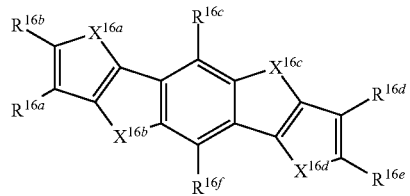

(16)

In Formula 16, $X^{16a}$ to $X^{16d}$ each independently represent a S atom, an O atom, a Se atom, or $NR^{16g}$. $R^{16a}$ to $R^{16g}$ each independently represent a hydrogen atom or a substituent, and at least one of $R^{16a}$, $R^{16b}$, $R^{16c}$, $R^{16d}$, $R^{16e}$, $R^{16f}$, or $R^{16g}$ represents a group represented by Formula W. Examples of the substituent include the substituent X described above. The definition of a group represented by Formula W is as described above.

$R^{16c}$ and $R^{16f}$ preferably represent a hydrogen atom, a halogen atom, or a group represented by Formula W (here, $L^W$ is a group represented by any one of Formulae L-3, L-5, L-7 to L-9, and L-12 to L-24). It is preferable that $R^{16a}$, $R^{16b}$, $R^{16d}$, $R^{16e}$, and $R^{16g}$ each independently represent a hydrogen atom or a substituent.

In Formula 16, $L^W$ is a group represented by any one of Formulae L-3, L-5, L-7 to L-9, and L-12 to L-24. In a case where $R^{16c}$ and $R^{16f}$ each independently represent a group represented by Formula W, $L^W$ is preferably a group represented by any one of Formulae L-3, L-5, L-13, L-17, and L-18.

In Formula 16, from the viewpoint of improving mobility, at least one of $X^{16a}$, $X^{16b}$, $X^{16c}$, or $X^{16d}$ is a S atom. It is preferable that $X^{16a}$ to $X^{16d}$ are the same linking groups. It is more preferable that all of $X^{16a}$ to $X^{16d}$ are S atoms.

It is preferable that at least one of $R^{16a}$ or $R^{16d}$ among $R^{16a}$ to $R^{16f}$ of Formula 16 represents a group represented by Formula W. It is more preferable that both of $R^{16a}$ and $R^{16d}$ represent a group represented by Formula W.

Furthermore, it is preferable that $R^{16c}$ and $R^{16f}$ represent a hydrogen atom.

The component A-1 preferably has an alkyl group, more preferably has an alkyl group having 6 to 20 carbon atoms, and even more preferably has an alkyl group having 7 to 14 carbon atoms, on a condensed polycyclic aromatic ring in the aforementioned condensed polycyclic aromatic group. If the above aspect is adopted, mobility and heat stability of the obtained organic semiconductor are further improved.

The component A-1 preferably has one or more alkyl groups, more preferably has 2 to 4 alkyl groups, and even more preferably has 2 alkyl groups, on a condensed polycyclic aromatic ring in the aforementioned condensed polycyclic aromatic group. If the above aspect is adopted, mobility and heat stability of the obtained organic semiconductor are further improved.

A method for synthesizing the component A-1 is not particularly limited, and the component A-1 can be synthesized with reference to known methods. Examples of methods for synthesizing the compounds represented by Formulae 1 to 16 include the methods disclosed in Journal of American Chemical Society, 116, 925 (1994), Journal of Chemical Society, 221 (1951), Org. Lett., 2001, 3, 3471, Macromolecules, 2010, 43, 6264, Tetrahedron, 2002, 58, 10197, JP2012-513459A, JP2011-46687A, Journal of Chemical Research. Miniprint, 3, 601-635 (1991), Bull. Chem. Soc. Japan, 64, 3682-3686 (1991), Tetrahedron Letters, 45, 2801-2803 (2004), EP2251342A, EP2301926A, EP2301921A, KR10-2012-0120886A, J. Org. Chem., 2011, 696, Org. Lett., 2001, 3, 3471, Macromolecules, 2010, 43, 6264, J. Org. Chem., 2013, 78, 7741, Chem. Eur. J., 2013, 19, 3721, Bull. Chem. Soc. Jpn., 1987, 60, 4187, J. Am. Chem. Soc., 2011, 133, 5024, Chem. Eur. J. 2013, 19, 3721, Macromolecules, 2010, 43, 6264-6267, J. Am. Chem. Soc., 2012, 134, 16548-16550, and the like.

From the viewpoint of mobility in an organic semiconductor, the component A preferably contains at least one kind of compound represented by any one of Formulae 1 to 9, 14, and 15, and more preferably contains at least one kind of compound represented by any one of Formulae 1 to 9 and 15.

Specific preferred examples of the component A will be shown below, but it goes without saying that the present invention is not limited thereto.

OSC-1

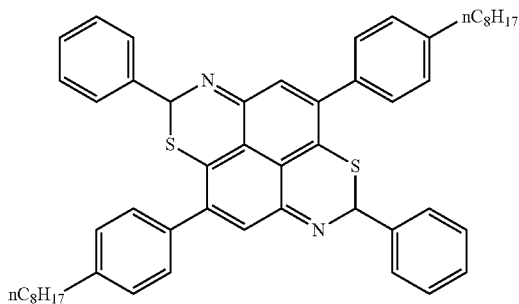

OSC-2

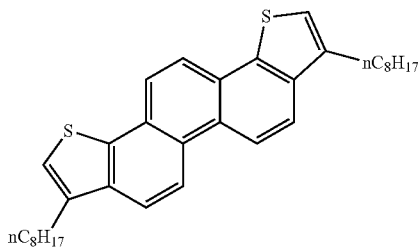

OSC-3

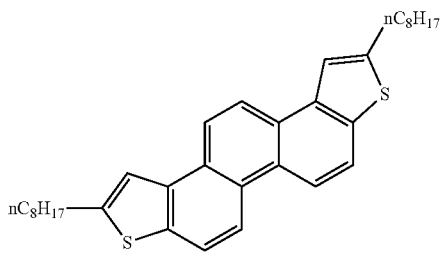

OSC-4

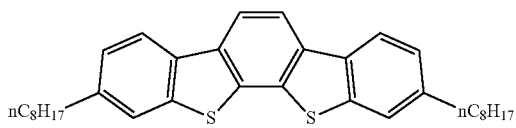

-continued
OSC - 5
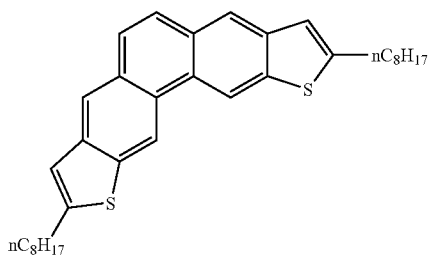
OSC - 6
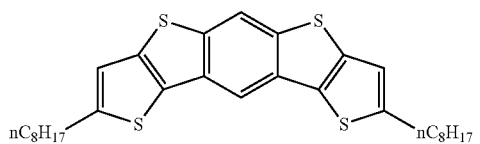
OSC - 7
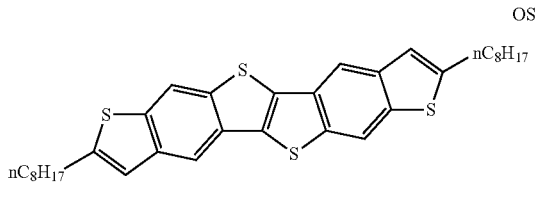
OSC - 8
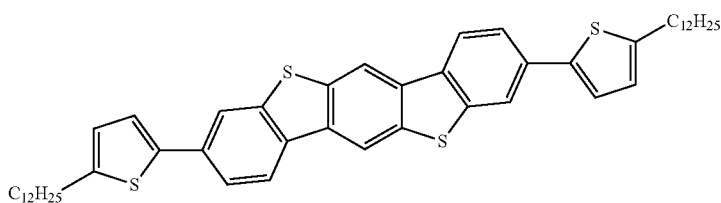
OSC - 9
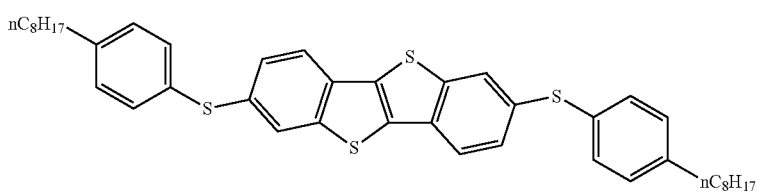
OSC - 10
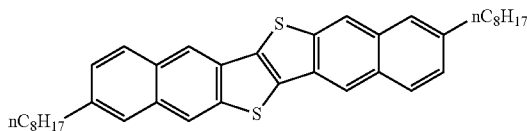
OSC - 11
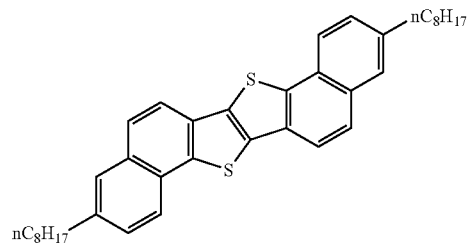
OSC - 12
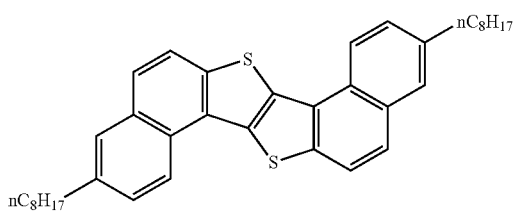
OSC - 13
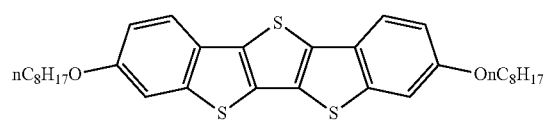
OSC - 14
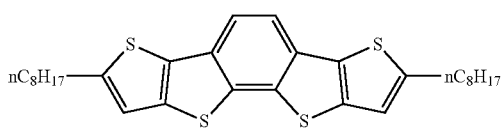
OSC - 15
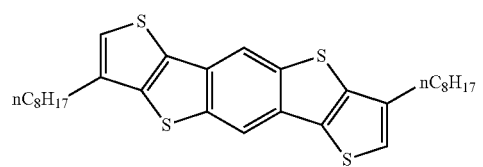
OSC - 16

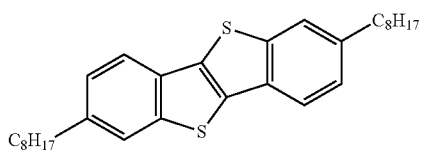

OSC - 17

A molecular weight of the component A is not particularly limited, but is preferably equal to or less than 3,000, more preferably equal to or less than 2,000, even more preferably equal to or less than 1,000, and particularly preferably equal to or less than 850. If the molecular weight is equal to or less than the upper limit described above, solubility in an organic solvent can be improved. In contrast, from the viewpoint of uniformity of a thin film, the molecular weight is preferably equal to or greater than 300, more preferably equal to or greater than 350, and even more preferably equal to or greater than 400.

A content of the component A in the composition for forming an organic semiconductor film of the present invention is, with respect to a total mass of the composition, preferably 0.01% to 20% by mass, more preferably 0.05% to 10% by mass, and even more preferably 0.2% to 5% by mass. If the content is within the above range, film formability becomes excellent, and an organic semiconductor film can be easily formed.

Component B: polymer chemically modified some or all of the ethylenically unsaturated double bonds of an ethylenically unsaturated double bond-containing polymer The composition for forming an organic semiconductor film of the present invention contains, as a component B, a polymer chemically modified some or all of the ethylenically unsaturated double bonds of an ethylenically unsaturated double bond-containing polymer.

In the following description, an "ethylenically unsaturated double bond-containing polymer" will be referred to as a "polymer before modification" as well.

That is, the component B is a polymer chemically modified some or all of the ethylenically unsaturated double bonds contained in an ethylenically unsaturated double bond-containing polymer (polymer before modification).

The polymer before modification preferably has a monomer unit derived from a diene monomer. The diene monomer is not particularly limited as long as it is a monomer having a diene structure, but is preferably conjugated diene-based hydrocarbon and other diene monomers.

Specific examples of the conjugated diene-based hydrocarbon include 1,3-butadiene, isoprene, chloroprene, 2,3-dimethyl-1,3-butadiene, 2-phenyl-1,3-butadiene, 1,3-pentadiene, 2-methyl-1,3-pentadiene, 1,3-hexadiene, 4,5-diethyl-1,3-octadiene, 3-butyl-1,3-octadiene, and the like. One kind of these compounds are used singly, or two or more kinds thereof are used in combination. Among these, 1,3-butadiene and isoprene are preferable, and 1,3-butadiene is more preferable.

As other diene monomers, diene monomers having 5 to 20 carbon atoms are preferable, and examples thereof include cyclic dienes such as 5-ethylidene-2-norbornene (ethylidene norbornene), 5-propylidene-5-norbornene, dicyclopentadiene, 5-vinyl-2-norbornene, 5-isopropylidene-2-norbornene, and norbornadiene; chain-like non-conjugated dienes such as 1,4-pentadiene, 1,4-hexadiene, 4-methyl-1,4-hexadiene, 5-methyl-1,4-hexadiene, 1,5-hexadiene, 2,5-dimethyl-1,5-hexadiene, 5-methyl-1,5-heptadiene, 6-methyl-1,5-heptadiene, and 6-methyl-1,7-octadiene; and the like. Among these, from the viewpoint of mobility of the obtained organic semiconductor film and the uniformity thereof, cyclic dienes are preferable, and ethylidene norbornene is particularly preferable.

Examples of the polymer before modification include a homopolymer of a diene monomer and a copolymer of the aforementioned diene monomer and a monoolefin-based unsaturated compound. The copolymer may be a random copolymer, a block copolymer, or a graft copolymer. The copolymer is preferably a random copolymer or a block copolymer among these.

Specific examples of the monoolefin-based unsaturated compound include ethylene, propylene, isobutene, styrene, α-methylstyrene, o-methylstyrene, p-methylstyrene, (meth)acrylonitrile, vinyl chloride, vinylidene chloride, (meth)acrylamide, vinyl acetate, a (meth)acrylic acid ester, (meth)acrylic acid, and the like.

Examples of the polymer before modification include natural rubber (NR), polybutadiene (BR), polyisoprene (IR), polychloroprene (CR), a styrene-butadiene copolymer (SBR), a styrene-isoprene copolymer (SIR), a styrene-chloroprene copolymer (SCR), an acrylonitrile-butadiene copolymer (NBR), an acrylonitrile-isoprene copolymer (NIR), an acrylonitrile-chloroprene copolymer (NCR), an acrylic acid ester-isoprene copolymer, an acrylic acid ester-chloroprene copolymer, a copolymer of a methacrylic acid ester and the aforementioned conjugated diene-based hydrocarbon, an acrylonitrile-butadiene-styrene copolymer (ABS), a styrene-isoprene-styrene block copolymer (SIS), a styrene-butadiene-styrene block copolymer (SBS), an isobutene-isoprene copolymer (butyl rubber), an ethylene-propylene-diene copolymer (EPDM), and the like.

Among these, as the ethylenically unsaturated double bond-containing polymer, at least one kind of polymer selected from the group consisting of natural rubber, an acrylonitrile-butadiene copolymer, polyisoprene, a styrene-butadiene copolymer, polybutadiene, polychloroprene, an ethylene-propylene-diene copolymer, a styrene-butadiene-styrene block copolymer, and a styrene-isoprene-styrene block copolymer is preferable, at least one kind of polymer selected from the group consisting of polybutadiene and an ethylene-propylene-diene copolymer is more preferable, and an ethylene-propylene-diene copolymer is even more preferable.

It is preferable that the polymer before modification has the aspect described above, because then mobility and uniformity of mobility are further improved.

In the present invention, the polymer before modification is preferably an elastomer. If the polymer before modification is an elastomer, mobility of the obtained organic semiconductor film and uniformity thereof are further improved, and heat resistance is further improved as well. The elastomer is a generic name of polymer compounds that exhibit rubber elasticity at room temperature (25° C.). Examples of the elastomer include thermoplastic elastomer, rubber, thermosetting elastomer, and the like, and the polymer before modification is preferably a thermoplastic elastomer or rubber.

More specifically, as being defined as rubber in JIS K6200, the elastomer refers to a substance which stretches at room temperature (18° C. to 29° C.) such that the length thereof doubles and contracts such that the length thereof becomes less than 1.5-fold of the original length within 1 minute even being held as it is for 1 minute before relaxation.

In the present invention, a Mooney viscosity ($ML_{1+4}$, 100° C.) of the polymer before modification is preferably 10 to 200, more preferably 15 to 180, and even more preferably 20 to 150. If the Mooney viscosity before modification is within the above range, heat resistance and workability are improved.

In the present invention, a weight-average molecular weight of the polymer before modification is not particularly limited, but is preferably 5,000 to 2,000,000, more preferably 10,000 to 1,000,000, and particularly preferably 20,000 to 500,000.

In the present invention, the weight-average molecular weight of a polymer is a weight-average molecular weight expressed in terms of polystyrene that is measured by gel permeation chromatography (GPC) by using tetrahydrofuran (THF) as a solvent.

In the present invention, the component B is a polymer chemically modified some or all of the ethylenically unsaturated double bonds of the aforementioned ethylenically unsaturated double bond-containing polymer.

In the present invention, "chemically modified" means functional group modification, cross-linking, or graft modification. The cross-linking means a process in which ethylenically unsaturated double bonds in the ethylenically unsaturated double bond-containing polymer are cross-linked with each other, and does not include vulcanization. Simple hydrogenation is not included in cross-linking as well.

Among these, functional group modification or graft modification is preferable, and functional group modification is more preferable.

Hereinafter, functional group modification, cross-linking, and graft modification will be specifically described.

During the functional group modification and the graft modification, it is preferable to react ethylenically unsaturated double bonds of the ethylenically unsaturated double bond-containing polymer with a mercapto group (—SH)-containing low-molecular weight compound or a mercapto group (—SH)-containing polymer such that the compound or the polymer is introduced through an ene-thiol reaction. In this way, synthesis becomes easy, and a thioether bond is introduced into the polymer before modification. Accordingly, a composition for forming an organic semiconductor film is obtained which makes it possible to obtain an organic semiconductor film having excellent heat resistance.

Hereinafter, a low-molecular weight compound or a polymer introduced into the polymer before modification will be referred to as a reactant as well.

A molecular weight of the mercapto group-containing low-molecular weight compound (in a case where the compound has a molecular weight distribution, a weight-average molecular weight) is preferably equal to or less than 3,000, more preferably equal to or less than 2,000, even more preferably equal to or less than 1,000, and still more preferably equal to or less than 500.

From the viewpoint of modifying polarity of the polymer before modification, the mercapto group-containing low-molecular weight compound preferably has, in addition to a mercapto group, an alkyl group, an aryl group, a halogen group-containing hydrocarbon group, an alkoxy group, a carboxyl group, a hydroxyl group, an ester bond, an amide bond, a poly(alkyleneoxy)group, or the like. It is also preferable that the mercapto group-containing low-molecular weight compound has a plurality of groups or bonds described above.

The aforementioned alkyl group preferably has 6 or more carbon atoms, more preferably has 6 to 36 carbon atoms, and even more preferably has 8 to 24 carbon atoms. The alkyl group may be linear, branched, or cyclic, but is preferably linear or branched.

The aforementioned aryl group is preferably a 5- to 20-membered aryl group, and more preferably 6- to 10-membered aryl group. The aryl group may be a heteroaryl group, or may have a condensed polycyclic structure in which aromatic rings are condensed. Specific examples of thereof include a group obtained by removing one hydrogen atom from benzene, benzothiazole, pyridine, benzoxazole, or the like.

In the aforementioned halogen atom-containing hydrocarbon group, from the viewpoint of modifying polarity, examples of the halogen atom include a fluorine atom, a chlorine atom, a bromine atom, and an iodine atom. Among these, a fluorine atom, a chlorine atom, and a bromine atom are preferable, and a fluorine atom is particularly preferable. Examples of the halogen atom-containing hydrocarbon group include an alkyl group substituted with a halogen atom and an aryl group substituted with a halogen atom. The aforementioned alkyl group preferably has 4 to 36 carbon atoms, and more preferably has 6 to 24 carbon atoms. When the alkyl group is substituted with a halogen atom, some or all of the hydrogen atoms of the alkyl group may be substituted with a halogen atom, and at this time, it is preferable that the alkyl group has a perfluoroalkyl group. Examples of the aforementioned aryl group include an aryl group having 6 to 20 carbon atoms, and the aryl group preferably has 6 to 10 carbon atoms. When the aryl group is substituted with a halogen atom, some of the hydrogen atoms of the aryl group or all of the substitutable hydrogen atoms of the aryl group may be substituted with a halogen atom.

The aforementioned poly(alkyleneoxy) group is preferably poly(ethyleneoxy) group and/or a poly(propyleneoxy) group. A repetition number of the poly(alkyleneoxy) group is not particularly limited, but is preferably 2 to 300 and more preferably 4 to 200.

The aforementioned alkoxy group is preferably an alkoxy group having 1 to 6 carbon atoms, and more preferably an alkoxy group having 1 to 4 carbon atoms. The alkoxy group is even more preferably a methoxy group or an ethoxy group, and particularly preferably a methoxy group.

From the viewpoint of modifying polarity of the ethylenically unsaturated double bond-containing polymer, the mercapto group-containing polymer is preferably a polymer which has, in addition to a mercapto group, an alkyl group, an aryl group, a halogen atom-containing hydrocarbon group, an alkoxy group, a carboxyl group, a hydroxyl group, an ester bond, an amide bond, a poly(alkyleneoxy) group, or the like. It is also preferable that the mercapto group-containing polymer has a plurality of groups or bonds described above.

A weight-average molecular weight of the mercapto group-containing polymer is greater than 3,000. The weight-average molecular weight is preferably equal to or greater than 4,000, and more preferably equal to or greater than 5,000.

The mercapto group-containing polymer is obtained by modifying the terminal of a polymer having a monomer unit based on the following monomer with a mercapto group. Specific examples of the monomer suitably used include a styrene-based monomer such as styrene, α-methylstyrene, vinyl toluene, or t-butylstyrene; a (meth)acrylic acid ester such as methyl (meth)acrylate, ethyl (meth)acrylate, n-butyl (meth)acrylate, isobutyl (meth)acrylate, isopentyl (meth)acrylate, n-hexyl (meth)acrylate, isooctyl (meth)acrylate, 2-ethylhexyl (meth)acrylate, n-octyl (meth)acrylate, isononyl (meth)acrylate, n-decyl (meth)acrylate, isodecyl (meth)acrylate, or isobornyl (meth)acrylate; unsaturated carboxylic acid such as (meth)acrylic acid, itaconic acid, crotonic acid, isocrotonic acid, or maleic acid; an α-olefin such as ethylene, propylene, 1-butene, 2-methyl-1-butene, 1-pentene, 4-methyl-1-pentene, 1-hexene, 1-octene, 1-decene, or 1-octadecene; norbornene; and the like. The polymer may be a random copolymer, a graft polymer, or a block copolymer. It is preferable that at least one terminal of the polymer is modified with a mercapto group, and one terminal of a main chain of the polymer is modified with a mercapto group. The other terminal of the polymer may be modified with other groups such as a cyano group.

Examples of low-molecular weight compounds (R-1 to R-18) and polymers (R-19 and R-20) preferred as a reactant will be shown below, but in the present invention, the reactant is not limited to the examples. Me represents a methyl group, and n represents a repetition number satisfying a number-average molecular weight (Mn).

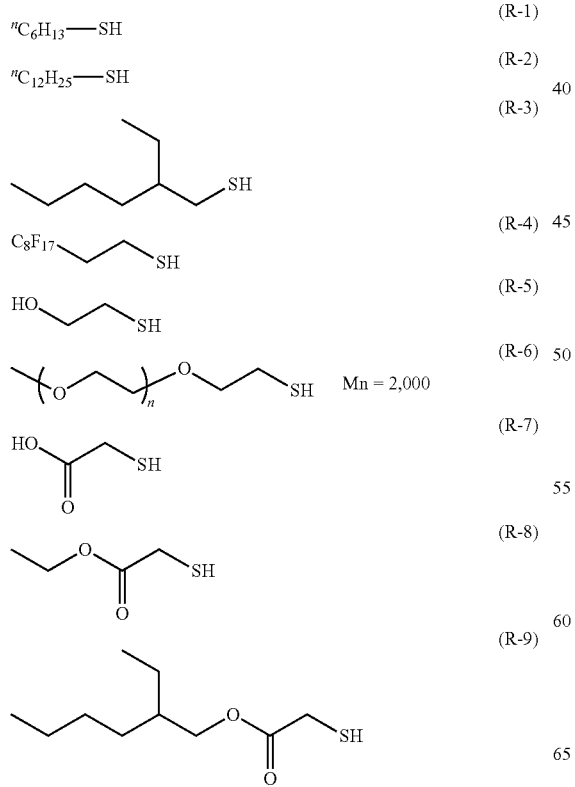

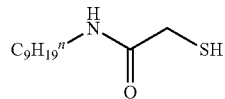

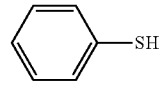

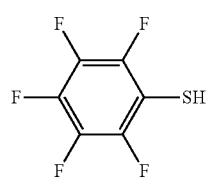

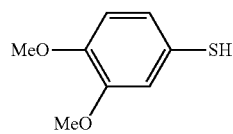

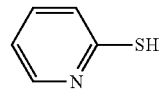

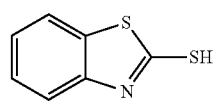

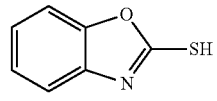

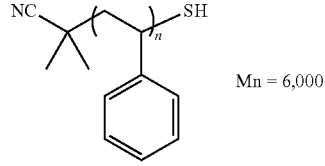

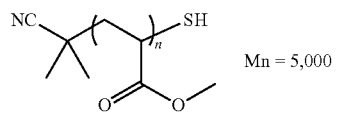

In the present invention, a modification rate of the ethylenically unsaturated double bonds of the polymer before modification is preferably 1% to 100%, more preferably 3% to 80%, and even more preferably 5% to 50%.

If the range of the modification rate is within the above range, the effect of modification can be sufficiently obtained, and heat resistance becomes excellent.

The modification rate means a percentage of modified ethylenically unsaturated double bonds to a total number of ethylenically unsaturated double bonds of the polymer before modification.

The modification rate can be measured by $^1$H-NMR.

A cross-linking agent for cross-linking the ethylenically unsaturated double bond-containing polymer is not particularly limited, and examples thereof include an organic peroxide, a phenol-based cross-linking agent, a maleimide-based cross-linking agent, oximes, polyamine, and the like. Among these, an organic peroxide is preferable.

Examples of the organic peroxide include di-t-butyl peroxide, t-butylcumyl peroxide, dicumyl peroxide, 2,5-dimethyl-2,5-di(t-butylperoxy)hexane, 2,5-dimethyl-2,5-di(t-butylperoxy)hexyne-3, 1,3-bis(t-butylperoxyisopropyl) benzene, t-butylperoxy-2-ethyl hexanoate, t-butylperoxybenzoate, t-butylperoxyisopropylcarbonate, 2,5-dimethyl-2,5-di(benzolyperoxy)hexane, acetyl peroxide, lauroyl peroxide, benzoyl peroxide, p-chlorobenzoyl peroxide, diisopropyl benzene peroxide, and the like.

As a co-cross-liking agent, a polyfunctional monomer may be used in combination. Examples of the polyfunctional monomer include divinyl benzene, triallyl cyanurate, ethylene glycol (meth)acrylate, trimethylolpropane (meth)acrylate, and the like. Among these, divinyl benzene or triallyl cyanurate is preferable.

A weight-average molecular weight of the component B is preferably 5,000 to 2,000,000, more preferably 10,000 to 1,000,000, and even more preferably 20,000 to 500,000. If the weight-average molecular weight of the component B is within the above range, mobility of the obtained organic semiconductor film and uniformity thereof are further improved.

Preferred examples of the component B include a polymer having ethylenically unsaturated double bonds and a thioether bonds and a polymer having ethylenically unsaturated double bonds and a cross-linked structure. Among these, a polymer having ethylenically unsaturated double bonds and thioether bonds is more preferable.

The polymer having ethylenically unsaturated double bonds and thioether bonds is preferably a polymer obtained by modifying some of the ethylenically unsaturated double bonds of the ethylenically unsaturated double bond-containing polymer with a mercapto group-containing compound.

Furthermore, the polymer having ethylenically unsaturated double bonds and a cross-linked structure is preferably a polymer obtained by cross-linking some of the ethylenically unsaturated double bonds of the ethylenically unsaturated double bond-containing polymer by using an organic peroxide.

An organic semiconductor film obtained from the composition for forming an organic semiconductor film of the present invention preferably has a portion in which at least the component A and the component B are mixed together, and more preferably has a portion which has a crystal structure of the component A and a portion in which at least the component A and the component B are mixed together.

It is preferable that the component B exhibits solubility higher than the solubility of the component A in a used solvent. If the above aspect is adopted, mobility and heat stability of the obtained organic semiconductor are further improved.

A content of the component B in the composition for forming an organic semiconductor film of the present invention is, with respect to 100 parts by mass of the content of the component A, preferably 3 to 300 parts by mass, more preferably 10 to 200 parts by mass, even more preferably 20 to 150 parts by mass, and particularly preferably 30 to 135 parts by mass. If the content is within the above range, mobility and heat stability of the obtained organic semiconductor are further improved.

<Solvent>

The composition for forming an organic semiconductor film of the present invention preferably contains a solvent, and more preferably contains an organic solvent.

As the solvent, a known solvent can be used.

Specific examples of the solvent include a hydrocarbon-based solvent such as hexane, octane, decane, toluene, xylene, mesitylene, ethylbenzene, decalin, or 1-methylnaphthalene, a ketone-based solvent such as acetone, methyl ethyl ketone, methyl isobutyl ketone, or cyclohexanone, a halogenated hydrocarbon-based solvent such as dichloromethane, chloroform, tetrachloromethane, dichloroethane, trichloroethane, tetrachloroethane, chlorobenzene, dichlorobenzene, or chlorotoluene, an ester-based solvent such as ethyl acetate, butyl acetate, or amyl acetate, an alcohol-based solvent such as methanol, propanol, butanol, pentanol, hexanol, cyclohexanol, methyl cellosolve, ethyl cellosolve, or ethylene glycol, an ether-based solvent such as dibutyl ether, tetrahydrofuran, dioxane, or anisole, an amide- or imide-based solvent such as N,N-dimethylformamide, N,N-dimethylacetamide, 1-methyl-2-pyrrolidone, or 1-methyl-2-imidazolidinone, a sulfoxide-based solvent such as dimethyl sulfoxide, and a nitrile-based solvent such as acetonitrile.

One kind of solvent may be used singly, or plural kinds thereof may be used in combination.

Among the solvents, a hydrocarbon-based solvent, a halogenated hydrocarbon-based solvent and/or ether-based solvent are preferable, toluene, xylene, mesitylene, tetralin, dichlorobenzene, or anisole is more preferable, and o-dichlorobenzene is particularly preferable.

In a case where the composition contains a solvent, a content of the component A in the composition for forming an organic semiconductor film of the present invention is preferably 0.01% to 80% by mass, more preferably 0.05% to 10% by mass, and even more preferably 0.1% to 5% by mass, and a content of the component B is preferably 0.01% to 80% by mass, more preferably 0.05% to 10% by mass, and even more preferably 0.1% to 5% by mass. If the content of each of the components A and B is within the above range, coating properties become excellent, and an organic semiconductor film can be easily formed.

The viscosity of the composition for forming an organic semiconductor film according to the present invention is not particularly limited. In view of further improving coating properties, the viscosity is preferably 3 to 100 mPa·s, more preferably 5 to 50 mPa·s, and even more preferably 9 to 40 mPa·s. The viscosity in the present invention is viscosity at 25° C.

As a method for measuring viscosity, a method based on JIS Z8803 is preferable.

<Other Components>

The composition for forming an organic semiconductor film of the present invention may contain components other than the components A and B and a solvent.

As other components, known additives and the like can be used.

In the composition for forming an organic semiconductor film of the present invention, a content of the components other than the components A and B and a solvent is preferably equal to or less than 10% by mass, more preferably equal to or less than 5% by mass, even more preferably equal to or less than 1% by mass, and particularly preferably equal to or less than 0.1% by mass. If the content of other components is within the above range, film formability is improved, and mobility and heat stability of the obtained organic semiconductor are further improved.

A method for manufacturing the composition for forming an organic semiconductor film of the present invention is not particularly limited, and known methods can be adopted. For example, by simultaneously or sequentially adding a predetermined amount of the components A and B to a solvent and appropriately stirring the mixture, a desired composition can be obtained.

(Organic Semiconductor Film, Organic Semiconductor Element, and Methods for Manufacturing these)

It is preferable that an organic semiconductor film and an organic semiconductor element of the present invention are manufactured using the composition for forming an organic semiconductor film of the present invention.

That is, the organic semiconductor film of the present invention contains an organic semiconductor as a component A and a polymer chemically modified some or all of the ethylenically unsaturated double bonds of an ethylenically unsaturated double bond-containing polymer, as a component B.

The organic semiconductor element in a first embodiment of the present invention contains an organic semiconductor as the component A and a polymer, which is obtained by chemically modifying some or all of the ethylenically unsaturated double bonds of an ethylenically unsaturated double bond-containing polymer, as the component B.

The organic semiconductor element in a second embodiment of the present invention has a polymer interlayer between an organic semiconductor and a gate insulating film, in which the polymer interlayer contains at least a polymer (component B) chemically modified some or all of the ethylenically unsaturated double bonds of an ethylenically unsaturated double bond-containing polymer.

The organic semiconductor element in the first embodiment of the present invention is an organic semiconductor element having an organic semiconductor film formed using the composition for forming an organic semiconductor film of the present invention. According to the first embodiment, film formability is improved, and mobility and heat stability of the obtained organic semiconductor are further improved.

The organic semiconductor element in the second embodiment of the present invention is an organic semiconductor element having a layer, which contains the component B, between a layer containing the aforementioned organic semiconductor and an insulating film. According to the second embodiment, productivity and costs are further improved.

In the second embodiment, the layer containing the organic semiconductor is preferably a layer composed of the aforementioned organic semiconductor.

Furthermore, in the second embodiment, the insulating film is preferably a gate insulating film.

In addition, in the second embodiment, the layer containing the component B is preferably a layer composed of the component B.

A method for manufacturing an organic semiconductor film or an organic semiconductor element by using the composition for forming an organic semiconductor film of the present invention is not particularly limited, and known methods can be adopted. Examples thereof include a method for manufacturing an organic semiconductor film by applying the composition onto a predetermined substrate and performing a drying treatment to dry the solvent.

The method of applying the composition onto a substrate is not particularly limited, and known methods can be adopted. Examples thereof include an ink jet printing method, a flexographic printing method, a bar coating method, a spin coating method, a knife coating method, a doctor blade method, and the like. Among these, an ink jet printing method and a flexographic printing method are preferable.

Preferred examples of the flexographic printing method include an aspect in which a photosensitive resin plate is used as a flexographic printing plate. By printing the composition onto a substrate according to the aspect, a pattern can be easily formed.

Among the above methods, the method for manufacturing an organic semiconductor film of the present invention and the method for manufacturing an organic semiconductor element of the present invention preferably include a coating step of coating a substrate with the composition for forming an organic semiconductor film of the present invention. The composition for forming an organic semiconductor film of the present invention more preferably contains a solvent, and the method for manufacturing an organic semiconductor film of the present invention and the method for manufacturing an organic semiconductor element of the present invention more preferably includes a coating step of coating a substrate with the composition for forming an organic semiconductor film of the present invention and a removing step of removing the solvent from the composition with which the substrate is coated.

The drying treatment in the drying step is a treatment performed if necessary, and the optimal treatment conditions are appropriately selected according to the type of the components A and B used and the solvent. In view of further improving mobility and film uniformity of the obtained organic semiconductor and improving productivity, a heating temperature is preferably 30° C. to 100° C. and more preferably 35° C. to 80° C., and a heating time is preferably 10 to 300 minutes and more preferably 30 to 180 minutes.

A film thickness of the formed organic semiconductor film is not particularly limited. From the viewpoint of mobility and film uniformity of the obtained organic semiconductor, the film thickness is preferably 10 to 500 nm and more preferably 30 to 200 nm.

The organic semiconductor film manufactured from the composition of the present invention can be suitably used in an organic semiconductor element, and can be particularly suitably used in an organic transistor (organic thin film transistor).

The organic semiconductor element is not particularly limited, but is preferably an organic semiconductor element having a plurality of terminals, more preferably an organic semiconductor element having 2 to 5 terminals, and even more preferably an organic semiconductor element having 2 or 3 terminals.

Furthermore, the organic semiconductor element is preferably an element which does not use a photoelectric function. In a case where the organic semiconductor element actively uses a photoelectric function, the organic substance is likely to deteriorate due to light.

Examples of a 2-terminal element include a rectifier diode, a constant voltage diode, a PIN diode, a Schottky barrier diode, a surge protection diode, a diac, a varistor, a tunnel diode, and the like.

Examples of a 3-terminal element include a bipolar transistor, a Darlington transistor, a field effect transistor, insulated gate bipolar transistor, a uni-junction transistor, a static induction transistor, a gate turn thyristor, a triac, a static induction thyristor, and the like.

Among these, a rectifier diode and transistors are preferable, and a field effect transistor is more preferable.

An aspect of the organic thin film transistor of the present invention will be described with reference to a drawing.

FIG. 1 is a schematic cross-sectional view of an aspect of an organic semiconductor element (organic thin film transistor (TFT)) of the present invention.

In FIG. 1, an organic thin film transistor 100 includes a substrate 10, a gate electrode 20 disposed on the substrate 10, a gate insulating film 30 covering the gate electrode 20, a source electrode 40 and a drain electrode 42 which contact a surface of the gate insulating film 30 that is on the side opposite to the gate electrode 20 side, an organic semiconductor film 50 covering a surface of the gate insulating film 30 between the source electrode 40 and the drain electrode 42, and a sealing layer 60 covering each member. The organic thin film transistor 100 is a bottom gate-bottom contact type organic thin film transistor.

In FIG. 1, the organic semiconductor film 50 corresponds to a film formed of the composition described above.

Hereinafter, the substrate, the gate electrode, the gate insulating film, the source electrode, the drain electrode, the organic semiconductor film, the sealing layer, and methods for forming each of these will be specifically described.

<Substrate>

The substrate plays a role of supporting the gate electrode, the source electrode, the drain electrode, and the like which will be described later.

The type of the substrate is not particularly limited, and examples thereof include a plastic substrate, a glass substrate, a ceramic substrate, and the like. Among these, from the viewpoint of applicability to each device and costs, a glass substrate or a plastic substrate is preferable.

Examples of materials of the plastic substrate include a thermosetting resin (for example, an epoxy resin, a phenol resin, a polyimide resin, or a polyester resin (for example, polyethylene terephthalate (PET) or polyethylene naphthalate (PEN)) and a thermoplastic resin (for example, a phenoxy resin, a polyethersulfone, polysulfone, or polyphenylene sulfone).

Examples of materials of the ceramic substrate include alumina, aluminum nitride, zirconia, silicon, silicon nitride, silicon carbide, and the like.

Examples of materials of the glass substrate include soda lime glass, potash glass, borosilicate glass, quartz glass, aluminosilicate glass, lead glass, and the like.

<Gate Electrode, Source Electrode, and Drain Electrode>

Examples of materials of the gate electrode, the source electrode, and the drain electrode include a metal such as gold (Au), silver, aluminum (Al), copper, chromium, nickel, cobalt, titanium, platinum, tantalum, magnesium, calcium, barium, or sodium; a conductive oxide such as $InO_2$, $SnO_2$, or indium tin oxide (ITO); a conductive polymer such as polyaniline, polypyrrole, polythiophene, polyacetylene, or polydiacetylene; a semiconductor such as silicon, germanium, or gallium arsenide; a carbon material such as fullerene, carbon nanotubes, or graphite; and the like. Among these, a metal is preferable, and silver and aluminum are more preferable.

A thickness of each of the gate electrode, the source electrode, and the drain electrode is not particularly limited, but is preferably 20 to 200 nm.

A method for forming the gate electrode, the source electrode, and the drain electrode is not particularly limited, but examples thereof include a method of vacuum vapor-depositing or sputtering an electrode material onto a substrate, a method of coating a substrate with a composition for forming an electrode, a method of printing a composition for forming an electrode onto a substrate, and the like. Furthermore, in a case where the electrode is patterned, examples of the patterning method include a photolithography method; a printing method such as ink jet printing, screen printing, offset printing, or relief printing; a mask vapor deposition method; and the like.

<Gate Insulating Film>

Examples of materials of the gate insulating film include a polymer such as polymethyl methacrylate, polystyrene, polyvinylphenol, polyimide, polycarbonate, polyester, polyvinylalcohol, polyvinyl acetate, polyurethane, polysulfone, polybenzoxazole, polysilsesquioxane, an epoxy resin, or a phenol resin; an oxide such as silicon dioxide, aluminum oxide, or titanium oxide; a nitride such as silicon nitride; and the like. Among these materials, in view of the compatibility with the organic semiconductor film, a polymer is preferable.

In a case where a polymer is used as the material of the gate insulating film, it is preferable to use a cross-linking agent (for example, melamine) in combination. If the cross-linking agent is used in combination, the polymer is cross-linked, and durability of the formed gate insulating film is improved.

A film thickness of the gate insulating film is not particularly limited, but is preferably 100 to 1,000 nm.

A method for forming the gate insulating film is not particularly limited, but examples thereof include a method of coating a substrate, on which the gate electrode is formed, with a composition for forming a gate insulating film, a method of vapor-depositing or sputtering the material of the gate insulating film onto a substrate on which the gate electrode is formed, and the like. A method for coating the aforementioned substrate with the composition for forming a gate insulating film is not particularly limited, and it is possible to use a known method (a bar coating method, a spin coating method, a knife coating method, or a doctor blade method).

In a case where the gate insulating film is formed by coating the substrate with the composition for forming a gate insulating film, for the purpose of removing the solvent, causing cross-linking, or the like, the composition may be heated (baked) after coating.

<Organic Semiconductor Film>

The organic semiconductor film of the present invention is a film formed of the composition for forming an organic semiconductor film of the present invention.

A method for forming the organic semiconductor film is not particularly limited. By applying the aforementioned composition onto the source electrode, the drain electrode, and the gate insulating film and, if necessary, performing a drying treatment, a desired organic semiconductor film can be formed.

<Polymer Interlayer>

The organic semiconductor element in the second embodiment of the present invention preferably has the aforementioned polymer interlayer between a layer containing the aforementioned organic semiconductor and an insulating film, and more preferably has a polymer interlayer containing the component B between the aforementioned organic semiconductor and the gate insulating film. A film thickness of the polymer interlayer is not particularly limited, but is preferably 20 to 500 nm. The polymer interlayer should be a layer containing the component B, and is preferably a layer composed of the component B.

<Sealing Layer>

From the viewpoint of durability, the organic thin film transistor of the present invention preferably includes a sealing layer as an outermost layer. In the sealing layer, a known sealant can be used.

A thickness of the sealing layer is not particularly limited, but is preferably 0.2 to 10 μm.

A method for forming the sealing layer is not particularly limited, but examples thereof include a method of coating a substrate, on which the gate electrode, the gate insulating film, the source electrode, the drain electrode, and the organic semiconductor film are formed, with a composition for forming a sealing layer, and the like. Specific examples of the method of coating the substrate with the composition for forming a sealing layer are the same as the examples of the method of coating the substrate with the composition for forming a gate insulating film. In a case where the organic semiconductor film is formed by coating the substrate with the composition for forming a sealing layer, for the purpose of removing the solvent, causing cross-linking, or the like, the composition may be heated (baked) after coating.

Figure 2:
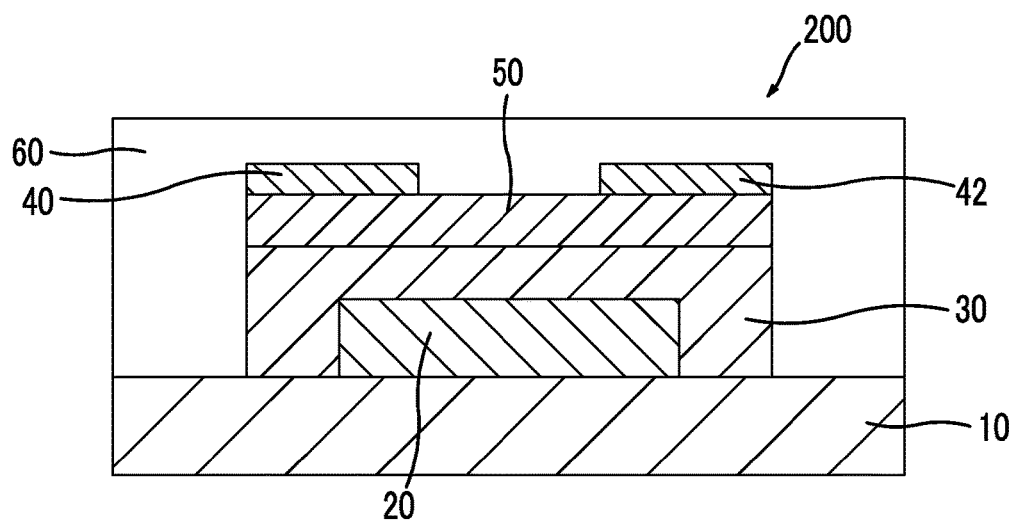
FIG. 2 is a schematic cross-sectional view of another aspect of the organic semiconductor element of the present invention.

FIG. 2 is a schematic cross-sectional view of another aspect of the organic semiconductor element (organic thin film transistor) of the present invention.

In FIG. 2, an organic thin film transistor 200 includes the substrate 10, the gate electrode 20 disposed on the substrate 10, the gate insulating film 30 covering the gate electrode 20, the organic semiconductor film 50 disposed on the gate insulating film 30, the source electrode 40 and the drain electrode 42 disposed on the organic semiconductor film 50, and the sealing layer 60 covering each member. Herein, the source electrode 40 and the drain electrode 42 are formed using the aforementioned composition of the present invention. The organic thin film transistor 200 is a top contact-type organic thin film transistor.

The substrate, the gate electrode, the gate insulating film, the source electrode, the drain electrode, the organic semiconductor film, and the sealing layer are as described above.

In FIGS. 1 and 2, the aspects of the bottom gate-bottom contact type organic thin film transistor and the bottom gate-top contact type organic thin film transistor were specifically described. However, the composition of the present invention can also be applied to a top gate-bottom contact type organic thin film transistor and a top gate-top contact type organic thin film transistor.

The aforementioned organic thin film transistor can be suitably used in electronic paper, a display device, and the like.

EXAMPLES

Hereinafter, the present invention will be more specifically described based on examples. The materials and the amount thereof used, the proportion of the materials, the content and procedure of treatments, and the like described in the following examples can be appropriately changed within a scope that does not depart from the gist of the present invention. Accordingly, the scope of the present invention is not limited to the following specific examples. Herein, unless otherwise specified, "part" and "%" are based on mass.

Synthesis Example

Synthesis of B-2

10 parts by mass of EP65 (ethylene-propylene-ethylidene norbornene copolymer, ethylidene norbornene content: 9% by mass, ethylene content: 53.5% by mass) manufactured by JSR Corporation, 190 parts by mass of toluene, and 1.5 parts by mass of 1-dodecanethiol were put into a flask and deoxygenated by nitrogen bubbling with stirring. 1.85 parts by mass of V-65 manufactured by Wako Pure Chemical Industries, Ltd. was added thereto, the resultant was reacted for 5 hours in an oil bath with a temperature of 85° C., and the reaction solution was left to cool and then subjected to reprecipitation using ethyl acetate. By discarding the supernatant and dissolving again the precipitate in toluene, a reprecipitation operation using ethyl acetate was repeated 3 times. The supernatant was discarded, and the obtained precipitate was dried in a vacuum oven, thereby obtaining B-2. A modification rate with respect to ethylenically unsaturated double bonds of the polymer before modification was calculated by $^1$H-NMR. As a result, it was confirmed that the modification rate was 12%.

The other component B was also synthesized by the same method as described above.

The following Table 1 shows ethylenically unsaturated double bond-containing polymers and reactants used and a modification rate of ethylenically unsaturated double bonds.

Herein, B-23 was synthesized as below.

10 parts by mass of EP65 manufactured by JSR Corporation, 190 parts by mass of toluene, and 0.10 parts by mass of triallyl cyanurate as a co-cross-linking agent were put into a flask and deoxygenated by nitrogen bubbling with stirring. 0.3 parts by mass of PERBUTYL O manufactured by NOF CORPORATION was added thereto, the resultant was reacted for 5 hours in an oil bath with a temperature of 85° C., and the reaction solution was left to cool and then reprecipitated using ethyl acetate. By discarding the supernatant and dissolving again the precipitate in toluene, a reprecipitation operation using ethyl acetate was repeated 3 times. The supernatant was discarded, and the obtained precipitate was dried in a vacuum oven, thereby obtaining B-23.

TABLE 1

|  | Polymer before modification | Reactant | Modification rate of ethylenically unsaturated double bonds |
| --- | --- | --- | --- |
| B-1 | JSR EP65 | R-1 | 41% |
| B-2 | (EPDM) | R-2 | 12% |
| B-3 |  | R-2 | 68% |
| B-4 |  | R-2 | 83% |
| B-5 |  | R-3 | 29% |
| B-6 |  | R-4 | 21% |
| B-7 |  | R-5 | 10% |
| B-8 |  | R-6 | 6% |
| B-9 |  | R-7 | 11% |
| B-10 |  | R-8 | 27% |
| B-11 |  | R-9 | 19% |
| B-12 |  | R-10 | 17% |
| B-13 |  | R-11 | 27% |
| B-14 |  | R-12 | 17% |
| B-15 |  | R-13 | 17% |
| B-16 |  | R-14 | 12% |
| B-17 |  | R-15 | 25% |
| B-18 |  | R-16 | 34% |
| B-19 |  | R-17 | 21% |
| B-20 |  | R-18 | 17% |
| B-21 |  | R-19 | 5% |
| B-22 |  | R-20 | 7% |
| B-23 |  | R-21 | — |
| B-24 | UBEPOL BR150L | R-2 | 22% |
| B-25 | (Polybutadiene) | R-4 | 14% |
| B-26 |  | R-6 | 5% |

TABLE 1-continued

| Polymer before modification | Reactant | Modification rate of ethylenically unsaturated double bonds |
|---|---|---|
| B-27 | R-8 | 9% |
| B-28 | R-12 | 13% |
| B-29 | R-13 | 10% |
| B-30 UBEPOL BR150L | R-14 | 16% |
| B-31 (Polybutadiene) | R-15 | 10% |
| B-32 | R-16 | 7% |
| B-33 | R-19 | 3% |
| B-34 Nipol IR2200L | R-2 | 26% |
| B-35 (Polyisoprene) | R-4 | 10% |
| B-36 | R-6 | 8% |
| B-37 | R-12 | 11% |
| B-38 | R-15 | 15% |
| B-39 JSR N240S | R-2 | 30% |
| B-40 (NBR) | R-4 | 15% |
| B-41 | R-6 | 4% |
| B-42 | R-12 | 16% |
| B-43 | R-15 | 13% |
| B-44 Nipol NS612 | R-2 | 20% |
| B-45 (SBR) | R-4 | 11% |
| B-46 | R-6 | 10% |
| B-47 | R-12 | 16% |
| B-48 | R-15 | 15% |
| B-49 KRATON D1102 | R-2 | 33% |
| B-50 (SBS) | R-4 | 18% |
| B-51 | R-6 | 4% |
| B-52 | R-12 | 10% |
| B-53 | R-15 | 23% |
| B-54 KRATON D1161 | R-2 | 25% |
| B-55 (SIS) | R-4 | 15% |
| B-56 | R-6 | 5% |
| B-57 | R-12 | 10% |
| B-58 | R-15 | 20% |

The components used in the above table are as follows.
(Polymer Before Modification)

JSR EP65 (manufactured by JSR Corporation): ethylene-propylene-ethylidene norbornene copolymer, ethylidene norbornene content: 9% by mass, ethylene content: 53.5% by mass, Mooney viscosity ($ML_{1+4}$, 125° C.): 48

UBEPOL BR150L (manufactured by UBE INDUSTRIES, LTD.): polybutadiene, Mooney viscosity ($ML_{1+4}$, 100° C.): 43

Nipol (registered trademark) IR2200L (manufactured by Zeon Corporation, Japan): polyisoprene JSR N240S (manufactured by JSR Corporation): acrylonitrile-butadiene copolymer, acrylonitrile content: 26%, Mooney viscosity ($ML_{1+4}$, 100° C.): 56

Nipol (registered trademark) NS612 (manufactured by JSR Corporation): styrene-butadiene copolymer, amount of styrene bonded: 15%, Mooney viscosity ($ML_{1+4}$, 100° C.): 62

KRATON (registered trademark) D1102 J (manufactured by Kraton Performance Polymers Inc): styrene-butadiene-styrene block copolymer KRATON (registered trademark) D1161 JSP (manufactured by Kraton Performance Polymers Inc): styrene-isoprene-styrene block copolymer (Reactant)

R-1 to R-20: shown below. Me represents a methyl group, and n represents a repetition number satisfying Mn.

R-21: PERBUTYL O (manufactured by NOF CORPORATION), t-butylperoxyhexanoate

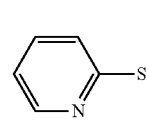 (R-1)

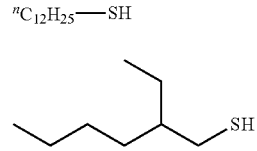 (R-2)

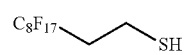 (R-3)

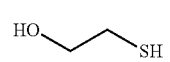 (R-4)

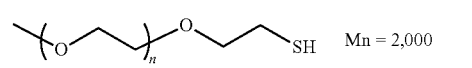 (R-5)

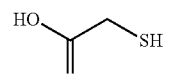 (R-6)

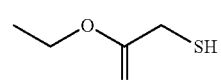 (R-7)

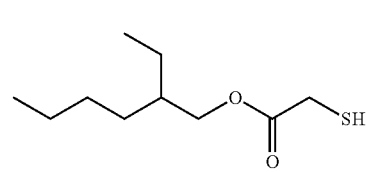 (R-8)

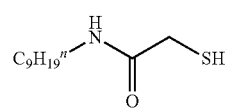 (R-9)

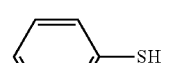 (R-10)

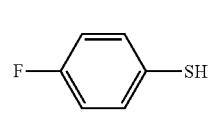 (R-11)

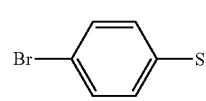 (R-12)

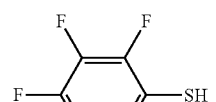 (R-13)

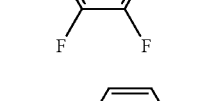 (R-14)

(R-15)

(R-16)

-continued

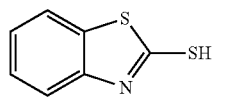
(R-17)

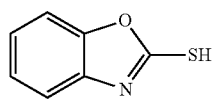
(R-18)

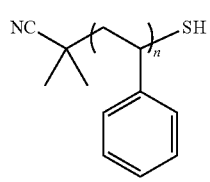
(R-19)

Mn = 6,000

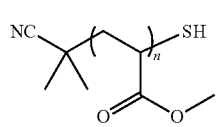
(R-20)

Mn = 5,000

(Preparation of Composition for Forming Organic Semiconductor Film)

The organic semiconductor and polymer shown in Table 2 or 3 and o-dichlorobenzene as a solvent were weighed out in a glass vial at a predetermined ratio (mass ratio with respect to a total mass of the composition) shown in Table 2 or 3 and stirred and mixed together for 10 minutes by using MIX ROTOR (manufactured by AS ONE Corporation). The mixture was filtered through a 0.5 μm membrane filter, thereby obtaining a composition for forming an organic semiconductor film.

(Manufacturing Organic Transistor)

A bottom gate-bottom contact type organic transistor was formed in the following manner.

<Formation of Gate Electrode>

A silver nanoink (H-1, manufactured by Mitsubishi Materials Corporation) was printed on an alkali-free glass substrate (5 cm×5 cm) by an ink jet method using DMP 2831 (1 pL head), thereby forming a wiring pattern having a width of 100 μm and a film thickness of 100 nm. Then, the wiring pattern was fired in the atmosphere on a hot plate for 90 minutes at 200° C., thereby forming gate electrode wiring.

<Formation of Gate Insulating Film>

5 parts by mass of polyvinyl phenol (weight-average molecular weight (Mw): 25,000, manufactured by Sigma-Aldrich Co. LLC.), 5 parts by mass of melamine, and 90 parts by mass of polyethylene glycol monomethyl ether acetate were stirred and mixed together and filtered through a 0.2 μm membrane filter, thereby preparing a solution. The obtained solution was added dropwise onto the glass substrate on which a gate electrode was prepared, and the substrate was coated with the solution by spin coating (1,000 rpm, 120 seconds), followed by heating for 30 minutes at 150° C., thereby forming a gate insulating film having a film thickness of 500 nm.

<Formation of Source Electrode and Drain Electrode (SD Electrode)>

Figure 3:
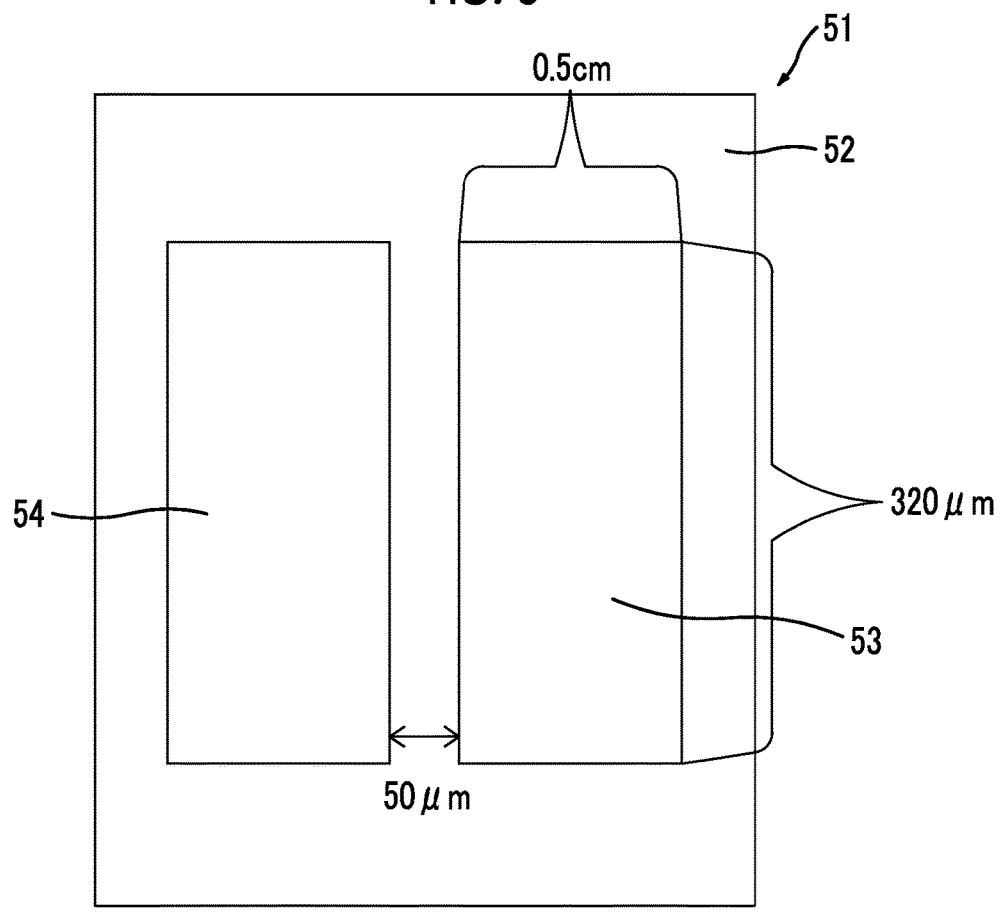
FIG. 3 is a plan view of a metal mask used in examples.

A metal mask having a plurality of patterns shown in FIG. 3 was loaded on the center of the substrate coated with the aforementioned insulating film and irradiated with UV ozone for 30 minutes. In this way, opening portions of the mask were modified and became a hydrophilic processed surface. Herein, the metal mask has mask portions, which block light, and opening portions. In the periphery of the modified portions, through ink jet printing using DMP 2831 (1 pL head), patterns of a source electrode and a drain electrode having a channel length of 50 μm and a channel width of 320 μm were formed. The obtained substrate was fired for 90 minutes at 200° C. on a hot plate in a $N_2$ atmosphere (in a glove box, an environment having an oxygen concentration of equal to or less than 20 ppm), thereby forming a source electrode and a drain electrode having a film thickness of 200 nm.

<Formation of Polymer Layer>

In Example 71, a polymer layer was formed in the following manner. 1.5 parts by mass of B-1 and 98.5 parts by mass of toluene were stirred and mixed together, and the mixture was filtered through a 0.5 μm membrane filter, thereby preparing a solution. The obtained solution was added dropwise onto a glass substrate on which the aforementioned SD electrode was prepared, and the substrate was coated with the solution by spin coating (1,000 rpm, 120 seconds), followed by heating for 30 minutes at 100° C., thereby forming a polymer layer.

<Formation of Organic Semiconductor Film: Ink Jet Method>

In Example 71, the substrate on which the aforementioned polymer layer was formed was coated with the composition for forming an organic semiconductor film prepared as above by an ink jet method. By using DPP 2831 (manufactured by Fujifilm Graphic Systems) as an ink jet device and a 10 pL head, a solid film was formed at a jetting frequency of 2 Hz and a dot pitch of 20 μm. Then, the film was dried for 1 hour at 70° C., thereby preparing an organic semiconductor film.

In Example 71, a polymer was not added to the composition for forming an organic semiconductor film.

<Formation of Organic Semiconductor Film: Flexographic Printing Method>

In Examples 1 to 70, the substrate, on which the source electrode and the drain electrode were formed, was coated with the composition prepared as above (composition shown in Table 2 or 3) by a flexographic printing method. As a printing device, a flexographic printability tester F1 (manufactured by IGT Testing Systems K.K.) was used, and as a flexographic resin plate, AFP DSH 1.70% (manufactured by Asahi Kasei Corporation.)/solid image was used. Printing was performed at a transport rate of 0.4 m/sec under a pressure between the plate and the substrate of 60 N, and then the substrate was dried as it was for 2 hours at a temperature of equal to or less than 40° C., thereby preparing an organic semiconductor film (film thickness: 50 nm) between the source electrode and the drain electrode and manufacturing an organic transistor.

(Evaluation)

The organic transistor (organic transistor element) prepared as above was evaluated as below.

<Measurement of Mobility>

By using a semiconductor characteristic evaluation device B2900A (manufactured by Agilent Technologies), carrier mobility was measured. According to the value of the mobility, the organic transistors were scored on a scale of 1 to 5.

5: a mobility of equal to or greater than 0.2 $cm^2$/Vs

4: a mobility of equal to or greater than 0.1 $cm^2$/Vs and less than 0.2 $cm^2$/Vs 3: a mobility of equal to or greater than 0.02 $cm^2$/Vs and less than 0.1 $cm^2$/Vs 2: a mobility of equal to or greater than 0.002 $cm^2$/Vs and less than 0.02 $cm^2$/Vs 1: a mobility of less than 0.002 $cm^2$/Vs <Variation in Mobility (Uniformity)>

In the manner described above, 30 organic transistors were manufactured, and mobility of each of the organic transistors was evaluated in the manner described above. From the measured values of mobility of the 30 organic transistors, a relative standard deviation (%) ((standard deviation/average)×100) was calculated.

5: a relative standard deviation of less than 20%

4: a relative standard deviation of equal to or greater than 20% and less than 30%

3: a relative standard deviation of equal to or greater than 30% and less than 50%

2: a relative standard deviation of equal to or greater than 50% and less than 100%

1: a relative standard deviation of equal to or greater than 100%

<Thermal Stability (Heat Resistance)>

The organic transistors (organic transistor elements) manufactured as above were heated for 1 hour at 120° C. in the atmosphere, and then a change of mobility was evaluated. Specifically, for each of the 30 organic transistors, a difference between a mobility Y after heating and a mobility X before heating was divided by the mobility X, and the thus obtained value was multiplied by 100 [{(Y−X)/X}×100]. The values obtained in this way were averaged, and the average was taken as a rate of change.

5: a rate of change of less than 20%

4: a rate of change of equal to or greater than 20% and less than 30%

3: a rate of change of equal to or greater than 30% and less than 50%

2: a rate of change of equal to or greater than 50% and less than 100%

1: a rate of change of equal to or greater than 100%

TABLE 2

| | Organic semiconductor | Component B | Organic semiconductor concentration | Component B concentration | Mobility | Variation (uniformity) | Heat resistance |
|---|---|---|---|---|---|---|---|
| Example 1 | OSC-1 | B-1 | 1.5 wt % | 1.5 wt % | 4 | 4 | 5 |
| Example 2 | OSC-1 | B-2 | 1.5 wt % | 1.5 wt % | 4 | 4 | 5 |
| Example 3 | OSC-1 | B-3 | 1.5 wt % | 1.5 wt % | 4 | 4 | 5 |
| Example 4 | OSC-1 | B-4 | 1.5 wt % | 1.5 wt % | 4 | 4 | 4 |
| Example 5 | OSC-1 | B-5 | 1.5 wt % | 1.5 wt % | 4 | 4 | 5 |
| Example 6 | OSC-1 | B-6 | 1.5 wt % | 1.5 wt % | 4 | 4 | 5 |
| Example 7 | OSC-1 | B-7 | 1.5 wt % | 1.5 wt % | 3 | 4 | 4 |
| Example 8 | OSC-1 | B-8 | 1.5 wt % | 1.5 wt % | 4 | 4 | 4 |
| Example 9 | OSC-1 | B-9 | 1.5 wt % | 1.5 wt % | 3 | 4 | 4 |
| Example 10 | OSC-1 | B-10 | 1.5 wt % | 1.5 wt % | 4 | 4 | 5 |
| Example 11 | OSC-1 | B-11 | 1.5 wt % | 1.5 wt % | 4 | 4 | 5 |
| Example 12 | OSC-1 | B-12 | 1.5 wt % | 1.5 wt % | 4 | 4 | 4 |
| Example 13 | OSC-1 | B-13 | 1.5 wt % | 1.5 wt % | 4 | 4 | 5 |
| Example 14 | OSC-1 | B-14 | 1.5 wt % | 1.5 wt % | 4 | 4 | 5 |
| Example 15 | OSC-1 | B-15 | 1.5 wt % | 1.5 wt % | 3 | 4 | 4 |
| Example 16 | OSC-1 | B-16 | 1.5 wt % | 1.5 wt % | 4 | 4 | 5 |
| Example 17 | OSC-1 | B-17 | 1.5 wt % | 1.5 wt % | 4 | 4 | 5 |
| Example 18 | OSC-1 | B-18 | 1.5 wt % | 1.5 wt % | 4 | 4 | 5 |
| Example 19 | OSC-1 | B-19 | 1.5 wt % | 1.5 wt % | 4 | 4 | 5 |
| Example 20 | OSC-1 | B-20 | 1.5 wt % | 1.5 wt % | 4 | 4 | 5 |
| Example 21 | OSC-1 | B-21 | 1.5 wt % | 1.5 wt % | 4 | 4 | 4 |
| Example 22 | OSC-1 | B-22 | 1.5 wt % | 1.5 wt % | 3 | 4 | 4 |
| Example 23 | OSC-1 | B-23 | 1.5 wt % | 1.5 wt % | 4 | 4 | 4 |
| Example 24 | OSC-1 | B-24 | 1.5 wt % | 1.5 wt % | 4 | 4 | 4 |
| Example 25 | OSC-1 | B-25 | 1.5 wt % | 1.5 wt % | 4 | 4 | 4 |
| Example 26 | OSC-1 | B-26 | 1.5 wt % | 1.5 wt % | 3 | 4 | 4 |
| Example 27 | OSC-1 | B-27 | 1.5 wt % | 1.5 wt % | 4 | 4 | 4 |
| Example 28 | OSC-1 | B-28 | 1.5 wt % | 1.5 wt % | 4 | 4 | 4 |
| Example 29 | OSC-1 | B-31 | 1.5 wt % | 1.5 wt % | 4 | 4 | 4 |
| Example 30 | OSC-1 | B-32 | 1.5 wt % | 1.5 wt % | 4 | 4 | 4 |
| Example 31 | OSC-1 | B-34 | 1.5 wt % | 1.5 wt % | 4 | 3 | 4 |
| Example 32 | OSC-1 | B-35 | 1.5 wt % | 1.5 wt % | 3 | 4 | 4 |
| Example 33 | OSC-1 | B-38 | 1.5 wt % | 1.5 wt % | 4 | 4 | 3 |
| Example 34 | OSC-1 | B-39 | 1.5 wt % | 1.5 wt % | 4 | 3 | 4 |
| Example 35 | OSC-1 | B-40 | 1.5 wt % | 1.5 wt % | 3 | 4 | 4 |
| Example 36 | OSC-1 | B-43 | 1.5 wt % | 1.5 wt % | 4 | 3 | 4 |

TABLE 3

| | Organic semiconductor | Component B | Organic semiconductor concentration | Component B concentration | Mobility | Variation (uniformity) | Heat resistance |
|---|---|---|---|---|---|---|---|
| Example 37 | OSC-1 | B-44 | 1.5 wt % | 1.5 wt % | 4 | 3 | 4 |
| Example 38 | OSC-1 | B-45 | 1.5 wt % | 1.5 wt % | 3 | 4 | 4 |
| Example 39 | OSC-1 | B-48 | 1.5 wt % | 1.5 wt % | 4 | 3 | 4 |
| Example 40 | OSC-1 | B-49 | 1.5 wt % | 1.5 wt % | 4 | 3 | 4 |
| Example 41 | OSC-1 | B-50 | 1.5 wt % | 1.5 wt % | 3 | 4 | 4 |
| Example 42 | OSC-1 | B-53 | 1.5 wt % | 1.5 wt % | 4 | 3 | 4 |
| Example 43 | OSC-1 | B-54 | 1.5 wt % | 1.5 wt % | 4 | 3 | 4 |
| Example 44 | OSC-1 | B-55 | 1.5 wt % | 1.5 wt % | 3 | 4 | 4 |

TABLE 3-continued

| | Organic semiconductor | Component B | Organic semiconductor concentration | Component B concentration | Mobility | Variation (uniformity) | Heat resistance |
|---|---|---|---|---|---|---|---|
| Example 45 | OSC-1 | B-58 | 1.5 wt % | 1.5 wt % | 4 | 3 | 4 |
| Example 46 | OSC-2 | B-1 | 1.5 wt % | 1.5 wt % | 5 | 5 | 5 |
| Example 47 | OSC-3 | B-1 | 1.5 wt % | 1.5 wt % | 5 | 5 | 5 |
| Example 48 | OSC-4 | B-1 | 1.5 wt % | 1.5 wt % | 5 | 5 | 5 |
| Example 49 | OSC-5 | B-1 | 1.5 wt % | 1.5 wt % | 5 | 5 | 5 |
| Example 50 | OSC-6 | B-1 | 1.5 wt % | 1.5 wt % | 5 | 5 | 5 |
| Example 51 | OSC-7 | B-1 | 1.5 wt % | 1.5 wt % | 5 | 5 | 5 |
| Example 52 | OSC-8 | B-1 | 1.5 wt % | 1.5 wt % | 5 | 5 | 5 |
| Example 53 | OSC-9 | B-1 | 1.5 wt % | 1.5 wt % | 5 | 5 | 5 |
| Example 54 | OSC-10 | B-1 | 1.5 wt % | 1.5 wt % | 5 | 5 | 5 |
| Example 55 | OSC-11 | B-1 | 1.5 wt % | 1.5 wt % | 5 | 5 | 5 |
| Example 56 | OSC-12 | B-1 | 1.5 wt % | 1.5 wt % | 5 | 5 | 5 |
| Example 57 | OSC-13 | B-1 | 1.5 wt % | 1.5 wt % | 5 | 5 | 5 |
| Example 58 | OSC-14 | B-1 | 1.5 wt % | 1.5 wt % | 5 | 5 | 5 |
| Example 59 | OSC-15 | B-1 | 1.5 wt % | 1.5 wt % | 5 | 5 | 5 |
| Example 60 | OSC-16 | B-1 | 1.5 wt % | 1.5 wt % | 5 | 5 | 5 |
| Example 61 | OSC-17 | B-1 | 1.5 wt % | 1.5 wt % | 5 | 5 | 5 |
| Example 62 | OSC-18 | B-1 | 1.5 wt % | 1.5 wt % | 5 | 5 | 5 |
| Example 63 | OSC-19 | B-1 | 1.5 wt % | 1.5 wt % | 4 | 5 | 5 |
| Example 64 | OSC-1 | B-1 | 1.5 wt % | 0.15 w % | 4 | 3 | 4 |
| Example 65 | OSC-1 | B-1 | 1.5 wt % | 0.3 wt % | 4 | 4 | 4 |
| Example 66 | OSC-1 | B-1 | 1.5 wt % | 0.5 wt % | 4 | 4 | 5 |
| Example 67 | OSC-1 | B-1 | 1.5 wt % | 0.75 wt % | 4 | 4 | 5 |
| Example 68 | OSC-1 | B-1 | 1.5 wt % | 2.0 wt % | 4 | 4 | 5 |
| Example 69 | OSC-1 | B-1 | 1.5 wt % | 2.25 wt % | 4 | 4 | 4 |
| Example 70 | OSC-1 | B-1 | 1.5 wt % | 3.0 wt % | 3 | 4 | 4 |
| Example 71 | OSC-1 | B-1 | 1.5 wt % | Polymer layer | 4 | 4 | 4 |
| Comparative Example 1 | OSC-1 | N/A | 1.5 wt % | 0 wt % | 3 | 1 | 2 |
| Comparative Example 2 | OSC-1 | UBEPOL BR150L | 1.5 wt % | 1.5 wt % | 3 | 1 | 4 |

The abbreviations listed in Tables 2 and 3 are as described below.

OSC-1 to OSC-17 used in examples are the same compounds as OSC-1 to OSC-17 described above.

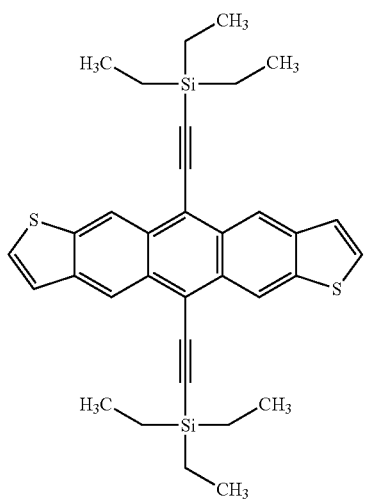

OSC-18

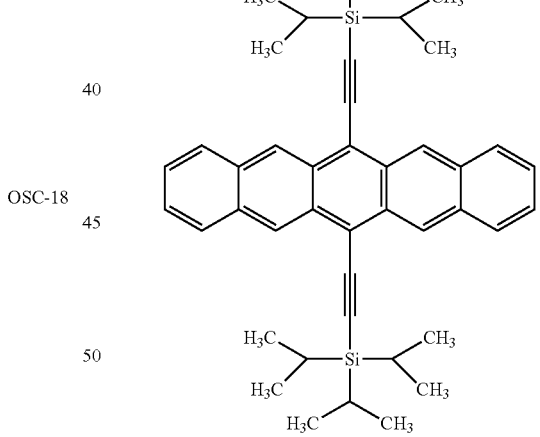

OSC-19

The organic semiconductors (OSC-1 to OSC-19) were obtained as below.

OSC-1 was synthesized with reference to Journal of American Chemical Society, 116, 925 (1994), Journal of Chemical Society, 221 (1951), and the like.

OSC-2 was synthesized with reference to known documents (Org. Lett., 2001, 3, 3471, Macromolecules, 2010, 43, 6264, and Tetrahedron, 2002, 58, 10197).

OSC-3 was synthesized with reference to JP2012-513459A, JP2011-46687A, Journal of Chemical Research. miniprint, 3, 601-635 (1991), Bull. Chem. Soc. Japan, 64, 3682-3686 (1991), Tetrahedron Letters, 45, 2801-2803 (2004), and the like.

OSC-4 was synthesized with reference to EP2251342A, EP2301926A, EP2301921A, KR10-2012-0120886A, and the like.

OSC-5 was synthesized with reference to known documents (J. Org. Chem., 2011, 696, Org. Lett., 2001, 3, 3471, Macromolecules, 2010, 43, 6264, J. Org. Chem., 2013, 78, 7741, and Chem. Eur. J., 2013, 19, 3721).

OSC-6 was synthesized with reference to known documents (Bull. Chem. Soc. Jpn., 1987, 60, 4187, J. Am. Chem. Soc. 2011, 133, 5024, and Chem. Eur. J. 2013, 19, 3721).

OSC-7 and OSC-8 were synthesized with reference to known documents (Macromolecules, 2010, 43, 6264-6267 and J. Am, Chem. Soc., 2012, 134, 16548-16550).

OSC-9 was synthesized with reference to document A (K. Muellen, Chem. Commun., 2008, 1548-1550.), document B (K. Takimiya, Org. Lett., 2007, 9, 4499-4502.), document C (Rao; Tilak, Journal of Scientific and Industrial Research, 1958, vol. 17 B, p. 260-265), and document D (Ghaisas; Tilak, Journal of Scientific and Industrial Research, 1955, vol. 14 B, p. 11).

OSC-10 to OSC-13 were synthesized with reference to a known document (Journal of American Chemical Society, 129, 15732 (2007)).

OSC-14 was synthesized based on the method described in WO2005/087780A.

OSC-15 was synthesized based on the method described in JP2009-190999A.

OSC-16 was synthesized based on the method described in JP2012-206953A.

As OSC-17, C8BTBT (manufactured by Nippon Kayaku Co., Ltd.) was used.

As OSC-18, 5,11-bis(triethylsilylethynyl)anthradithiophene (manufactured by Sigma-Aldrich Co. LLC.) was used.

As OSC-19, 6,13-bis(triisopropylsilylethynyl)pentacene (manufactured by TOKYO CHEMICAL INDUSTRY CO., LTD.) was used.

EXPLANATION OF REFERENCES

10: substrate
20: gate electrode
30: gate insulating film
40: source electrode
42: drain electrode
50: organic semiconductor film
51: metal mask
52: mask portion
53, 54: opening portion
60: sealing layer
100, 200: organic thin film transistor

What is claimed is:

1. A composition for forming an organic semiconductor film comprising:
an organic semiconductor as a component A; and
a polymer chemically modified some or all of the ethylenically unsaturated double bonds of an ethylenically unsaturated double bond-containing polymer, as a component B.

2. The composition for forming an organic semiconductor film according to claim 1,
wherein the ethylenically unsaturated double bond-containing polymer is at least one kind of polymer selected from the group consisting of natural rubber, an acrylonitrile-butadiene copolymer, polyisoprene, a styrene-butadiene copolymer, polybutadiene, polychloroprene, an ethylene-propylene-diene copolymer, a styrene-butadiene-styrene block copolymer, and a styrene-isoprene-styrene block copolymer.

3. The composition for forming an organic semiconductor film according to claim 1,
wherein the ethylenically unsaturated double bond-containing polymer is at least one kind of polymer selected from the group consisting of polybutadiene and an ethylene-propylene-diene copolymer.

4. The composition for forming an organic semiconductor film according to claim 1,
wherein the ethylenically unsaturated double bond-containing polymer contains an ethylene-propylene-diene copolymer.

5. The composition for forming an organic semiconductor film according to claim 1,
wherein the component A is a condensed polycyclic aromatic compound having 3 to 7 rings.

6. The composition for forming an organic semiconductor film according to claim 1,
wherein in the component B, a modification rate of the ethylenically unsaturated double bonds in the ethylenically unsaturated double bond-containing polymer is 5% to 50%.

7. The composition for forming an organic semiconductor film according to claim 1,
wherein the component A has a condensed polycyclic aromatic group,
the number of rings in the condensed polycyclic aromatic group is equal to or greater than 4,
at least two rings in the condensed polycyclic aromatic group contains at least 1 atom selected from the group consisting of a sulfur atom, a nitrogen atom, a selenium atom, and an oxygen atom, and
the condensed polycyclic aromatic group has, as a partial structure, at least one structure selected from the group consisting of a benzene ring, a naphthalene ring, and a phenanthrene ring.

8. The composition for forming an organic semiconductor film according to claim 7,
wherein the number of rings in the condensed polycyclic aromatic group is 5 or 6.

9. The composition for forming an organic semiconductor film according to claim 7,
wherein the condensed polycyclic aromatic group contains at least two heterocyclic rings, and
the heterocyclic rings each contain one heteroatom.

10. The composition for forming an organic semiconductor film according to claim 1,
wherein the component A contains at least one kind of compound represented by any one of Formulae 1 to 16,

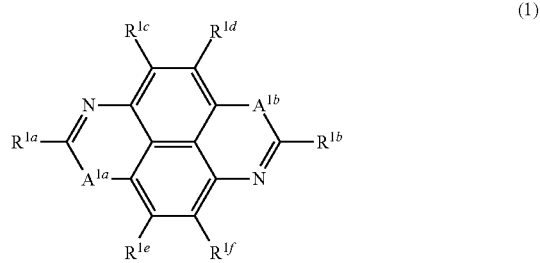

(1)

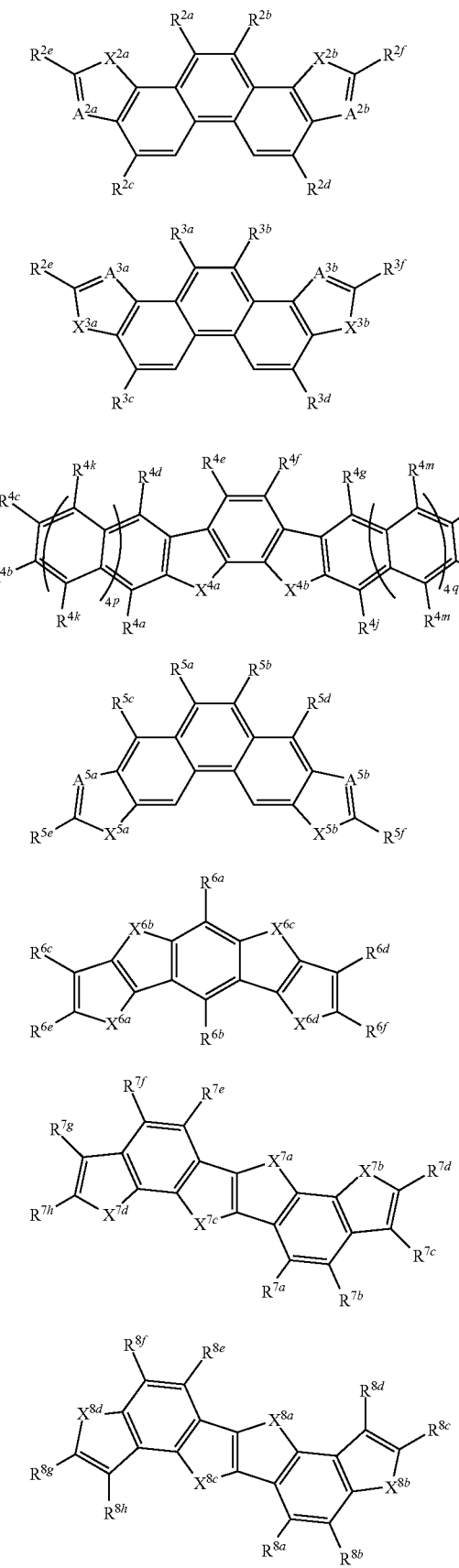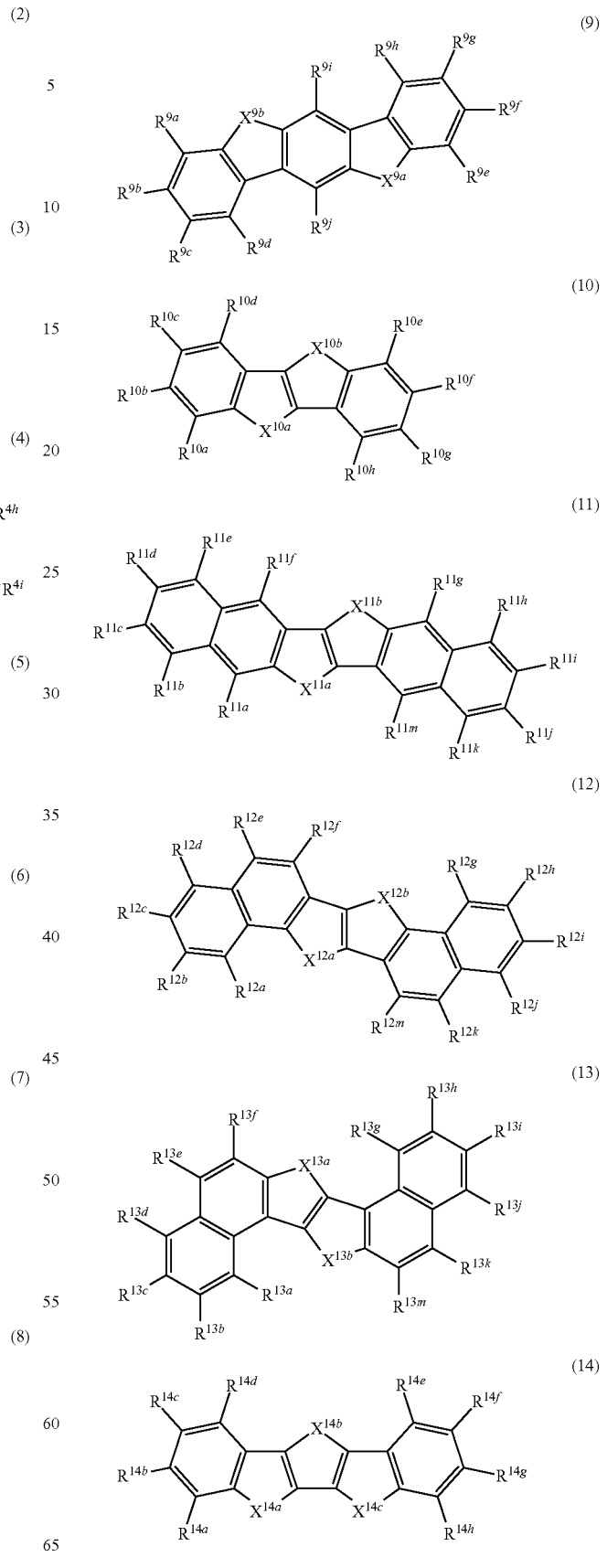

(15)
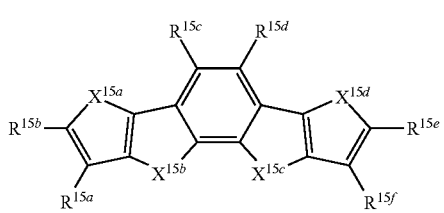

(16)
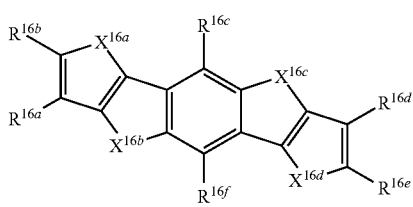

in Formula 1, $A^{1a}$ and $A^{1b}$ each independently represent a S atom, an O atom, or a Se atom, $R^{1a}$ to $R^{1f}$ each independently represent a hydrogen atom or a substituent, and at least one of $R^{1a}$, $R^{1b}$, $R^{1c}$, $R^{1d}$, $R^{1e}$, or $R^{1f}$ is a group represented by the following Formula W, $$-L^W-R^W \quad (W)$$

in Formula W, $L^W$ represents a divalent linking group which is represented by any one of the following Formula L-1 to L-25 or a divalent linking group in which two or more divalent linking groups represented by any one of the following Formulae L-1 to L-25 are bonded to each other, and $R^W$ represents an alkyl group, a cyano group, a vinyl group, an ethynyl group, an oxyethylene group, an oligo-oxyethylene group in which a repetition number v of an oxyethylene unit is equal to or greater than 2, a siloxane group, an oligosiloxane group having two or more silicon atoms, or a trialkylsilyl group, (L-1)
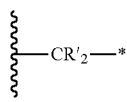

(L-2)
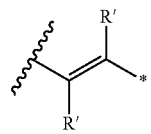

(L-3)
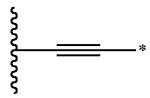

(L-4)
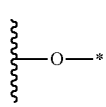

(L-5)
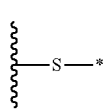

(L-6)
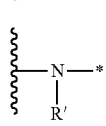

(L-7)
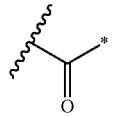

(L-8)
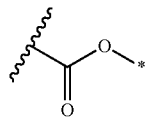

(L-9)
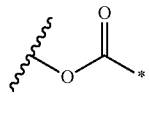

(L-10)
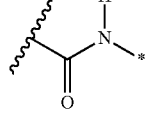

(L-11)
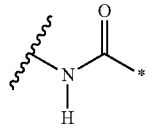

(L-12)
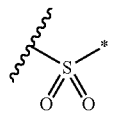

(L-13)
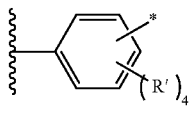

(L-14)
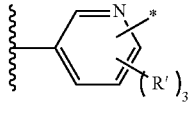

(L-15)
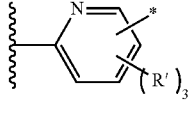

(L-16)
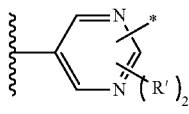

(L-17)
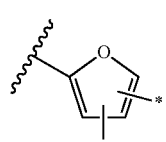

(L-18)
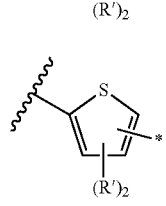

-continued (L-19)
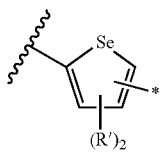

(L-20)
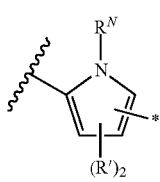

(L-21)
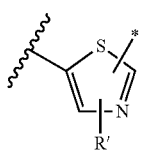

(L-22)
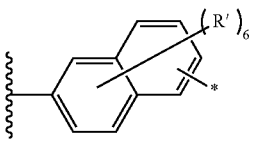

(L-23)
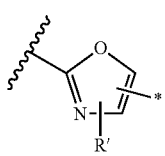

(L-24)
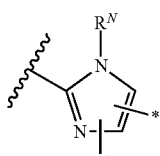

(L-25)
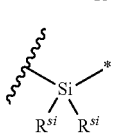

in Formulae L-1 to L-25, * represents a bonding position for $R^W$, the portion of a wavy line represents the other bonding position, R' in Formulae L-1, L-2, L-6, and L-13 to L-24 each independently represent a hydrogen atom or a substituent, $R^N$ in Formulae L-20 and L-24 represents a hydrogen atom or a substituent, and $R^{si}$ in Formula L-25 each independently represent a hydrogen atom, an alkyl group, an alkenyl group, or an alkynyl group, in Formula 2, $X^{2a}$ and $X^{2b}$ each independently represent $NR^{2i}$, an O atom, or a S atom, $A^{2a}$ represents $CR^{2g}$ or a N atom, $A^{2b}$ represents $CR^{2h}$ or a N atom, $R^{2i}$ represents a hydrogen atom, an alkyl group, an alkenyl group, an alkynyl group, or an acyl group, $R^{2a}$ to $R^{2h}$ each independently represent a hydrogen atom or a substituent, and at least one of $R^{2a}$, $R^{2b}$, $R^{2c}$, $R^{2d}$, $R^{2e}$, $R^{2f}$, $R^{2g}$, or $R^{2h}$ is a group represented by Formula W, in Formula 3, $X^{3a}$ and $X^{3b}$ each independently represent a S atom, an O atom, or $NR^{3g}$, $A^{3a}$ and $A^{3b}$ each independently represent $CR^{3h}$ or a N atom, $R^{3a}$ to $R^{3h}$ each independently represent a hydrogen atom or a substituent, and at least one of $R^{3a}$, $R^{3b}$, $R^{3c}$, $R^{3d}$, $R^{3e}$, $R^{3f}$, $R^{3g}$, or $R^{3h}$ is a group represented by Formula W, in Formula 4, $X^{4a}$ and $X^{4b}$ each independently represent an O atom, a S atom, or a Se atom, 4p and 4q each independently represent an integer of 0 to 2, $R^{4a}$ to $R^{4j}$, $R^{4k}$, and $R^{4m}$ each independently represent a hydrogen atom, a halogen atom, or a group represented by Formula W, at least one of $R^{4a}$, $R^{4b}$, $R^{4c}$, $R^{4d}$, $R^{4e}$, $R^{4f}$, $R^{4g}$, $R^{4h}$, $R^{4i}$, $R^{4j}$, $R^{4k}$, or $R^{4m}$ is a group represented by Formula W, and in a case where at least one of $R^{4e}$ or $R^{4f}$ is a group represented by Formula W, $L^W$ in Formula W represented by $R^{4e}$ and $R^{4f}$ is a divalent linking group represented by Formula L-2 or L-3, in Formula 5, $X^{5a}$ and $X^{5b}$ each independently represent $NR^{5i}$, an O atom, or a S atom, $A^{5a}$ represents $CR^{5g}$ or a N atom, $A^{5b}$ represents $CR^{5h}$ or a N atom, $R^{5i}$ represents a hydrogen atom, an alkyl group, an alkenyl group, an alkynyl group, an acyl group, an aryl group, or a heteroaryl group, $R^{5a}$ to $R^{5h}$ each independently represent a hydrogen atom or a substituent, and at least one of $R^{5a}$, $R^{5b}$, $R^{5c}$, $R^{5d}$, $R^{5e}$, $R^{5f}$, $R^{5g}$, or $R^{5h}$ is a group represented by Formula W, in Formula 6, $X^{6a}$ to $X^{6d}$ each independently represent $NR^{6g}$, an O atom, or a S atom, $R^{6g}$ represents a hydrogen atom, an alkyl group, an alkenyl group, an alkynyl group, an acyl group, an aryl group, or a heteroaryl group, $R^{6a}$ to $R^{6f}$ each independently represent a hydrogen atom or a substituent, and at least one of $R^{6a}$, $R^{6b}$, $R^{6c}$, $R^{6d}$, $R^{6e}$, or $R^{6f}$ is a group represented by Formula W, in Formula 7, $X^{7a}$ and $X^{7c}$ each independently represent a S atom, an O atom, a Se atom, or $NR^{7i}$, $X^{7b}$ and $X^{7d}$ each independently represent a S atom, an O atom, or a Se atom, $R^{7a}$ to $R^{7i}$ each independently represent a hydrogen atom or a substituent, and at least one of $R^{7a}$, $R^{7b}$, $R^{7c}$, $R^{7d}$, $R^{7e}$, $R^{7f}$, $R^{7g}$, $R^{7h}$, or $R^{7i}$ is a group represented by Formula W, in Formula 8, $X^{8a}$ and $X^{8c}$ each independently represent a S atom, an O atom, a Se atom, or $NR^{8i}$, $X^{8b}$ and $X^{8d}$ each independently represent a S atom, an O atom, or a Se atom, $R^{8a}$ to $R^{8i}$ each independently represent a hydrogen atom or a substituent, and at least one of $R^{8a}$, $R^{8b}$, $R^{8c}$, $R^{8d}$, $R^{8e}$, $R^{8f}$, $R^{8g}$, $R^{8h}$, or $R^{8i}$ is a group represented by Formula W, in Formula 9, $X^{9a}$ and $X^{9b}$ each independently represent an O atom, a S atom, or a Se atom, $R^{9c}$, $R^{9d}$, and $R^{9g}$ to $R^{9j}$ each independently represent a hydrogen atom, a halogen atom, or a group represented by Formula W, and $R^{9a}$, $R^{9b}$, $R^{9e}$, and $R^{9f}$ each independently represent a hydrogen atom or a substituent, in Formula 10, $R^{10a}$ to $R^{10h}$ each independently represent a hydrogen atom or a substituent, at least one of $R^{10a}$, $R^{10b}$, $R^{10c}$, $R^{10d}$, $R^{10e}$, $R^{10f}$, $R^{11g}$, or $R^{11h}$ represents a substituent represented by Formula W, $X^{10a}$ and $X^{10b}$ each independently represent a S atom, an O atom, a Se atom, or $NR^{10i}$, and $R^{10i}$ each independently represents a hydrogen atom or a group represented by Formula W, in Formula 11, $X^{11a}$ and $X^{11b}$ each independently represent a S atom, an O atom, a Se atom, or $NR^{11n}$, $R^{11a}$ to $R^{11k}$, $R^{11m}$, and $R^{11n}$ each independently represent a hydrogen atom or a substituent, and at least one of $R^{11a}$, $R^{11b}$, $R^{11c}$, $R^{11d}$, $R^{11e}$, $R^{11f}$, $R^{11g}$, $R^{11h}$, $R^{11i}$, $R^{11j}$, $R^{11k}$, $R^{11m}$, or $R^{11n}$ is a group represented by Formula W, in Formula 12, $X^{12a}$ and $X^{12b}$ each independently represent a S atom, an O atom, a Se atom, or $NR^{12n}$, $R^{12a}$ to $R^{12k}$, $R^{12m}$, and $R^{12n}$ each independently represent a hydrogen atom or a substituent, and at least one of $R^{12a}$, $R^{12b}$, $R^{12c}$, $R^{12d}$, $R^{12e}$, $R^{12f}$, $R^{12g}$, $R^{12h}$, $R^{12i}$, $R^{12j}$, $R^{12k}$, $R^{12m}$, or $R^{12n}$ is a group represented by Formula W, in Formula 13, $X^{13a}$ and $X^{13b}$ each independently represent a S atom, an O atom, a Se atom, or $NR^{13n}$, $R^{13a}$ to $R^{13k}$, $R^{13m}$, and $R^{13n}$ each independently represent a hydrogen atom or a substituent, and at least one of $R^{13a}$, $R^{13b}$, $R^{13c}$, $R^{13d}$, $R^{13e}$, $R^{13f}$, $R^{13g}$, $R^{13h}$, $R^{13i}$, $R^{13j}$, $R^{13k}$, $R^{13m}$, or $R^{13n}$ is a group represented by Formula W, in Formula 14, $X^{14a}$ to $X^{14c}$ each independently represent a S atom, an O atom, a Se atom, or $NR^{14i}$, $R^{14a}$ to $R^{14i}$ each independently represent a hydrogen atom or a substituent, and at least one of $R^{14a}$, $R^{14b}$, $R^{14c}$, $R^{14d}$, $R^{14e}$, $R^{14f}$, $R^{14g}$, $R^{14h}$, or $R^{14i}$ is a group represented by Formula W, in Formula 15, $X^{15a}$ to $X^{15d}$ each independently represent a S atom, an O atom, a Se atom or $NR^{15g}$, $R^{15a}$ to $R^{15g}$ each independently represent a hydrogen atom or a substituent, and at least one of $R^{15a}$, $R^{15b}$, $R^{15c}$, $R^{15d}$, $R^{15e}$, $R^{15f}$, or $R^{15g}$ is a group represented by Formula W, and in Formula 16, $X^{16a}$ to $X^{16d}$ each independently represent a S atom, an O atom, a Se atom, or $NR^{16g}$, $R^{16a}$ to $R^{16g}$ each independently represent a hydrogen atom or a substituent, and at least one of $R^{16a}$, $R^{16b}$, $R^{16c}$, $R^{16d}$, $R^{16e}$, $R^{16f}$, or $R^{16g}$ is a group represented by Formula W.

11. The composition for forming an organic semiconductor film according to claim 10,
wherein the organic semiconductor contains at least one kind of compound represented by any one of Formulae 1 to 9 and 15.

12. An organic semiconductor element comprising:
an organic semiconductor as a component A; and
a polymer chemically modified some or all of the ethylenically unsaturated double bonds of an ethylenically unsaturated double bond-containing polymer, as a component B.

13. The organic semiconductor element according to claim 12,
wherein the ethylenically unsaturated double bond-containing polymer is at least one kind of polymer selected from the group consisting of natural rubber, an acrylonitrile-butadiene copolymer, polyisoprene, a styrene-butadiene copolymer, polybutadiene, polychloroprene, an ethylene-propylene-diene copolymer, a polystyrene-polybutadiene-polystyrene block copolymer, and a polystyrene-polyisoprene-polystyrene block copolymer.

14. The organic semiconductor element according to claim 12,
wherein the ethylenically unsaturated double bond-containing polymer is at least one kind of polymer selected from the group consisting of polybutadiene and an ethylene-propylene-diene copolymer.

15. The organic semiconductor element according to claim 12,
wherein the ethylenically unsaturated double bond-containing polymer contains an ethylene-propylene-diene copolymer.

16. The organic semiconductor element according to claim 12,
wherein in the component B, a modification rate of the ethylenically unsaturated double bonds contained in the ethylenically unsaturated double bond-containing polymer is 5% to 50%.

17. The organic semiconductor element according to claim 12,
wherein the component A is a condensed polycyclic aromatic compound having 3 to 7 rings.

18. The organic semiconductor element according to claims 12,
wherein the component A has a condensed polycyclic aromatic group,
the number of rings in the condensed polycyclic aromatic group is equal to or greater than 4,
at least two rings in the condensed polycyclic aromatic group contains at least one atom selected from the group consisting of a sulfur atom, a nitrogen atom, a selenium atom, and an oxygen atom, and
the condensed polycyclic aromatic group has, as a partial structure, at least one structure selected from the group consisting of a benzene ring, a naphthalene ring, and a phenanthrene ring.

19. The organic semiconductor element according to claim 18,
wherein the number of rings in the condensed polycyclic aromatic group is 5 or 6.

20. The organic semiconductor element according to claim 18,
wherein the condensed polycyclic aromatic group contains at least two heterocyclic rings, and
the heterocyclic rings each contain one heteroatom.

21. The organic semiconductor element according to claim 12,
wherein the component A contains at least one kind of compound represented by any one of Formulae 1 to 16,

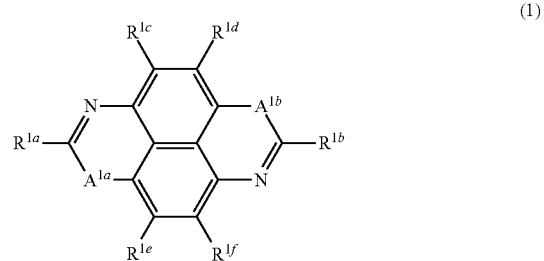

(1)

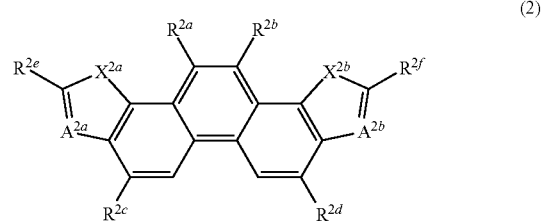

(2)

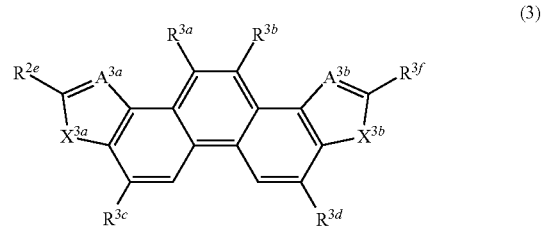

(3)

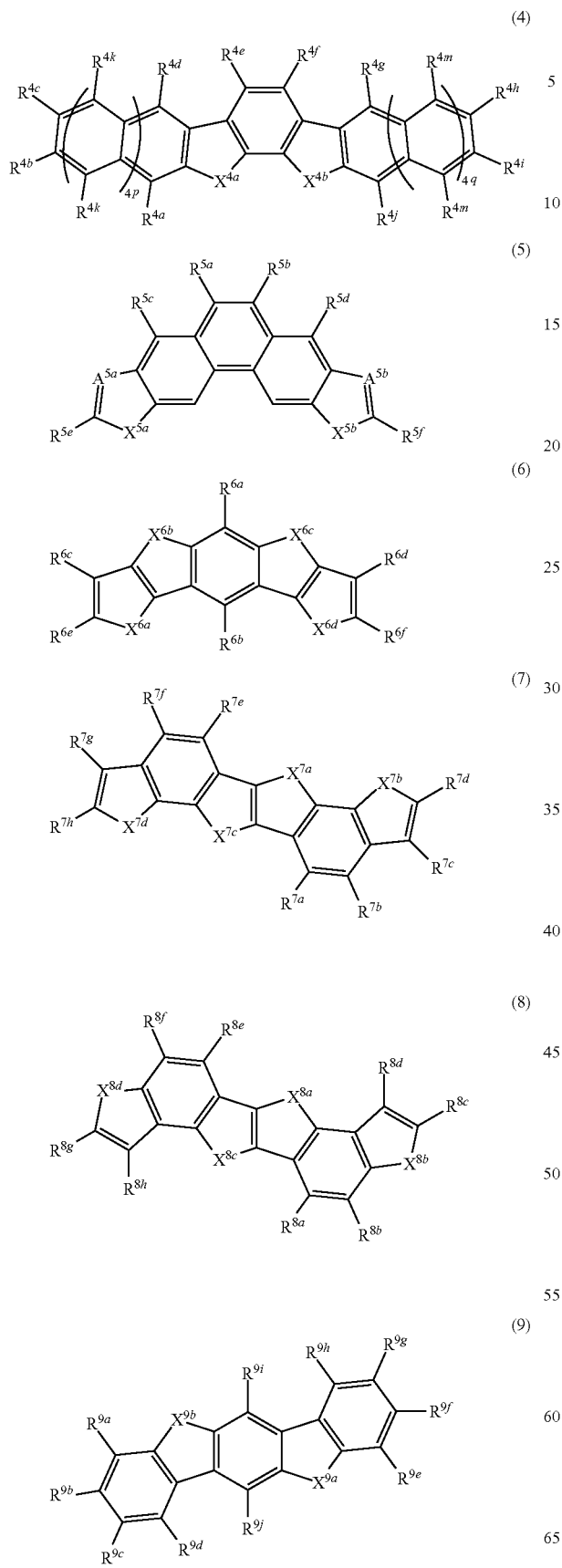
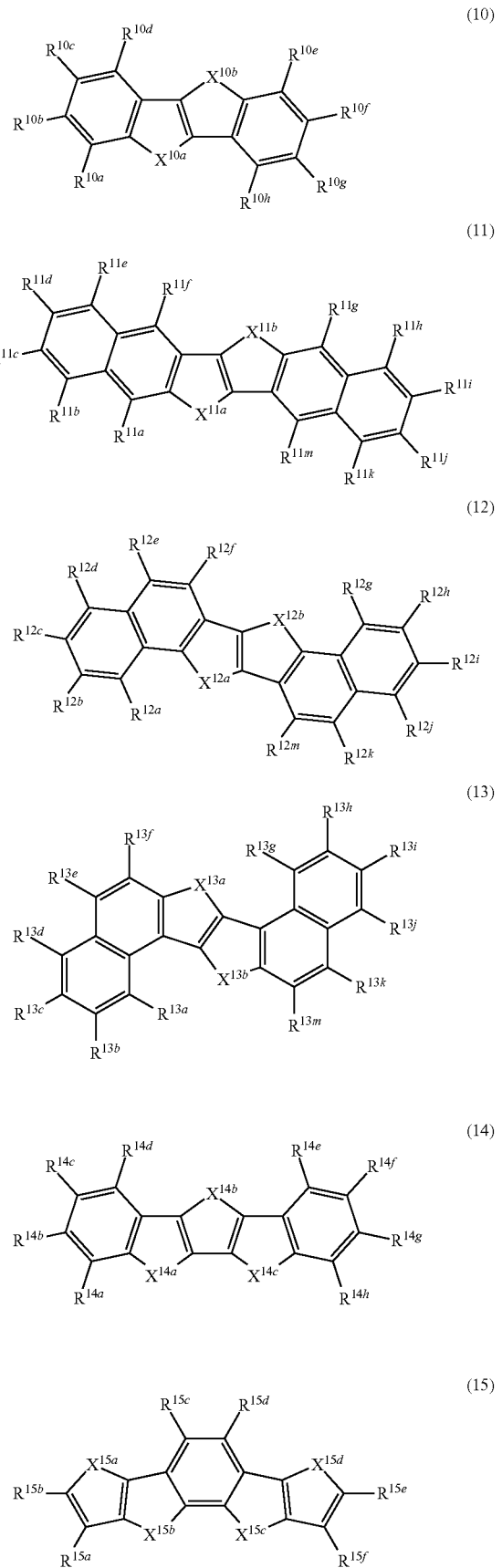

(16)

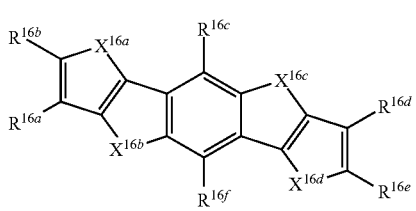

in Formula 1, $A^{1a}$ and $A^{1b}$ each independently represent a S atom, an O atom, or a Se atom, $R^{1a}$ to $R^{1f}$ each independently represent a hydrogen atom or a substituent, and at least one of $R^{1a}$, $R^{1b}$, $R^{1c}$, $R^{1d}$, $R^{1e}$, or $R^{1f}$ is a group represented by the following Formula W, $$-L^W-R^W \quad \text{(W)}$$

in Formula W, $L^W$ represents a divalent linking group which is represented by any one of the following Formulae L-1 to L-25 or a divalent linking group in which two or more divalent linking groups represented by any one of the following Formulae L-1 to L-25 are bonded to each other, and $R^W$ represents an alkyl group, a cyano group, a vinyl group, an ethynyl group, an oxyethylene group, an oligo-oxyethylene group in which a repetition number v of an oxyethylene unit is equal to or greater than 2, a siloxane group, an oligosiloxane group having two or more silicon atoms, or a trialkylsilyl group, (L-1)

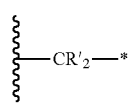

(L-2)

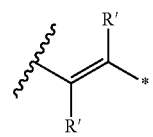

(L-3)

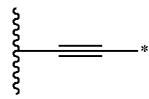

(L-4)

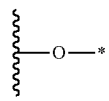

(L-5)

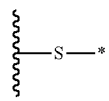

(L-6)

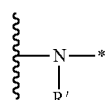

(L-7)

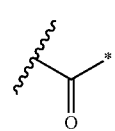

(L-8)

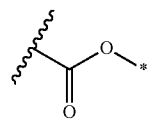

(L-9)

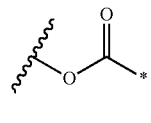

(L-10)

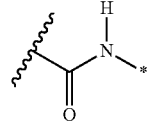

(L-11)

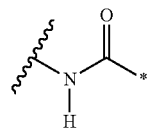

(L-12)

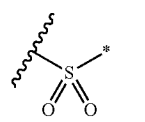

(L-13)

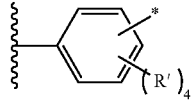

(L-14)

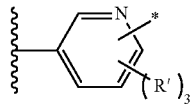

(L-15)

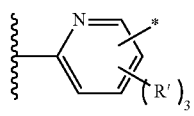

(L-16)

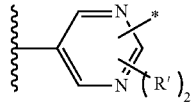

(L-17)

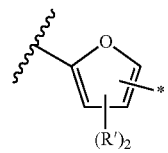

(L-18)

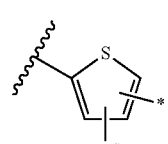

(L-19)

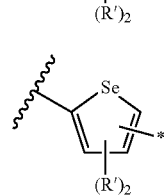

-continued

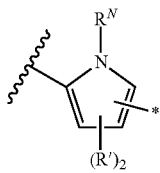
(L-20)

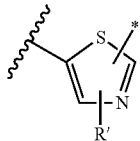
(L-21)

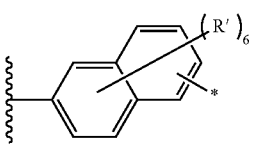
(L-22)

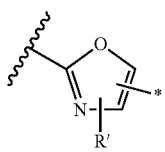
(L-23)

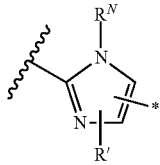
(L-24)

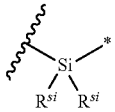
(L-25)

in Formulae L-1 to L-25, * represents a bonding position for $R^W$, the portion of a wavy line represents the other bonding position, R' in Formulae L-1, L-2, L-6, and L-13 to L-24 each independently represents a hydrogen atom or a substituent, $R^N$ in Formulae L-20 and L-24 represents a hydrogen atom or a substituent, and $R^{si}$ in Formula L-25 each independently represents a hydrogen atom, an alkyl group, an alkenyl group, or an alkynyl group, in Formula 2, $X^{2a}$ and $X^{2b}$ each independently represent $NR^{2i}$, an O atom, or a S atom, $A^{2a}$ represents $CR^{2g}$ or a N atom, $A^{2b}$ represents $CR^{2h}$ or a N atom, $R^{2i}$ represents a hydrogen atom, an alkyl group, an alkenyl group, an alkynyl group, or an acyl group, $R^{2a}$ to $R^{2h}$ each independently represent a hydrogen atom or a substituent, and at least one of $R^{2a}$, $R^{2b}$, $R^{2c}$, $R^{2d}$, $R^{2e}$, $R^{2f}$, $R^{2g}$, or $R^{2h}$ is a group represented by Formula W, in Formula 3, $X^{3a}$ and $X^{3b}$ each independently represent a S atom, an O atom, or $NR^{3g}$, $A^{3a}$ and $A^{3b}$ each independently represent $CR^{3h}$ or a N atom, $R^{3a}$ to $R^{3h}$ each independently represent a hydrogen atom or a substituent, and at least one of $R^{3a}$, $R^{3b}$, $R^{3c}$, $R^{3d}$, $R^{3e}$, $R^{3f}$, $R^{3g}$, or $R^{3h}$ is a group represented by Formula W, in Formula 4, $X^{4a}$ and $X^{4b}$ each independently represent an O atom, a S atom, or a Se atom, 4p and 4q each independently represent an integer of 0 to 2, $R^{4a}$ to $R^{4j}$, $R^{4k}$, and $R^{4m}$ each independently represent a hydrogen atom, a halogen atom, or a group represented by Formula W, at least one of $R^{4a}$, $R^{4b}$, $R^{4c}$, $R^{4d}$, $R^{4e}$, $R^{4f}$, $R^{4g}$, $R^{4h}$, $R^{4i}$, $R^{4j}$, $R^{4k}$, or $R^{4m}$ is a group represented by Formula W, and in a case where at least one of $R^{4e}$ or $R^{4f}$ is a group represented by Formula W, $L^W$ in Formula W represented by $R^{4e}$ and $R^{4f}$ is a divalent linking group represented by Formula L-2 or L-3, in Formula 5, $X^{5a}$ and $X^{5b}$ each independently represent $NR^{5i}$, an O atom, or a S atom, $A^{5a}$ represents $CR^{5g}$ or a N atom, $A^{5b}$ represents $CR^{5h}$ or a N atom, $R^{5i}$ represents a hydrogen atom, an alkyl group, an alkenyl group, an alkynyl group, an acyl group, an aryl group, or a heteroaryl group, $R^{5a}$ to $R^{5h}$ each independently represent a hydrogen atom or a substituent, and at least one of $R^{5a}$, $R^{5b}$, $R^{5c}$, $R^{5d}$, $R^{5e}$, $R^{5f}$, $R^{5g}$, or $R^{5h}$ is a group represented by Formula W, in Formula 6, $X^{6a}$ to $X^{6d}$ each independently represent $NR^{6g}$, an O atom, or a S atom, $R^{6g}$ represents a hydrogen atom, an alkyl group, an alkenyl group, an alkynyl group, an acyl group, an aryl group, or a heteroaryl group, $R^{6a}$ to $R^{6f}$ each independently represent a hydrogen atom or a substituent, and at least one of $R^{6a}$, $R^{6b}$, $R^{6c}$, $R^{6d}$, $R^{6e}$, or $R^{6f}$ is a group represented by Formula W, in Formula 7, $X^{7a}$ and $X^{7c}$ each independently represent a S atom, an O atom, a Se atom, or $NR^{7i}$, $X^{7b}$ and $X^{7d}$ each independently represent a S atom, an O atom, or a Se atom, $R^{7a}$ to $R^{7i}$ each independently represent a hydrogen atom or a substituent, and at least one of $R^{7a}$, $R^{7b}$, $R^{7c}$, $R^{7d}$, $R^{7e}$, $R^{7f}$, $R^{7g}$, $R^{7h}$, or $R^{7i}$ is a group represented by Formula W, in Formula 8, $X^{8a}$ and $X^{8c}$ each independently represent a S atom, an O atom, a Se atom, or $NR^{8i}$, $X^{8b}$ and $X^{8d}$ each independently represent a S atom, an O atom, or a Se atom, $R^{8a}$ to $R^{8i}$ each independently represent a hydrogen atom or a substituent, and at least one of $R^{8a}$, $R^{8b}$, $R^{8c}$, $R^{8d}$, $R^{8e}$, $R^{8f}$, $R^{8g}$, $R^{8h}$, or $R^{8i}$ is a group represented by Formula W, in Formula 9, $X^{9a}$ and $X^{9b}$ each independently represent an O atom, a S atom, or a Se atom, $R^{9c}$, $R^{9d}$, and $R^{9g}$ to $R^{9j}$ each independently represent a hydrogen atom, a halogen atom, or a group represented by Formula W, and $R^{9a}$, $R^{9b}$, $R^{9e}$, and $R^{9f}$ each independently represent a hydrogen atom or a substituent, in Formula 10, $R^{10a}$ to $R^{10h}$ each independently represent a hydrogen atom or a substituent, at least one of $R^{10a}$, $R^{10b}$, $R^{10c}$, $R^{10d}$, $R^{10e}$, $R^{10f}$, $R^{11g}$, or $R^{11h}$ represents a substituent represented by Formula W, $X^{10a}$ and $X^{10b}$ each independently represent a S atom, an O atom, a Se atom, or $NR^{10i}$, and $R^{10i}$ each independently represents a hydrogen atom or a group represented by Formula W, in Formula 11, $X^{11a}$ and $X^{11b}$ each independently represent a S atom, an O atom, a Se atom, or $NR^{11n}$, $R^{11a}$ to $R^{11k}$, $R^{11m}$, and $R^{11n}$ each independently represent a hydrogen atom or a substituent, and at least one of $R^{11a}$, $R^{11b}$, $R^{11c}$, $R^{11d}$, $R^{11e}$, $R^{11f}$, $R^{11g}$, $R^{11h}$, $R^{11i}$, $R^{11j}$, $R^{11k}$, $R^{11m}$, or $R^{11n}$ is a group represented by Formula W, in Formula 12, $X^{12a}$ and $X^{12b}$ each independently represent a S atom, an O atom, a Se atom, or $NR^{12n}$, $R^{12a}$ to $R^{12k}$, $R^{12m}$, and $R^{12n}$ each independently represent a hydrogen atom or a substituent, and at least one of $R^{12a}$, $R^{12b}$, $R^{12c}$, $R^{12d}$, $R^{12e}$, $R^{12f}$, $R^{12g}$, $R^{12h}$, $R^{12i}$, $R^{12j}$, $R^{12k}$, $R^{12m}$, or $R^{12n}$ is a group represented by Formula W, in Formula 13, $X^{13a}$ and $X^{13b}$ each independently represent a S atom, an O atom, a Se atom, or $NR^{13n}$, $R^{13a}$ to $R^{13k}$, $R^{13m}$, and $R^{13n}$ each independently represent a hydrogen atom or a substituent, and at least one of $R^{13a}$, $R^{13b}$, $R^{13c}$, $R^{13d}$, $R^{13e}$, $R^{13f}$, $R^{13g}$, $R^{13h}$, $R^{13i}$, $R^{13k}$, $R^{13m}$, or $R^{13n}$ is a group represented by Formula W, in Formula 14, $X^{14a}$ to $X^{14c}$ each independently represent a S atom, an O atom, a Se atom, or $NR^{14i}$, $R^{14a}$ to $R^{14i}$ each independently represent a hydrogen atom or a substituent, and at least one of $R^{14a}$, $R^{14b}$, $R^{14c}$, $R^{14d}$, $R^{14e}$, $R^{14f}$, $R^{14g}$, $R^{14h}$, or $R^{14i}$ is a group represented by Formula W, in Formula 15, $X^{15a}$ to $X^{15d}$ each independently represent a S atom, an O atom, a Se atom or $NR^{15g}$, $R^{15a}$ to $R^{15g}$ each independently represent a hydrogen atom or a substituent, and at least one of $R^{15a}$, $R^{15b}$, $R^{15c}$, $R^{15d}$, $R^{15e}$, $R^{15f}$, or $R^{15g}$ is a group represented by Formula W, and in Formula 16, $X^{16a}$ to $X^{16d}$ each independently represent a S atom, an O atom, a Se atom, or $NR^{16g}$, $R^{16a}$ to $R^{16g}$ each independently represent a hydrogen atom or a substituent, and at least one of $R^{16a}$, $R^{16b}$, $R^{16c}$, $R^{16d}$, $R^{16e}$, $R^{16f}$, or $R^{16g}$ is a group represented by Formula W.

22. The organic semiconductor element according to claim 21,
wherein the organic semiconductor contains at least one kind of compound represented by any one of Formulae 1 to 9 and 15.

* * * * *